(12) United States Patent
Kumazaki

(10) Patent No.: US 6,818,943 B2
(45) Date of Patent: Nov. 16, 2004

(54) SEMICONDUCTOR DEVICE HAVING A SHIELD PLATE FOR APPLYING ELECTRIC POTENTIAL TO THE SEMICONDUCTOR SUBSTRATE

(75) Inventor: Yoshihiro Kumazaki, Tokyo (JP)

(73) Assignee: Nippon Steel Corporation (JP)

( * ) Notice: Subject to any disclaimer, the term of this patent is extended or adjusted under 35 U.S.C. 154(b) by 0 days.

(21) Appl. No.: 10/269,951

(22) Filed: Oct. 15, 2002

(65) Prior Publication Data

US 2003/0052363 A1 Mar. 20, 2003

Related U.S. Application Data

(62) Division of application No. 09/064,785, filed on Apr. 23, 1998, now Pat. No. 6,489,650.

(30) Foreign Application Priority Data

| Apr. 28, 1997 | (JP) | ............................................. 9-124943 |
| Jul. 11, 1997 | (JP) | ............................................. 9-202452 |
| Feb. 26, 1998 | (JP) | ............................................. 10-45692 |

(51) Int. Cl.$^7$ ..................... H01L 29/788; H01L 29/76
(52) U.S. Cl. ..................... 257/318; 257/316; 257/409
(58) Field of Search ................ 257/314–318, 257/324, 326, 295, 347, 630, 409; 438/3, 140, 149, 201, 211, 216, 241, 257, 258, 261, 260, 266, 262, 454, 479, 517, 541, 593

(56) References Cited

U.S. PATENT DOCUMENTS 5,616,942 A    4/1997   Song 5,831,299 A    11/1998  Yokoyama et al.
5,841,185 A    11/1998  Ishikawa
6,201,275 B1 * 3/2001   Kawasaki et al. .......... 257/315

FOREIGN PATENT DOCUMENTS

| JP | 59-155968 | 9/1984 |
| JP | 1-309381 | 12/1989 |
| JP | 6-85279 | 3/1994 |
| JP | 7-147340 | 6/1995 |
| JP | 7-112018 | 11/1995 |

* cited by examiner

Primary Examiner—Hung Vu
(74) Attorney, Agent, or Firm—Connolly, Bove, Lodge & Hutz LLP

(57) ABSTRACT

A semiconductor device of this invention is a single-layer gate nonvolatile semiconductor memory in which a floating gate having a predetermined shape is formed on a semiconductor substrate. This floating gate opposes a diffusion layer serving as a control gate via a gate oxide film and is capacitively coupled with the diffusion layer by using the gate oxide film as a dielectric film. The diffusion layer immediately below the dielectric film is insulated from the semiconductor substrate by an insulating film such as a silicon oxide film. A pair of diffusion layers are formed in surface regions of the semiconductor substrate on the two sides of the floating gate extending on a tunnel oxide film. This invention can realize a reliable semiconductor device which is a single-layer gate semiconductor device by which a low-cost process is possible, has a control gate which can well withstand a high voltage applied when data is erased or written, and can prevent an operation error by minimizing variations in the threshold value.

6 Claims, 48 Drawing Sheets

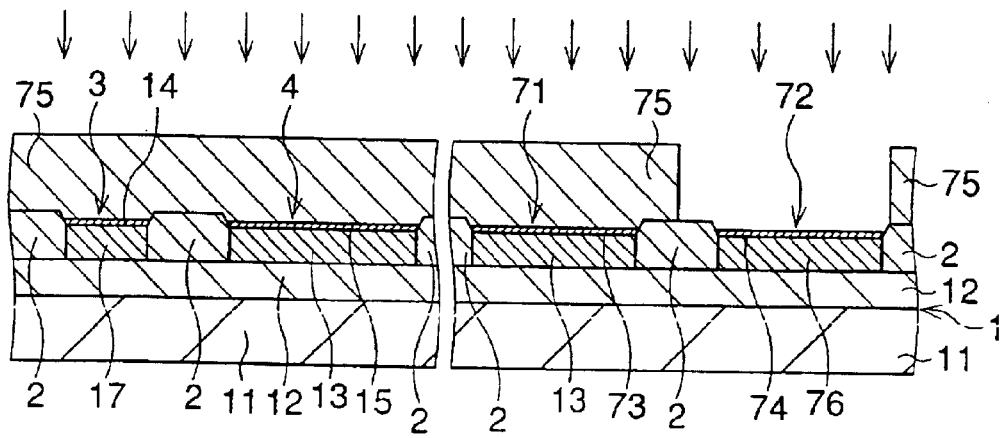

SEMICONDUCTOR DEVICE HAVING A SHIELD PLATE FOR APPLYING ELECTRIC POTENTIAL TO THE SEMICONDUCTOR SUBSTRATE

This application is a divisional of U.S. patent application Ser. No. 09/064,785, filed Apr. 23, 1998, now U.S. Pat. No. 6,489,650.

BACKGROUND OF THE INVENTION

1. Field of the Invention

The present invention relates to a semiconductor device and to a method of fabricating the same. More particularly, it relates to semiconductor device suitably applicable to a nonvolatile semiconductor memory in which a floating gate and a control gate are formed via a dielectric film.

2. Description of the Related Art

Recently, a nonvolatile memory such as an EEPROM which holds stored data even when disconnected from a power supply has attracted attention as a semiconductor memory. In this nonvolatile memory, a floating gate is formed on a semiconductor substrate via a tunnel insulating film, and a control gate is formed as to oppose this floating gate via a dielectric film.

One example of this nonvolatile semiconductor memory is disclosed in Japanese Patent Laid-Open No. 6-85279. This element is obtained by turning the above nonvolatile semiconductor memory upside down. More specifically, this nonvolatile semiconductor memory is fabricated by sequentially stacking a gate insulating film, a floating gate, and a tunnel insulating film in an insulating film formed on a semiconductor substrate, and forming a semiconductor layer having a source and a drain on top of the resultant structure. Since contacts can be extracted from the upper surface side, this element facilitates arranging word lines and is suited to increase the degree of integration.

The structure, however, of this nonvolatile semiconductor memory is complicated because the memory has a stacked gate structure, and this extremely increases the accuracy requirements when the element is to be formed. In addition, to lower the write voltage, it is necessary to increase the area of the overlap of the control gate and the floating gate. This not only increases the number of fabrication steps and the fabrication cost and lowers the reliability but also interferes with an increase in the degree of integration.

To solve the above problems, Japanese Patent Laid-Open No. 59-155968 or Japanese Patent Publication No. 7-112018 has disclosed an EEPROM which has a small cell area and includes a single-layer polysilicon film. This EEPROM includes a first element active region formed by forming a source and a drain on a semiconductor substrate and a second element active region formed adjacent to the first element active region via an element isolation structure by forming an impurity diffusion layer. A single-layer polysilicon film is patterned to form a floating gate which Is formed by patterning on a channel between the source and the drain via a tunnel insulating film in the first element active region. This floating gate is formed by patterning to oppose the impurity diffusion layer via a gate insulating film in the second active region. The impurity diffusion layer in the second element active region functions as a control gate.

In the above single-layer gate EEPROM, however, it is necessary to apply a high voltage of 20 (V) or more to the control gate, i.e., the impurity diffusion layer when data is erased or written, especially when data is erased. Consequently, it becomes difficult to ensure a large enough breakdown voltage between the control gate and the semiconductor substrate, leading to a serious problem of an operation error.

Furthermore, Japanese Patent Laid-Open No. 7-147340 has disclosed an EEPROM which has a diffusion layer serving as the control gate separated from other semiconductor area to apply a high voltage to the diffusion layer.

However, it is difficult to minimize variations in the threshold value of the EEPROM and stably perform write and read operations.

SUMMARY OF THE INVENTION

It is an object of the present invention to provide a reliable semiconductor device which is a single-layer gate semiconductor device by which a low-cost process is possible, has a control gate which can well withstand a high voltage applied when data is erased or written, and can prevent an operation error, and a method of fabricating the same.

A semiconductor device of the present invention is a semiconductor device comprising a semiconductor substrate in which a first and a second element active regions are demarcated by means of element isolation structure, structure having a shield plate electrode formed on the semiconductor substrate via a first insulating film, a first and a second conductive regions formed on a surface region of the semiconductor substrate in the first element active region, a first electrode formed on the semiconductor substrate between the first and the second conductive regions via a second insulating film, a third conductive region formed in the surface region of the semiconductor substrate in the second element active region, and a second electrode formed on the third conductive region via a dielectric film. The first electrode and the second electrode are electrically connected.

Another aspect of the semiconductor device of the present invention is a semiconductor device comprising a semiconductor substrate in which a first and a second element active regions are demarcated by means of element isolation structure, a first and a second conductive regions formed on a surface region of the semiconductor substrate in the first element active region, a first electrode formed on the semiconductor substrate between the first and the second conductive regions via a second insulating film, a third conductive region formed in the surface region of the semiconductor substrate in the second element active region, and a second electrode formed on the third conductive region via a dielectric film. The first electrode and the second electrode are electrically connected and a third electrode is connected to the semiconductor substrate to apply a predetermined electric potential to the semiconductor substrate in the first element active region.

A method of fabricating a semiconductor device of the present invention comprises the first step of defining first, second, third, and fourth element active regions by forming an element isolation structure on a semiconductor substrate having an insulating layer in a predetermined depth and covering a region from side surfaces to a lower surface of at least the first element active region with the insulating layer and the element isolation structure the second step of forming a first diffusion layer by doping an impurity into said first element active region, the third step of forming a diffusion layer region by doping an impurity having a conductivity type opposite to a conductivity type of the semiconductor substrate into a surface region of the semiconductor substrate in the second element active region, the fourth step of forming first, second, third, and fourth insulating films on the semiconductor substrate in the first, second, third, and fourth element active regions, respectively, the fifth step of forming a conductive film via first, second, third, and fourth insulating films on an entire surface of the semiconductor substrate in the first, second, third, and fourth element active regions, respectively, the sixth step of patterning the conductive film to leave a predetermined pattern in at least one of the first and third element active regions and form gate electrodes in the second and fourth element active regions, the seventh step of doping an impurity into the third and fourth element active regions to form a pair of second diffusion layers and a pair of third diffusion layers in surface regions of the semiconductor substrate on two sides of the conductive film in the third and fourth element active regions, the eighth step of doping an impurity having a conductivity type opposite to a conductivity type of the diffusion layer region into the second element active region to form a pair of fourth diffusion layers in surface regions of the semiconductor substrate on two sides of the conductive film in the second element active region, the ninth step of forming a fifth diffusion layer by doping an impurity into the semiconductor substrate near the third element active region, and the tenth step of forming an electrode connected to the fifth diffusion layer to apply a predetermined voltage to the third element active region via said fifth diffusion layer.

Another aspect of the method of fabricating a semiconductor device of the present invention comprises the first step of defining first and second element active regions by forming an element isolation structure on a semiconductor substrate having an insulating layer in a predetermined depth and covering a region from side surfaces to a lower surface of at least the first element active region with the insulating layer and the element isolation structure, the second step of forming a first diffusion layer by doping an impurity into a surface region of the semiconductor substrate in the first element active region, the third step of forming a first insulating film on the semiconductor substrate in the first element active region and a second insulating film on the semiconductor substrate in the second element active region, the fourth step of forming a conductive film on an entire surface including the first and second element active regions and patterning the conductive film to leave a predetermined pattern in at least one of the first and second element active regions, the fifth step of doping an impurity into an entire surface including the second element active region to form a pair of second diffusion layers in surface regions of the semiconductor substrate on two sides of the conductive film in the second element active region, the sixth step of forming a third diffusion layer by doping an impurity into the semiconductor substrate near the second element active region, and the seventh step of forming an electrode connected to the third layer to apply a predetermined voltage to the second element active region via the third diffusion layer.

Still another aspect of the method of fabricating a semiconductor device of the present invention comprises the first step of forming a first trench in a surface of a nearly flat semiconductor region, the second step of forming a first film having a film thickness larger than a depth of the first trench on an entire surface of the semiconductor region to bury the first trench, the third step of forming a second trench in a portion of the first film above the first trench, the second trench being formed to make a bottom surface of the second trench lower than the semiconductor substrate except for the first trench and not to reach the surface of the semiconductor substrate in the first trench, the fourth step of forming a second film having a film thickness larger than a depth of the second trench on an entire surface of the first film to bury the second trench, and the fifth step of polishing at least the first and second films by using the semiconductor substrate as a stopper, thereby planarizing the surface.

Still another aspect of the method of fabricating a semiconductor device of the present invention comprises the first step of forming a first insulating film on a semiconductor substrate, the second step of doping a first impurity to form a first diffusion layer in a predetermined range of a surface region of the semiconductor substrate, the third step of forming a first conductive film on the first insulating film, the fourth step of selectively removing the first conductive film until the first insulating film is exposed, thereby forming a first island conductive film on the first diffusion layer and a shield plate electrode having a first hole and a second hole which surrounds the first island conductive film and is wider than the first diffusion layer, the fifth step of forming a second insulating film on an entire surface to bury the first island conductive film and the shield plate electrode, the sixth step of defining an element active region by removing the second insulating film and the first insulating film present in the first hole until the semiconductor substrate is exposed, the seventh step of sequentially stacking a third insulating film and a second conductive film on the semiconductor substrate in the element active region, the eighth step of selectively removing the second conductive film to form a second island conductive film via the third insulating film on the semiconductor substrate in at least the element active region, the ninth step of doping a second impurity into an entire surface including the element active region to form a pair of second diffusion layers in surface regions of the semiconductor substrate on two sides of the second island conductive film in the element active region, and the tenth step of forming an integrated floating gate electrode by electrically connecting the first and second island conductive films.

Still another aspect of the method of fabricating a semiconductor device of the present invention comprises the first step of forming a first insulating film on a semiconductor substrate, the second step of doping a first impurity to form a first diffusion layer in a predetermined range of a surface region of the semiconductor substrate, the third step of forming a first conductive film on the first insulating film, the fourth step of selectively removing the first conductive film until the first insulating film is exposed, thereby forming a first island conductive film on the first diffusion layer and a shield plate electrode having a first hole and a second hole which surrounds the first island conductive film and is wider than the first diffusion layer, the fifth step of forming a second insulating film on an entire surface to bury the first island conductive film and the shield plate electrode, the sixth step of defining an element active region by removing the second insulating film and the first insulating film present in the first hole until the semiconductor substrate is exposed, the seventh step of forming a third insulating film on the semiconductor substrate in the element active region, the eighth step of forming a hole which exposes the first island conductive film in the second insulating film, the ninth step of filling the hole by forming a second conductive film on an entire surface including the element active region, the tenth step of selectively removing the second conductive film so as to leave a pattern extending from the hole to the element active region, thereby forming a floating gate electrode integrated with the first island conductive film, and the eleventh step of doping a second impurity into the element active region to form a pair of second diffusion layers in surface regions of the semiconductor substrate on two sides of the second conductive film in the element active region.

Still another aspect of the method of fabricating a semiconductor device of the present invention comprises the first step of forming a first insulating film in a predetermined region on a semiconductor substrate and a second insulating film on the semiconductor substrate not covered with the first insulating film, the second step of doping a first impurity to form a first diffusion layer in a surface region of the semiconductor substrate below the second insulating film, the third step of forming a first conductive film on the first and second insulating films, the fourth step of selectively removing the first conductive film until the first or second insulating film is exposed to form a first island conductive film on the first diffusion layer and a second island conductive film on the first insulating film, and simultaneously forming a shield plate electrode having holes surrounding the first and second island conductive films, the fifth step of forming a floating gate electrode by electrically connecting the first and second island conductive films, and the sixth step of doping an impurity into the hole surrounding the second island conductive film to form a pair of second diffusion layers in surface regions of the semiconductor substrate on two sides of the second island conductive film.

In the present invention, a conductor layer which functions as the control gate of a nonvolatile semiconductor memory is formed in a surface region of a semiconductor substrate, and a region from the side surfaces to the lower surface of this conductor layer is completely covered with an insulating film. Therefore, even when a high voltage is applied to the control gate to erase data, a high breakdown voltage can be held in the outer portion of the conductor layer. Also, a pair of diffusion layers is formed in surface regions of the semiconductor substrate on the two sides of a tunnel oxide film of the nonvolatile semiconductor memory, and an electrode is formed to apply a predetermined substrate potential to an element active region including these diffusion layers. Accordingly, it is possible to minimize variations in the threshold value and stably perform write and read operations.

The present invention can realize a reliable semiconductor device which is a single-layer gate semiconductor device by which a low-cost process is possible, has a control gate which can well withstand a high voltage applied when data is erased or written, and can prevent an operation error.

BRIEF DESCRIPTION OF THE DRAWINGS

FIGS. 19A to 19M are schematic sectional views showing a method of fabricating the EEPROM according to the eighth embodiment of the present invention in order of steps;

DETAILED DESCRIPTION OF THE PREFERRED EMBODIMENTS

Several preferred embodiments of the present invention will be described in detail below with reference to the accompanying drawings.

First Embodiment

Figure 1:
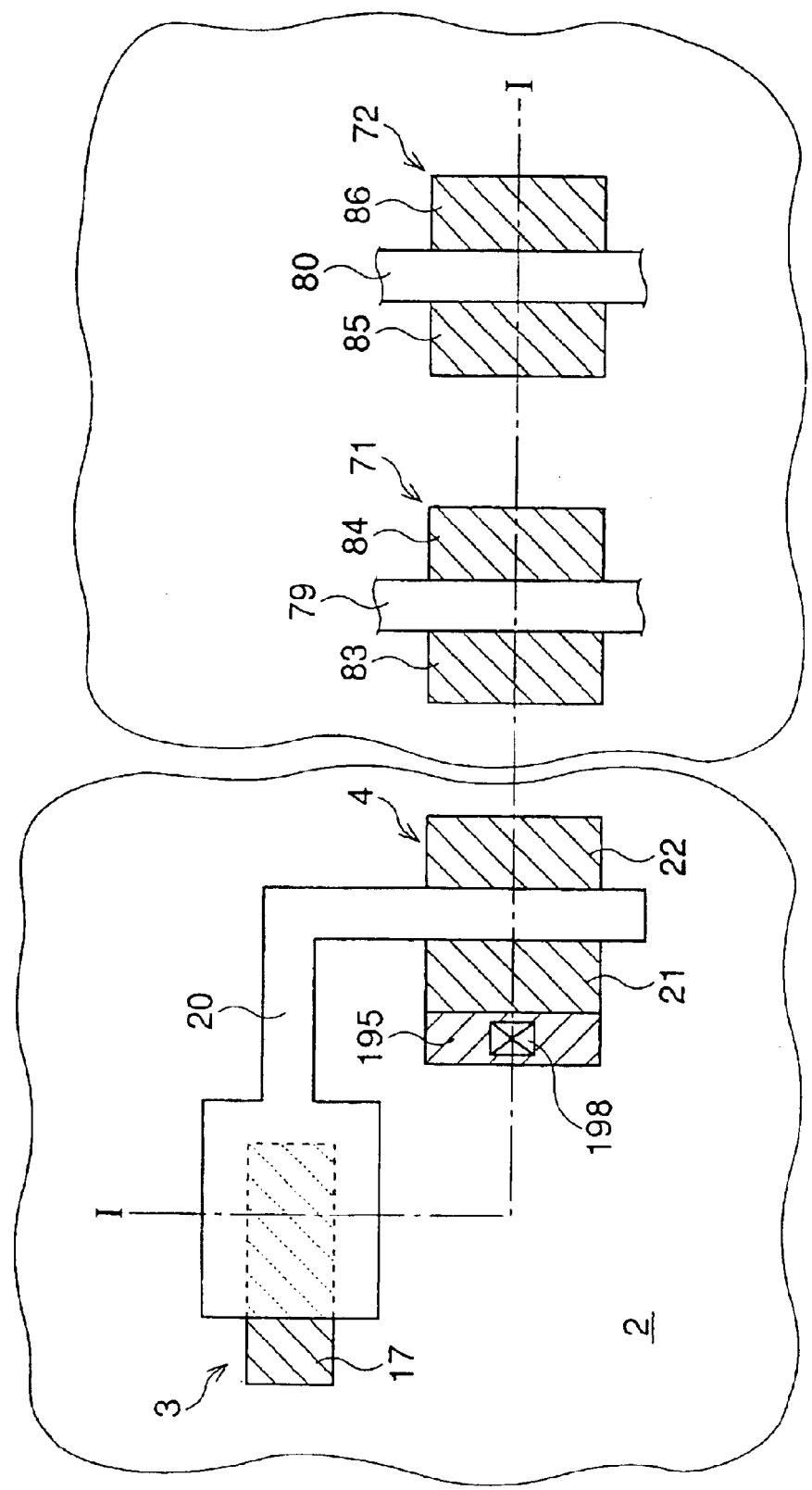
FIG. 1 is a schematic plan view showing an EEPROM according to the first embodiment of the present invention.

The first embodiment will be described below. In this first embodiment, an EEPROM as a nonvolatile semiconductor memory will be exemplified as a semiconductor device, and the structure and the fabrication method of this EEPROM will be explained. Also, a method of forming a CMOS inverter as a peripheral circuit simultaneously with the formation of the EEPROM will be explained. FIG. 1 is a schematic plan view showing the EEPROM and the CMOS inverter. FIGS. 2A to 2I are schematic sectional views, taken along an alternate long and short dashed line I—I in FIG. 1, showing the fabrication method of the EEPROM and the CMOS inverter in order of steps.

Figure 2A:
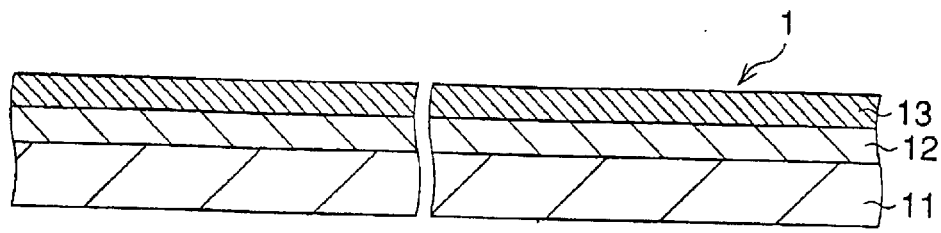
FIGS. 2A to 2I are schematic sectional views showing a method of fabricating the EEPROM according to the first embodiment of the present invention in order of steps.

First, as shown in FIG. 2A, an SOI substrate 1 is prepared by forming a single-crystal silicon layer 13 about 50 nm thick on a p-type silicon semiconductor substrate 11 via a buried oxide film 12 about 50 nm thick.

Figure 2B:
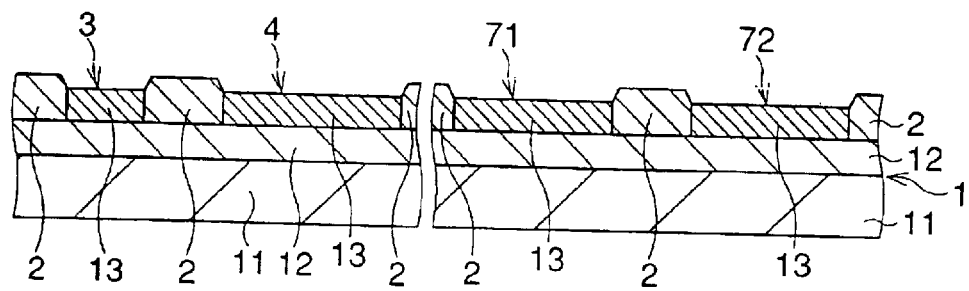

Next, as shown in FIG. 2B, the SOI substrate 1 is selectively oxidized to form a field oxide film 2 about 100 nm thick as an element isolation structure by so-called LOCOS, process thereby defining element regions 3, 4, 71, and 72 on the SOI substrate 1. Consequently, the element regions 3 and 4 and the element regions 71 and 72 are formed adjacent to each other while being electrically isolated via the field oxide film 2. The element regions 3 and 4 are regions in which the EEPROM is to be formed. The element regions 71 and 72 are regions in which the CMOS inverter is to be formed.

Figure 2C:
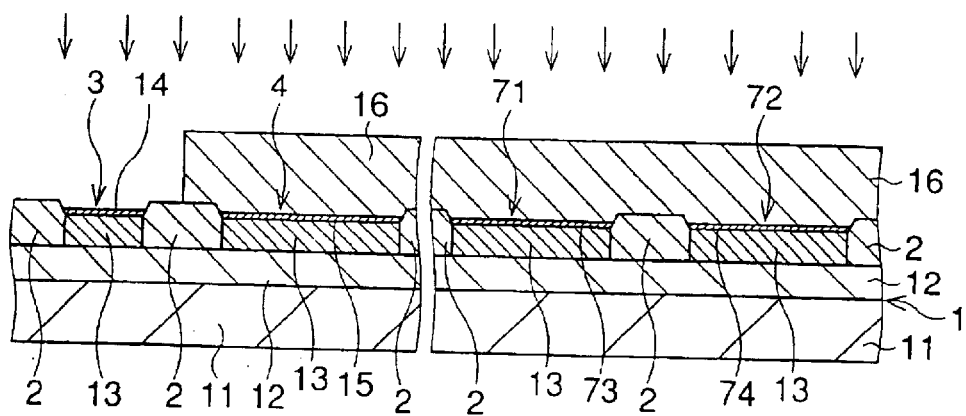

As shown in FIG. 2C, the surface of the single-crystal silicon layer 13 in the element regions 3, 4, 71, and 72 is thermally oxidized to form cap insulating films 14, 15, 73, and 74 about 10 to 20 nm thick for ion implantation.

Subsequently, the entire surface is coated with a photoresist, and the photoresist is processed by photolithography into a shape by which only the element region 3 is exposed, thereby forming a resist mask 16. This resist mask 16 is used as a mask to ion-implant an n-type impurity, arsenic (As) or phosphorus (P) in this embodiment, at a dose of 1 to $2 \times 10^{15}$ (1/cm$^2$) and an acceleration energy of 30 (keV). Consequently, the n-type impurity is ion-implanted through the cap insulating film 14 into an entire area in the direction of depth of the single-crystal silicon layer 13, from its surface layer to the buried oxide film 12, in the element region 3.

After the resist mask 16 is removed by ashing or the like and the resultant structure is cleaned, the SOI substrate 1 is annealed to form an impurity diffusion layer 17 functioning as the control gate of the EEPROM. A region from the side surfaces to the lower surface of this impurity diffusion layer 17 is covered with the field oxide film 2 and the buried oxide film 12.

Figure 2D:
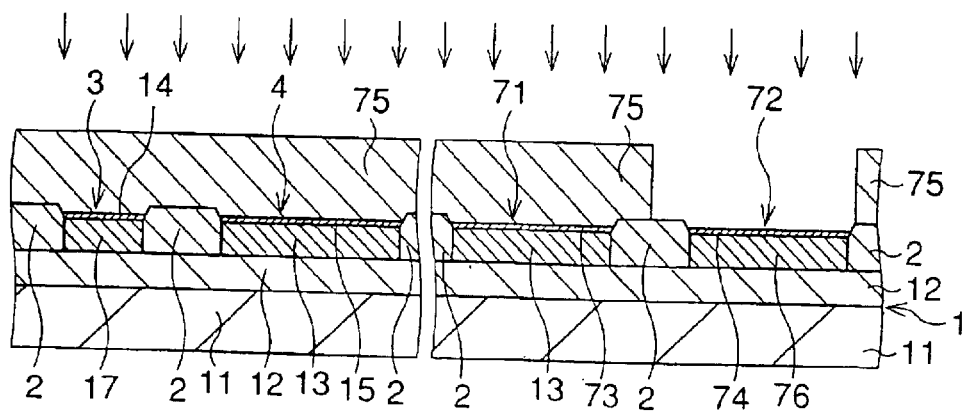

Next, as shown in FIG. 2D, a photoresist is processed by photolithography into a shape by which only the element region 72 is exposed, thereby forming a resist mask 75. This resist mask 75 is used as a mask to ion-implant an n-type impurity, phosphorus (P) in this embodiment, at a dose of $1 \times 10^{12}$ (1/cm$^2$) and an acceleration energy of 30 (keV). Consequently, this n-type impurity is ion-implanted into the single-crystal silicon layer 13 in the element region 72 through the cap insulating film 74.

After the resist mask 75 is removed by ashing or the like and the resultant structure is cleaned, the SOI substrate 1 is annealed to form an n-type well region 76 of the CMOS inverter. Thereafter, the cap insulating films 14, 15, 73, and 74 are removed.

Figure 2E:
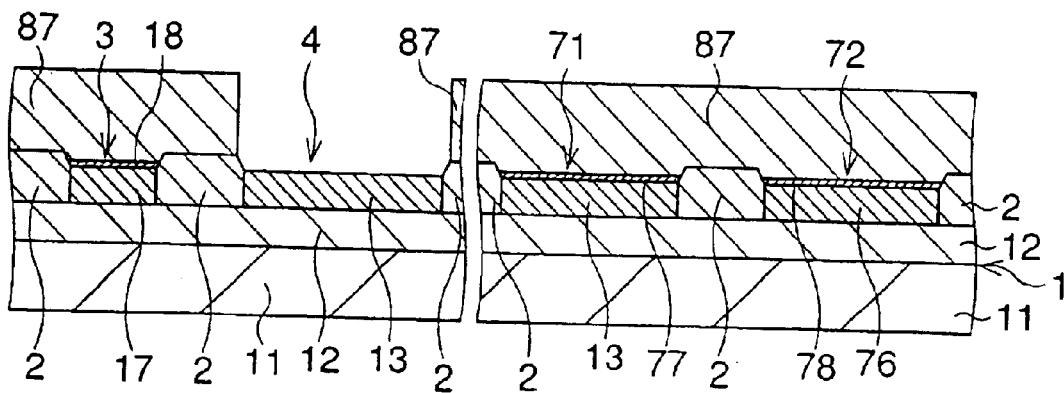

Next, as shown in FIG. 2E, the surface of the single-crystal silicon layer 13 in the element regions 3, 4, 71, and 72 is again thermally oxidized to form an oxide film 18 about 15 to 20 nm thick on the surface of the impurity diffusion layer 17 in the element region 3 and gate oxide films 77 and 78 about 15 to 20 nm thick on the surface of the single-crystal silicon layer 13 in the element regions 71 and 72, respectively. Thereafter, a resist mask 87 is formed to cover the resultant structure except for the element region 4, and the oxide film formed in the element region 4 by the thermal oxidation described above is etched away.

Figure 2F:
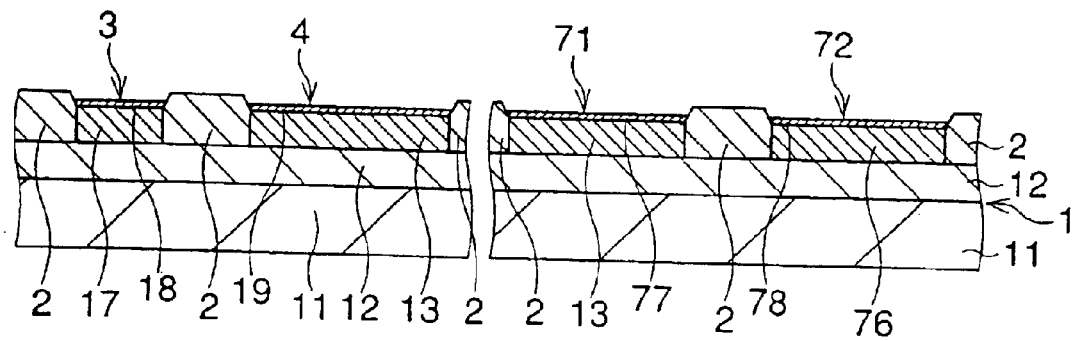

As shown in FIG. 2F, after the resist mask 87 is removed, thermal oxidation is again performed to form a tunnel oxide film 19 about 8 to 12 nm thick on the surface of the single-crystal silicon layer 13 in the element region 4.

Figure 2G:
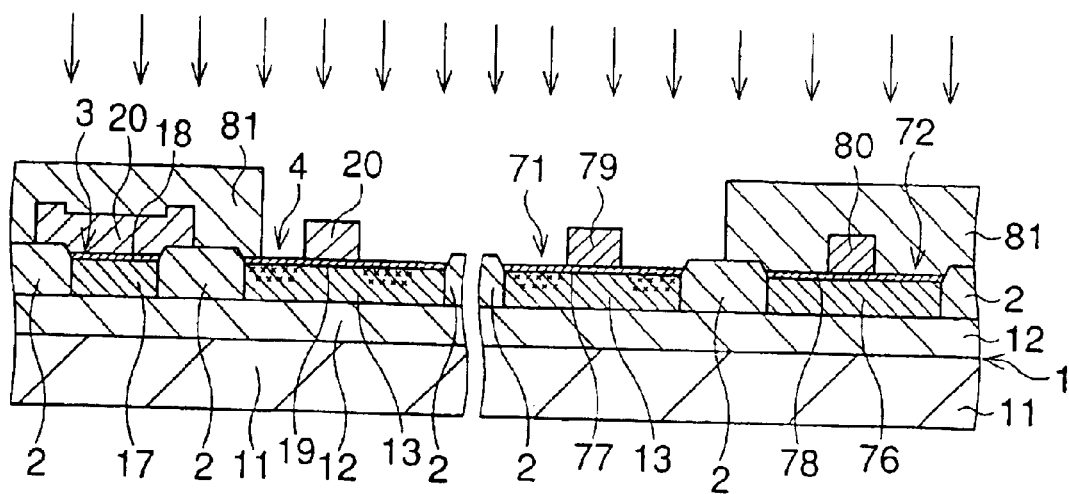

As shown in FIG. 2G, an undoped polysilicon film is deposited by CVD on the entire surface including the element regions 3, 4, 71, and 72, and an n-type impurity, phosphorus (P) in this embodiment, is doped into this polysilicon film. Photolithography and dry etching are sequentially performed for the polysilicon film to form an island-pattern floating gate 20 made of the polysilicon film and extending from the element region 3 to the element region 4. At the same time, gate electrodes 79 and 80 of the CMOS inverter are formed from the polysilicon film.

More specifically, as shown in FIG. 1, in the element region 3, the floating gate 20 is formed to extend over the adjacent field oxide film 2 and cover the element region 3 via the oxide film 18. In the element region 4, the floating gate 20 is formed into the form of a belt having a predetermined width via the tunnel oxide film 19. Also, the gate electrodes 79 and 80 of the CMOS inverter are formed to extend over the element regions 71 and 72, respectively, and the field oxide film 2.

As described above, the floating gate 20 and the gate electrodes 79 and 80 of the CMOS inverter can be simultaneously formed by the patterning after the polysilicon film is formed. As a consequence, the fabrication process can be simplified. Note that the gate electrodes 79 and 80 may be so patterned as to be connected on the field oxide film 2.

Subsequently, a photoresist is processed by photolithography into a shape by which only the element regions 4 and 71 are exposed, thereby forming a resist mask 81. This resist mask 81 is so formed as to cover a portion of the element region 4. An n-type impurity, arsenic (As) in this embodiment, is ion-implanted at a dose of 1 to $2 \times 10^{15}$ (1/cm$^2$) and an acceleration energy of 30 (keV). Consequently, the arsenic is ion-implanted through the tunnel oxide film 19 into the single-crystal silicon layer 13 on the two sides of the floating gate 20 in the element region 4. However, this arsenic is not ion-implanted into the portion of the element region 4 covered with the resist mask 81.

Simultaneously, the arsenic is ion-implanted through the gate oxide film 77 into the single-crystal silicon layer 13 on the two sides of the gate electrode 79 of the CMOS inverter.

Figure 2H:
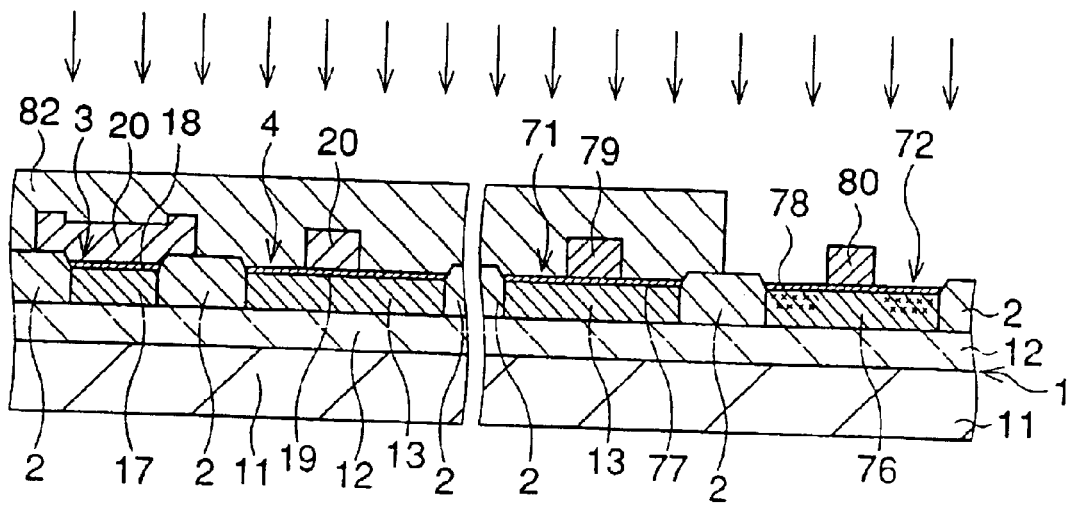

Next, as shown in FIG. 2H, a photoresist is processed by photolithography into a shape by which only the element region 72 is exposed, thereby forming a resist mask 82. This resist mask 82 is used as a mask to ion-implant a p-type impurity, boron (B) in this embodiment, at a dose of 1 to $2 \times 10^{15}$ (1/cm$^2$) and an acceleration energy of 30 (keV). Consequently, the p-type impurity is ion-implanted through the gate oxide film 78 into the single-crystalline silicon layer 13 on the two sides of the gate electrode 80 of the CMOS inverter in the element region 72.

After the resist mask 82 is removed, boron (B) is ion-implanted at a dose of 3 to $5 \times 10^{15}$ (1/cm$^2$) and an acceleration energy of 30 (keV) into the portion of the element region 4 into which no n-type impurity is ion-implanted. This ion implantation may be performed in the same step as the ion implantation to the element region 72 described above.

Figure 2I:
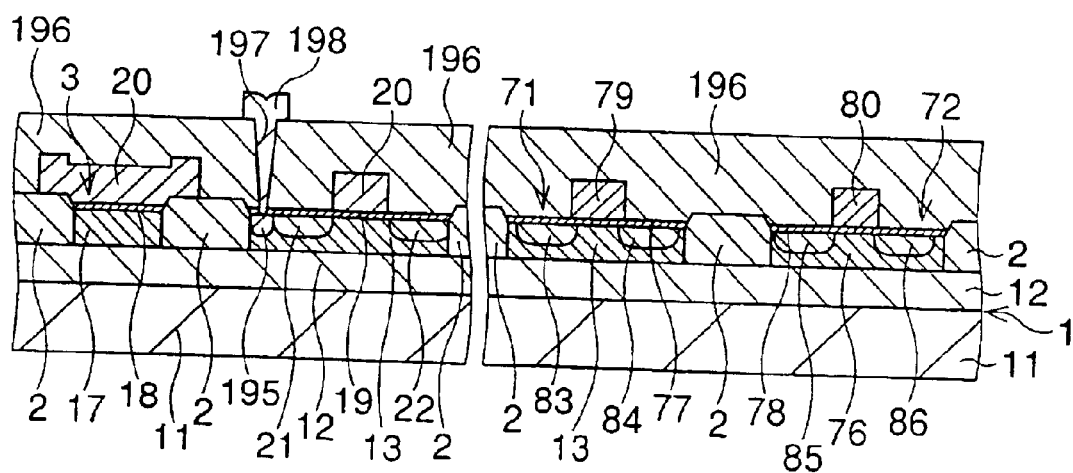

Thereafter, as shown in FIG. 2I, the SOI substrate 1 is annealed to form a pair of impurity diffusion layers 21 and 22 serving as the source and drain of the control gate of the EEPROM. Simultaneously, pairs of impurity diffusion layers 83 and 84 and impurity diffusion layers 85 and 86 are formed in a p-type well region and the n-type well region 76 of the CMOS inverter.

A p-type impurity diffusion layer 195 is formed adjacent to the impurity diffusion layer 21 by using the boron (B) ion-implanted into the portion of the element region 4.

Thereafter, an insulating interlayer 196 is formed, and a contact hole 197 for exposing the p-type impurity diffusion layer 195 is formed. An aluminum electrode 198 burying the contact hole 197 and connected to the p-type impurity diffusion layer 195 is formed by sputtering.

Finally, interconnecting layers for connection and the like are formed to complete the EEPROM of the first embodiment. Preferably, when the interconnecting layers are formed, one of the impurity diffusion layers 83 and 84 acting as a drain is electrically connected to one of the impurity diffusion layers 85 and 86 acting as a source.

In the EEPROM of the first embodiment, in the element region 4, the floating gate 20 is formed on the channel, which is formed in the single-crystal silicon layer 13 between the impurity diffusion layers 21 and 22 serving as a source and a drain, via the tunnel oxide film 19. In the element region 3, the floating gate 20 opposes the impurity diffusion layer 17 as a control gate via the oxide film 18 and is capacitively coupled with this impurity diffusion layer 17 by using the oxide film 18 as a dielectric film.

To erase data, for example, the source and drain (impurity diffusion layers) 21 and 22 are set at 0 (V), and a predetermined voltage of about 20 (V) is applied to the control gate (impurity diffusion layer) 17. Since this voltage of the control gate 17 is also applied to the floating gate 20 at the capacitive coupling ratio of the oxide film 18 to the tunnel oxide film 19, electrons are injected from the single-crystal silicon layer 13 through the tunnel oxide film 19. Consequently, the threshold value of the transistor including the tunnel oxide film 19 rises to set the EEPROM in an erase state. The control gate 17 is well insulated from the silicon semiconductor substrate 11 because its lower surface is covered with the buried oxide film 12 and its side surfaces are covered with the field oxide film. Therefore, even when a voltage of up to, e.g., 30 (V) is applied to the control gate 17, no breakdown to the silicon semiconductor substrate 11 takes place.

Additionally, in the first embodiment, the p-type impurity diffusion layer 195 is formed adjacent to the impurity diffusion layer 21 as one of the source and the drain of the EEPROM. Since a predetermined substrate potential can be applied to this p-type impurity diffusion layer 195 via the aluminum electrode 198, it is possible to minimize variations in the threshold value of the EEPROM and stably perform write and read operations.

Accordingly, the first embodiment realizes a reliable EEPROM which is a single-layer gate semiconductor device by which a low-cost process is possible, has the control gate 17 which can well withstand a high voltage applied when data is erased or written, and can prevent an operation error and can also shorten the erase time.

Furthermore, the SOI substrate 1 prepared by forming the single-crystal silicon layer 13 on the silicon semiconductor substrate 11 via the buried oxide film 12 is used as a semiconductor substrate. Therefore, the operating speed and the leak current characteristics can be improved.

Also, in the first embodiment, a CMOS inverter can be simultaneously formed as a peripheral circuit of the EEPROM. In the formation of this CMOS inverter, the gate electrodes 79 and 80 are formed by patterning the same polysilicon film as the floating gate 20. Consequently, these two parts can be simultaneously formed without complicating the process.

Note that in the first embodiment, the floating gate 20 is formed into an island pattern made of a single polysilicon film. However, the floating gate may be formed by simultaneously forming two polysilicon film patterns in the element regions 3 and 4 and electrically connecting these patterns through a contact hole or the like in a later step. If this is the case, the aluminum electrode 198 can be formed simultaneously with the electrical connection.

Note also that in the first embodiment, the field oxide film 2 formed by LOCOS is exemplified as an element isolation structure formed on the SOI substrate 1. However, element isolation may be performed by some other element isolation structure such as a shallow-trench element isolation structure (STI) or a field-shield element isolation structure. As an example, FIG. 3 shows element isolation performed by using the shallow-trench element isolation structure.

Figure 3:
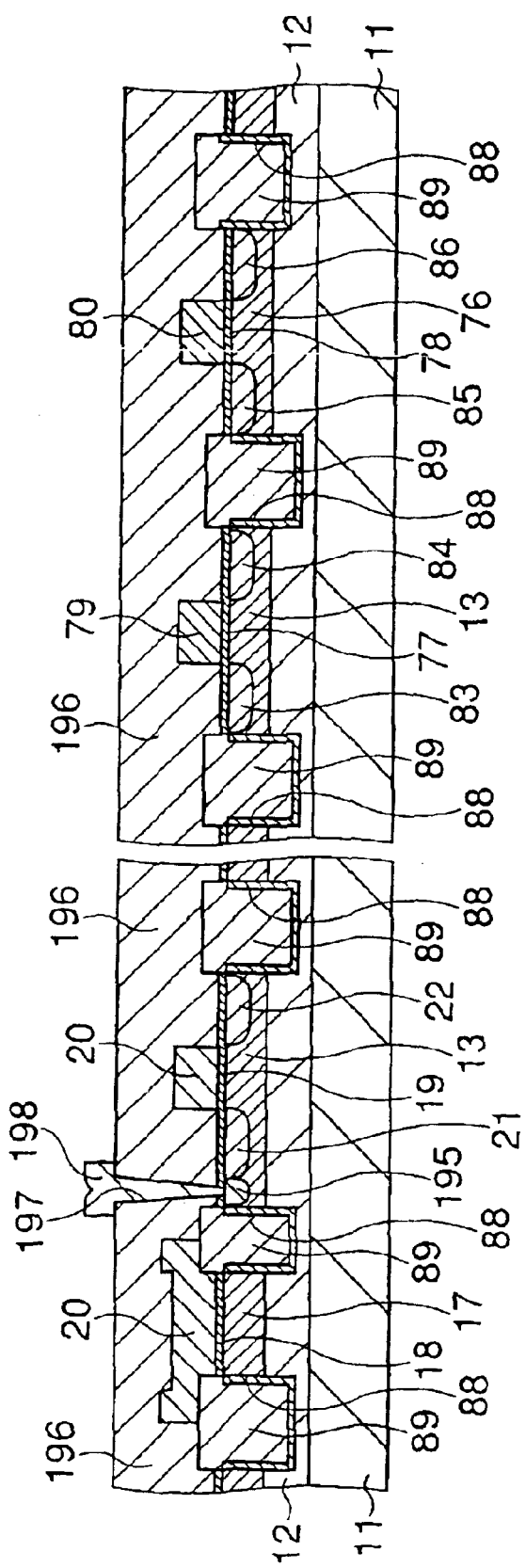
FIG. 3 is a schematic sectional view showing an EEPROM according to a modification of the first embodiment of the present invention.

In the shallow-trench element isolation structure as shown in FIG. 3, a trench 88 is formed to reach the buried oxide film 12 of the SOI substrate 1 and buried with a silicon oxide film 89. Therefore, the element isolation width is determined by the width of the trench 88.

Since it is possible by this structure to avoid problems such as a bird's beak caused by LOCOS, semiconductor elements can be made finer.

Second Embodiment

Figure 4:
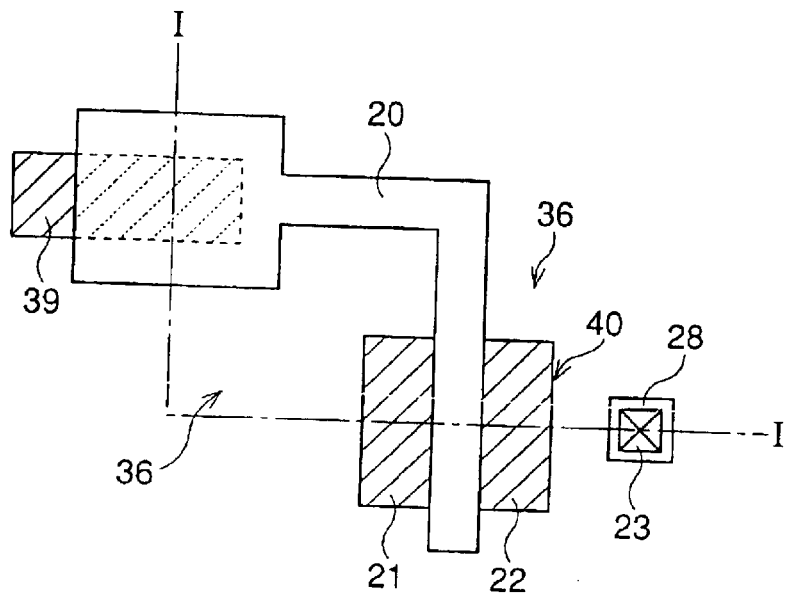
FIG. 4 is a schematic plan view showing an EEPROM according to the second embodiment of the present invention.

The second embodiment of the present invention will be described below. In this second embodiment, the structure and the fabrication method of an EEPROM will be explained as in the first embodiment. However, the second embodiment differs from the first embodiment in that no SOI substrate is used and trench isolation is used as element isolation. FIG. 4 is a schematic plan view showing this EEPROM. FIGS. 5A to 5I are schematic sectional views, taken along an alternate long and short dashed line I—I in FIG. 4, showing the method of fabricating the EEPROM in order of steps performed. Note that the same reference numerals as in the EEPROM of the first embodiment denote the same parts in the second embodiment, and a detailed description thereof will be omitted.

Figure 5A:
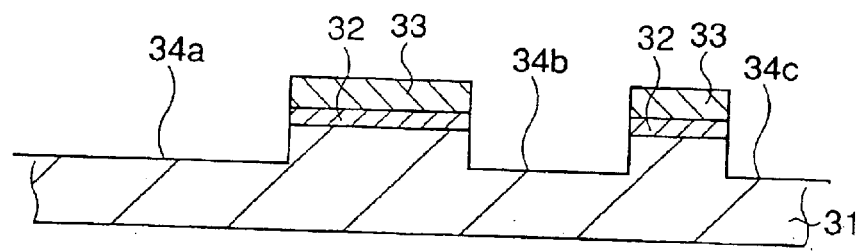
FIGS. 5A to 5I are schematic sectional views showing a method of fabricating the EEPROM according to the second embodiment of the present invention in order of steps.

First, as shown in FIG. 5A, the surface of a p-type silicon semiconductor substrate 31 is coated with a photoresist about 1.5 $\mu$m thick via a silicon oxide film 32 about 50 nm thick. This photoresist is processed by photolithography to form a resist mask 33 having a predetermined shape.

Subsequently, the resist mask 33 is used as a mask to dry-etch the silicon semiconductor substrate 31, forming trenches 34a, 34b, and 34c about 0.4 $\mu$m deep from the surface of the silicon semiconductor substrate 31 on the two sides of the resist mask 33.

Figure 5B:
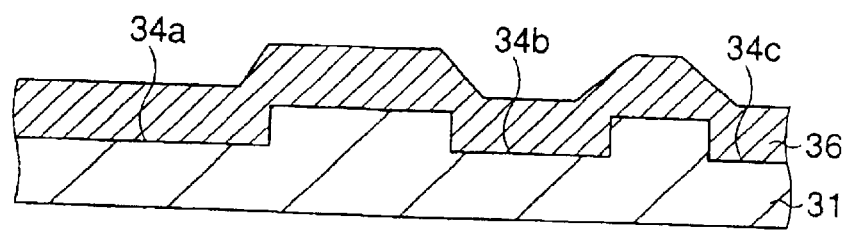

Next, as shown in FIG. 5B, after the resist mask 33 is removed by ashing or the like, a silicon oxide film 36 having a film thickness, about 0.6 to 1.0 $\mu$m in this embodiment, greater than the depth of the trenches 34a, 34b, and 34c, is deposited on the silicon semiconductor substrate 31 by CVD. Consequently, the trenches 34a, 34b, and 34c are buried with this silicon oxide film 36.

Figure 5C:
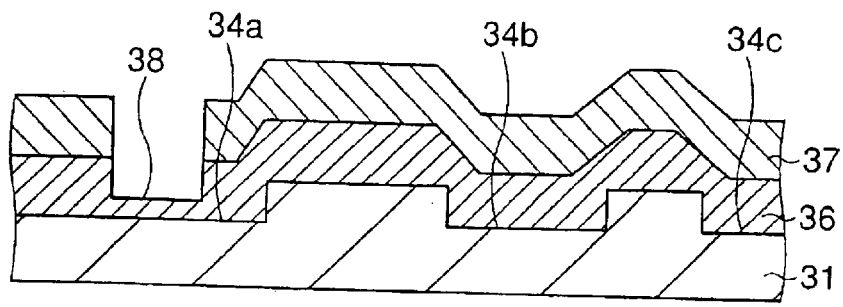

As shown in FIG. 5C, the surface of the silicon oxide film 36 is coated with a photoresist, and this photoresist is processed by photolithography to form a resist mask 37 having a shape by which a predetermined portion of the silicon oxide film 36 corresponding to an upper portion of only the trench 34a is exposed.

Subsequently, the resist mask 37 is used as a mask to dry-etch the silicon oxide film 36 and form a trench 38 in the silicon oxide film 36. More specifically, this trench 38 is formed in the silicon oxide film 36 to have a predetermined depth, about 0.2 $\mu$m from the surface of the silicon semiconductor substrate 31 in this embodiment, by which the trench 38 does not reach the surface (of the trench 34a) of the silicon semiconductor substrate 31, and a predetermined width narrower than the trench 34a.

Figure 5D:
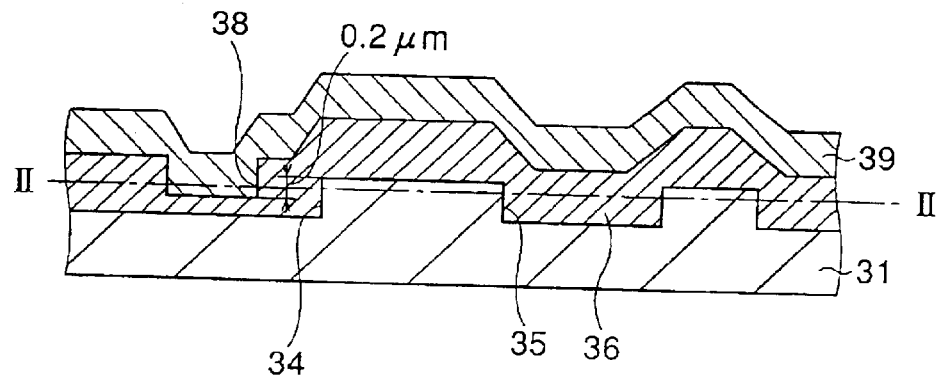

Next, as shown in FIG. 5D, after the resist mask 37 is removed by ashing or the like, an undoped polysilicon film 39 having a film thickness, about 0.5 to 1.0 µm in this embodiment, greater than the depth of the trench 38, is deposited on the silicon oxide film 36 by CVD. Consequently, the trench 38 is buried with this polysilicon film 39. Thereafter, an n-type impurity, phosphorus (P) in this embodiment, is doped into the polysilicon film 39.

Figure 5E:
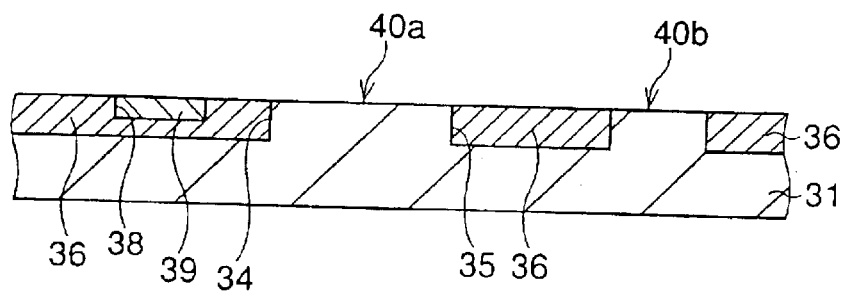

As shown in FIG. 5E, the silicon semiconductor substrate 31 is used as a stopper to polish the polysilicon film 39 and the silicon oxide film 36 by, e.g., chemical-mechanical polishing (CMP), thereby planarizing the surface. As indicated by an alternate long and short dashed line II—II in FIG. 5D, the chemical-mechanicalpolishing is so performed that the surface (topmost surface) of the silicon semiconductor substrate 31 is polished by a slight amount, 0 to 0.05 µm in this embodiment. Since the surface is planarized, the trenches 34a, 34b, and 34c are filled with the silicon oxide film 36 to accomplish trench isolation. Consequently, element regions 40a and 40b are formed, and the trench 38 is filled with the polysilicon film 39. The silicon oxide film 36 in the trenches 34a, 34b, and 34c functions as an element isolation insulating film, and the polysilicon film 39 in the trench 38 functions as a control gate. Since the element isolation insulating film and the control gate are simultaneously formed by performing polishing one time as described above, the process is shortened.

Subsequently, the surface of the silicon semiconductor substrate 31 and the surface of the polysilicon film 39 in the exposed element regions 40a and 40b are thermally oxidized to form a cap insulating film (not shown) about 10 to 20 nm thick for ion implantation.

To adjust the threshold value of a transistor serving as a memory cell, boron (B) is ion-implanted at a dose of $1 \times 10^{12}$ (1/cm$^2$) into the entire surface (not shown).

Figure 5F:
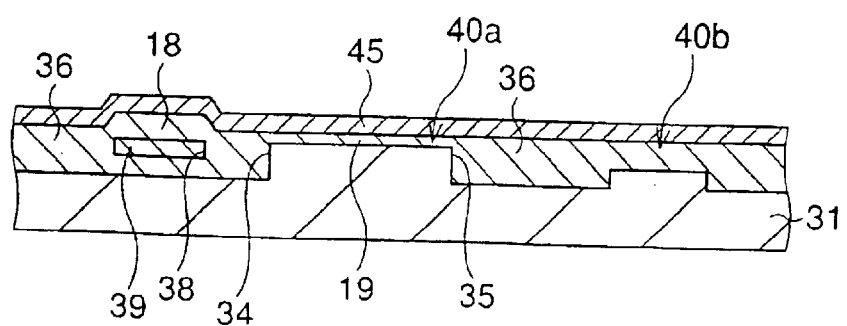

Next, as shown in FIG. 5F, after the cap insulating film is removed, the surface of the polysilicon film 39 in the trench 38 and the surface of the silicon semiconductor substrate 31 in the element regions 40a and 40b are thermally oxidized to form an oxide film 18 about 15 to 20 nm thick on the surface of the polysilicon film 39 and the surface of the element region 40b and to form a tunnel oxide film 19 about 8 to 12 µnm thick on the surface of the silicon semiconductor substrate 31 in the element region 40a.

Subsequently, an undoped polysilicon film 45 is deposited by CVD on the entire surface including the oxide film 18 and the tunnel oxide film 19. An n-type impurity, phosphorus (P) in this embodiment, is doped into this polysilicon film 45.

Figure 5G:
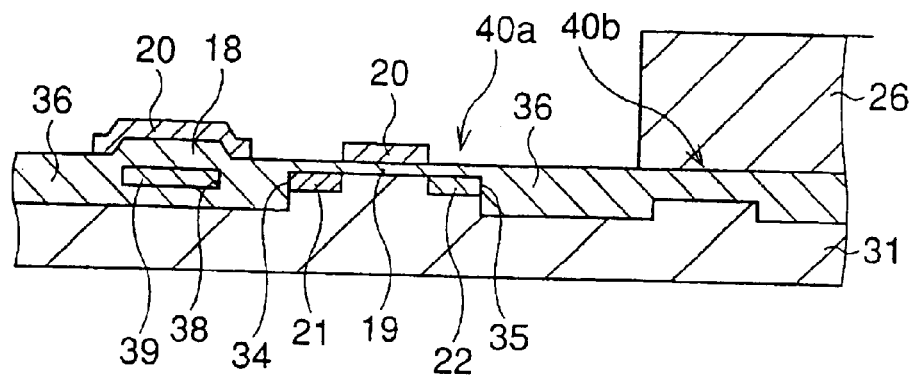

Next, as shown in FIG. 5G, photolithography and dry etching are sequentially performed for the polysilicon film 45 to form an island-pattern floating gate 20 made of the polysilicon film and extending from the oxide film 18 to the tunnel oxide film 19. More specifically, as shown in FIG. 4, on the silicon oxide film 36 in the trench 34a, the floating gate 20 is formed to extend over the adjacent field oxide film 2 and oppose the polysilicon film 39 in the trench 38 via the oxide film 18. In the element region 40a, the floating gate 20 is formed into the form of a belt having a predetermined width via the tunnel oxide film 19.

Subsequently, after a resist mask 26 is formed by photolithography to cover the element region 40b, an n-type impurity, arsenic (As) in this embodiment, is ion-implanted into the entire surface at a dose of 1 to $2 \times 10^{15}$ (1/cm$^2$) and an acceleration energy of 30 (keV). Consequently, the arsenic is ion-implanted through the tunnel oxide film 19 into the silicon semiconductor substrate 31 on the two sides of the floating gate 20 in the element region 40a.

Figure 5H:
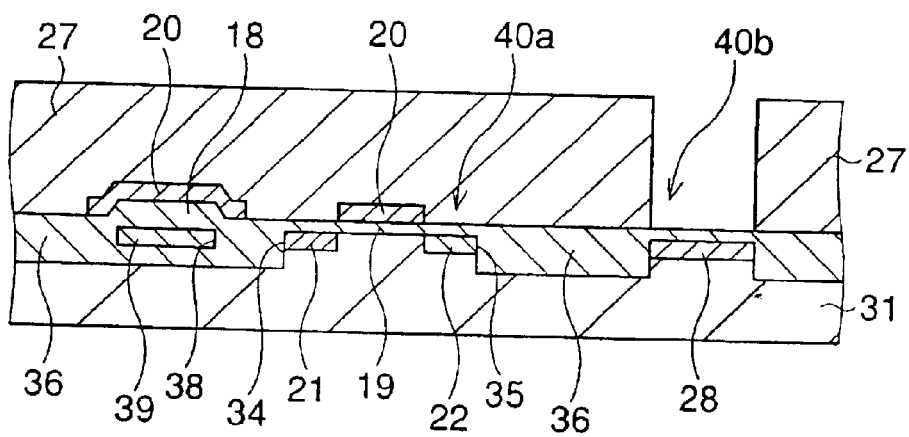

Next, as shown in FIG. 5H, the resist mask 26 is removed, and a resist mask 27 covering the surface except for the element region 40b is formed. A p-type impurity, boron (B) in this embodiment, is ion-implanted into the entire surface at a dose of 3 to $5 \times 10^{15}$ (1/cm$^2$) and an acceleration energy of 30 (keV).

The silicon semiconductor substrate 31 is then annealed to form a pair of impurity diffusion layers 21 and 22 serving as a source and a drain in the element region 40a and form a p-type impurity diffusion layer 28 in the element region 40b.

Figure 5I:
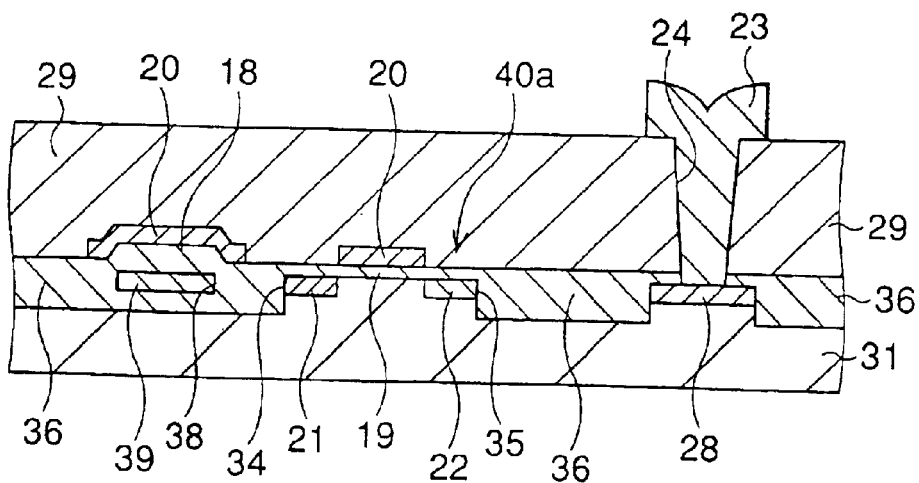

Thereafter, as shown in FIG. 5I, an insulating interlayer 29 and a contact hole 24 are formed, and an aluminum electrode 23 for burying the contact hole 24 is formed by sputtering. This aluminum electrode 23 is connected to the p-type impurity diffusion layer 28 and used to apply a predetermined substrate potential to the silicon semiconductor substrate 31. Finally, interconnecting layers for connection and the like are formed to complete the EEPROM of the second embodiment.

In the element region 40a of the EEPROM of the second embodiment, the floating gate 20 is formed on the channel, which is formed in the silicon semiconductor substrate 31 between the impurity diffusion layers 21 and 22 serving as a source and a drain, via the tunnel oxide film 19. On the silicon oxide film 36a, with which the trench 34 is filled, the floating gate 20 opposes the polysilicon film 39 as a control gate via the oxide film 18 and is capacitively coupled with this polysilicon film 39 by using the oxide film 18 as a dielectric film.

To erase data, for example, the source and drain (impurity diffusion layers) 21 and 22 are set at 0 (V), and a predetermined voltage of about 20 (V) is applied to the control gate (polysilicon film) 39. Since this voltage of the control gate 39 is also applied to the floating gate 20 at the capacitive coupling ratio of the oxide film 18 to the tunnel oxide film 19, electrons are injected from the silicon semiconductor substrate 31 through the tunnel oxide film 19. Consequently, the threshold value of the transistor including the tunnel oxide film 19 rises to set the EEPROM in an erase state. The control gate 39 is well insulated from the silicon semiconductor substrate 31 by the silicon oxide film 36 in the trench 34. Therefore, even when a voltage of up to, e.g., 30 (V) is applied to the control gate 39, no breakdown to the silicon semiconductor substrate 31 takes place.

Additionally, in the second embodiment, the p-type impurity diffusion layer 28 is formed in the element region 40b formed adjacent to the element region 40a, in which the source and the drain of the EEPROM are formed, via the field oxide film 2. Since a predetermined substrate potential can be applied to this p-type impurity diffusion layer 28 via the aluminum electrode 23, it is possible to minimize variations in the threshold value of the EEPROM and stably perform write and read operations.

Accordingly, the second embodiment realizes a reliable EEPROM which is a single-layer gate semiconductor device by which a low-cost process is possible, has the control gate 39 which can well withstand a high voltage applied when data is erased or written, and can prevent an operation error and can also shorten the erase time.

Note that in the second embodiment, the floating gate 20 is formed into an island pattern made of a single polysilicon film. However, this floating gate may be formed by simultaneously forming two polysilicon film patterns on the polysilicon film 39 via the oxide film 18 and in the element region 40 and electrically connecting these patterns through a contact hole or the like in a later step.

Modification

A modification of the second embodiment will be described below. This modification is substantially the same as the second embodiment except for a slight difference in the fabrication process. FIGS. 6A to 6D are schematic sectional views showing the fabrication method of this EEPROM in order of steps performed. Note that the same reference numerals as in the EEPROM of the second embodiment denote the same parts in this modification, and a detailed description thereof will be omitted.

First, the steps until FIG. 5B are performed in the same manner as in the second embodiment to deposit the silicon oxide film 36 on the silicon semiconductor substrate 31 by CVD and bury the trenches 34a, 34b, and 34c with this silicon oxide film 36.

Figure 6A:
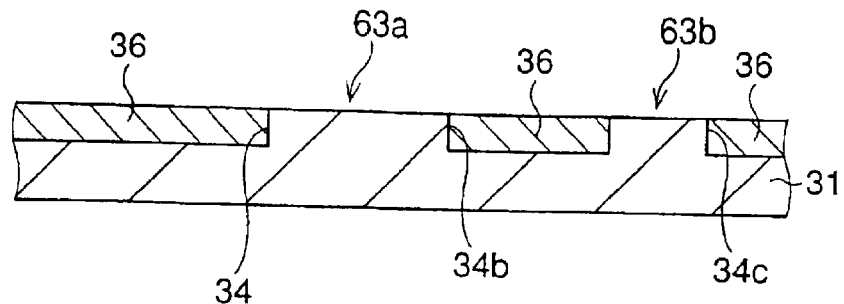
FIGS. 6A to 6D are schematic sectional views showing a method of fabricating an EEPROM according to a modification of the second embodiment of the present invention in order of steps.

Next, as shown in FIG. 6A, the silicon substrate 31 is used as a stopper to polish the silicon oxide film 36 by, e.g., chemical-mechanical polishing (CMP), thereby planarizing the surface. Consequently, the trenches 34a, 34b, and 34c are filled with the silicon oxide film 36 to accomplish trench isolation, forming element isolation regions 63a and 63b.

Figure 6B:
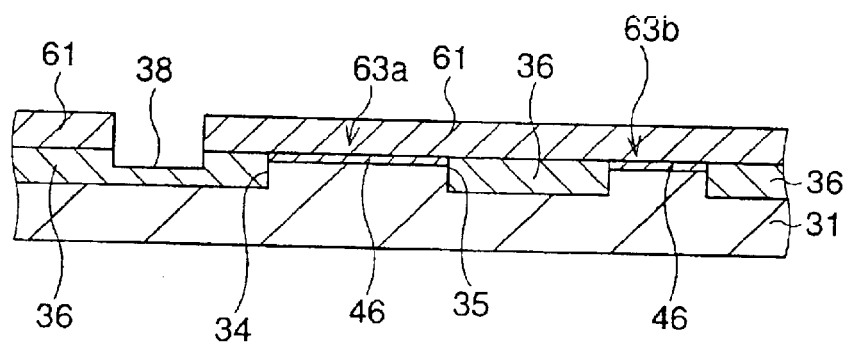

As shown in FIG. 6B, the entire surface is thermally oxidized to form a silicon oxide film 46 about 50 nm thick. The entire surface of the silicon semiconductor substrate 31 including the silicon oxide film 36 is coated with a photoresist, and this photoresist is processed by photolithography to form a resist mask 61 having a shape by which a predetermined portion of the silicon oxide film 36 corresponding to an upper portion of only the trench 34a is exposed.

Subsequently, the resist mask 61 is used as a mask to dry-etch the silicon oxide film 36 to form a trench 38 in the silicon oxide film 36. More specifically, this trench 38 is formed in the silicon oxide film 36 to have a predetermined depth, about 0.2 $\mu$m in this modification, by which the trench 38 does not reach the surface (of the trench 34a) of the silicon semiconductor substrate 31, and a predetermined width narrower than the trench 34a.

Figure 6C:
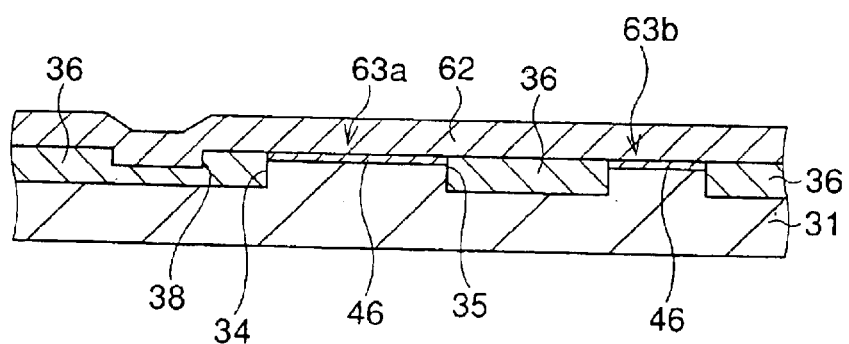

Next, as shown in FIG. 6C, after the resist mask 61 is removed by ashing or the like, an undoped polysilicon film 62 having a film thickness, about 0.4 to 1.0 $\mu$m in this modification, greater than the depth of the trench 38, is deposited on the silicon oxide films 36 and 46 by CVD. Consequently, the trench 38 is buiied with this polysilicon film 62. Thereafter, an n-type impurity, phosphorus (P) in this modification, is doped into the polysilicon film 62.

Figure 6D:
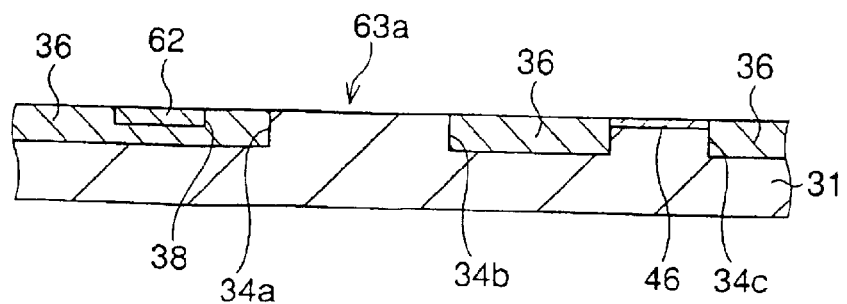

As shown in FIG. 6D, the silicon semiconductor substrate 31 in the element region 63a is used as a stopper to polish the polysilicon film 62 by, e.g., chemical-mechanical polishing (CMP), thereby planarizing the surface. Since the surface is planarized, the trench 38 is filled with the silicon oxide film 62, and this silicon oxide film 62 in the trench 38 functions as a control gate.

Subsequently, the exposed surfaces of the silicon semiconductor substrate 31 and the polysilicon film 62 are thermally oxidized to form a cap insulating film (not shown) about 10 to 20 nm thick for ion implantation.

To adjust the threshold value of a transistor serving as a memory cell, boron (B) is ion-implanted at a dose of $1\times10^{12}$ (1/cm$^2$) into the entire surface (not shown).

Thereafter, as in the second embodiment, the steps shown in FIGS. 5F to 5I are sequentially performed. That is, a floating gate 20 having a predetermined shape is formed by patterning to extend from the polysilicon film 62 in the trench 34 via the oxide film 18 to the element region 63b via the tunnel oxide film 19, and an insulating interlayer and a contact hole are also formed. Finally, interconnecting layers for connection and the like are formed to complete the EEPROM of the modification of the second embodiment.

In the EEPROM of the modification of the second embodiment, in the element region 63b, the floating gate 20 is formed on the channel, which is formed in the silicon semiconductor substrate 31 between the impurity diffusion layers 21 and 22 serving as a source and a drain, via the tunnel oxide film 19. On the silicon oxide film 36, with which the trench 34 is filled, the floating gate 20 opposes the polysilicon film 62 as a control gate via the oxide film 18 and is capacitively coupled with this polysilicon film 62 by using the oxide film 18 as a dielectric film.

To erase data, for example, the source and drain (impurity diffusion layers) 21 and 22 are set at 0 (V), and a predetermined voltage of about 20 (V) is applied to the control gate (polysilicon film) 62. Since this voltage of the control gate 62 is also applied to the floating gate 20 at the capacitive coupling ratio of the oxide film 18 to the tunnel oxide film 19, electrons are injected from the silicon semiconductor substrate 31 through the tunnel oxide film 19. Consequently, the threshold value of the transistor including the tunnel oxide film 19 rises to set the EEPROM in an erase state. The control gate 62 is well insulated from the silicon semiconductor substrate 31 by the silicon oxide film 36 in the trench 34. Therefore, even when a voltage of up to, e.g., 30 (V) is applied to the control gate 62, no breakdown to the silicon semiconductor substrate 31 takes place.

Accordingly, the modification of the second embodiment realizes a reliable EEPROM which is a single-layer gate semiconductor device by which a low-cost process is possible, has the control gate 62 which can well withstand a high voltage applied when data is erased or written, and can prevent an operation error and can also shorten the erase time.

Note that in this modification, as in the second embodiment, the floating gate 20 is formed into an island pattern made of a single polysilicon film. However, this floating gate may be formed by simultaneously forming two polysilicon film patterns on the polysilicon film 62 via the oxide film 18 and in the element region 63b and electrically connecting these patterns through a contact hole or the like in a later step.

Third Embodiment

Figure 7:
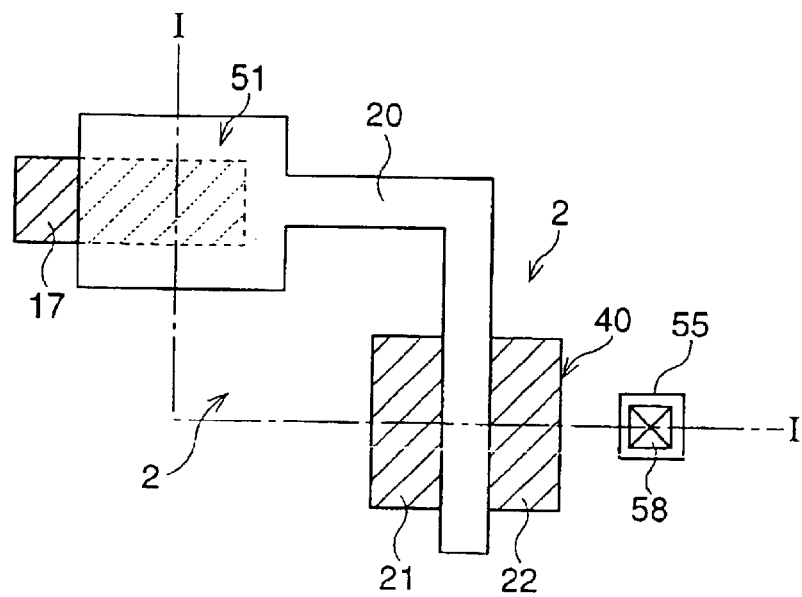
FIG. 7 is a schematic plan view showing an EEPROM according to the third embodiment of the present invention.

The third embodiment of the present invention will be described below. In this third embodiment, the structure and the fabrication method of an EEPROM will be explained as in the first embodiment. However, the third embodiment differs from the first embodiment in that a SIMOX method is used. FIG. 7 is a schematic plan view showing this EEPROM. FIGS. 8A to 8H are schematic sectional views, taken along an alternate long and short dashed line I—I in FIG. 7, showing the fabrication method of the EEPROM in order of steps. Note that the same reference numerals as in the EEPROM of the first embodiment denote the same parts in the third embodiment, and a detailed description thereof will be omitted.

Figure 8A:
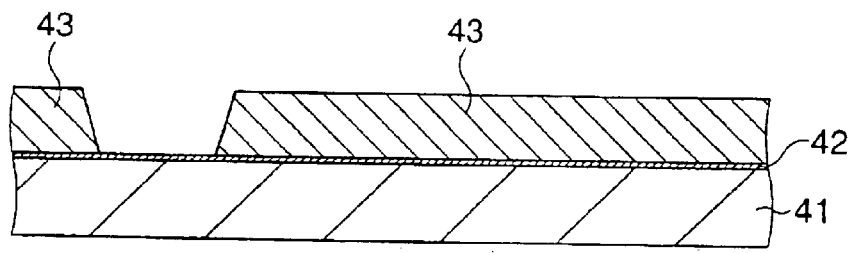
FIGS. 8A to 8H are schematic sectional views showing a method of fabricating the EEPROM according to the third embodiment of the present invention in order of steps.

First, as shown in FIG. 8A, a silicon oxide film 43 about 1.5 to 2.0 $\mu$m thick is deposited by CVD on a p-type single-crystal silicon semiconductor substrate 41 via a silicon oxide film 42 about 100 nm thick. Photolithography and dry etching are sequentially performed on this silicon oxide film 43 to expose a predetermined portion of the silicon oxide film 42.

Figure 8B:
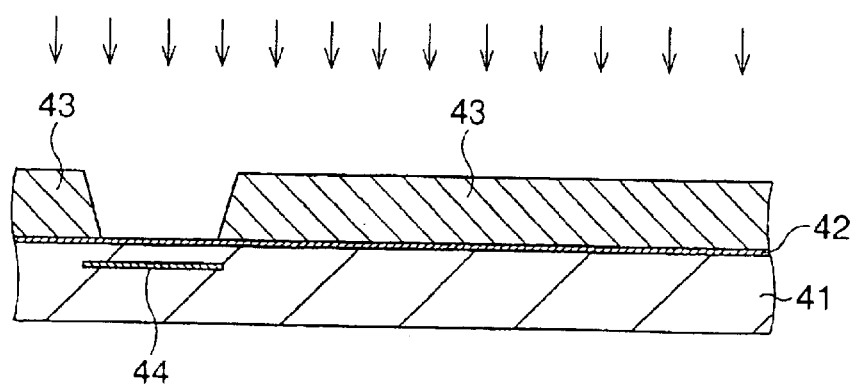

Next, as shown in FIG. 8B, oxygen is ion-implanted into the entire surface at a dose of 0.1 to $2.4\times10^{18}$ (1/cm$^2$) and an acceleration energy of 180 (keV). Consequently, the oxygen ions are implanted to a predetermined depth of the silicon semiconductor substrate 41 through the silicon oxide film 42. Subsequently, the silicon semiconductor substrate 41 is annealed at a temperature of 1,100° C. to 1,250° C. for 2 to 6 hrs to form a buried oxide film 44 corresponding to the pattern of the silicon oxide film 43.

Figure 8C:
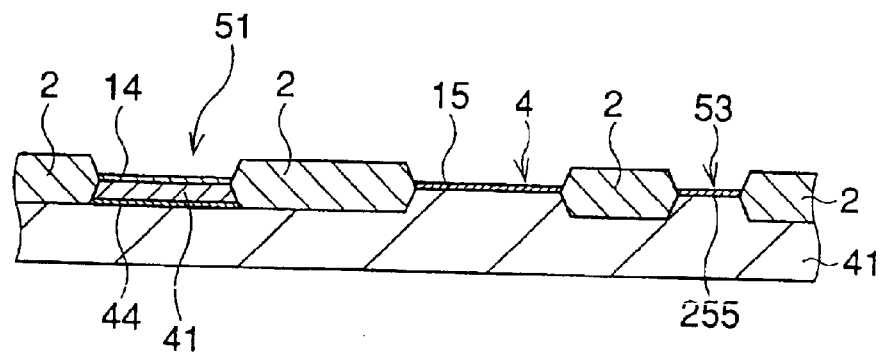

As shown in FIG. 8C, after the silicon oxide films 42 and 43 are removed by wet etching using an HF solution, the silicon oxide film 41 is selectively oxidized by so-called LOGOS to form a field oxide film 2 about 100 nm thick as an element isolation structure, thereby defining element regions 4, 51, and 53 on the silicon semiconductor substrate 41. The element region 51 is an island region formed as follows. That is, since the field oxide film 2 is formed, end portions of the buried oxide film 44 are connected to the field oxide film 2. The field oxide film 2 and buried oxide film 44 electrically isolate a portion of the silicon semiconductor substrate 41 from the rest of the silicon semiconductor substrate 41, thereby forming the element region 51.

Subsequently, the surface of the silicon semiconductor substrate 41 in the element regions 4, 51, and 53 are thermally oxidized to form cap insulating films 14, 15, and 255 about 10 to 20 nm thick for ion implantation (to be described later).

Figure 8D:
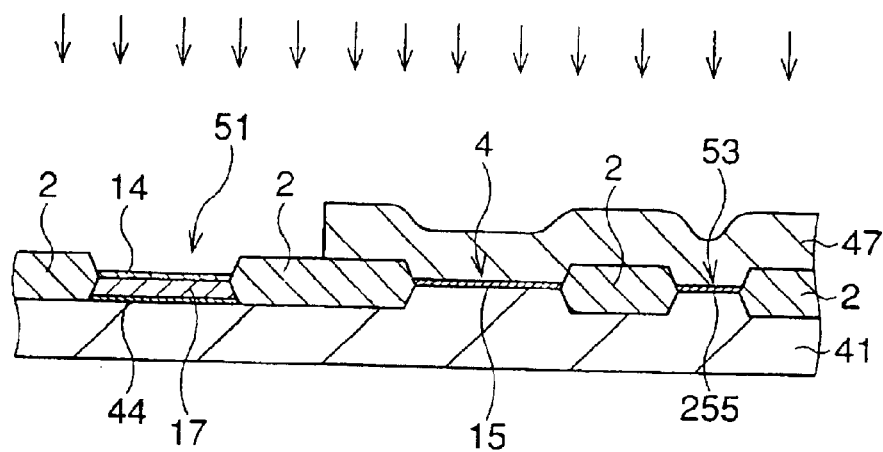

Next, as shown in FIG. 8D, the entire surface is coated with a photoresist 47, and the photoresist 47 is processed by photolithography into a shape by which only the element regions 4 and 53 are covered. This photoresist 47 is used as a mask to ion-implant an n-type impurity, arsenic (As) or phosphorus (P) in this embodiment, at a dose of 1 to $2\times10^{15}$ ($1/cm^2$) and an acceleration energy of 30 (keV). Consequently, the n-type impurity is ion-implanted into the silicon semiconductor substrate 41 in the element region, 51 through the cap insulating film 14. After the photoresist 47 is removed by ashing or the like and the resultant structure is cleaned, the silicon semiconductor substrate 41 is annealed to form an impurity diffusion layer 17 functioning as a control gate.

Figure 8E:
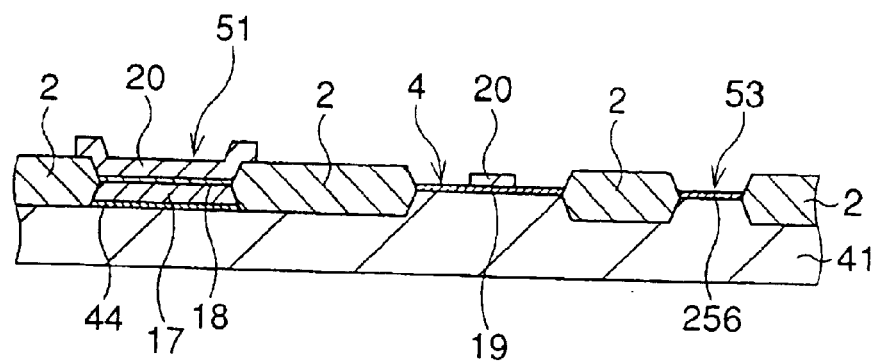

As shown in FIG. 8E, the surface of the silicon semiconductor substrate 41 in the element regions 4 and 51 is again thermally oxidized to form oxide films 18 and 256 about 15 to 20 nm thick on the surface of the silicon semiconductor substrate 41 in the element regions 51 and 53 and to form a tunnel oxide film 19 about 8 to 12 nm thick on the surface of the silicon semiconductor substrate 41 in the element region 4.

Figure 8F:
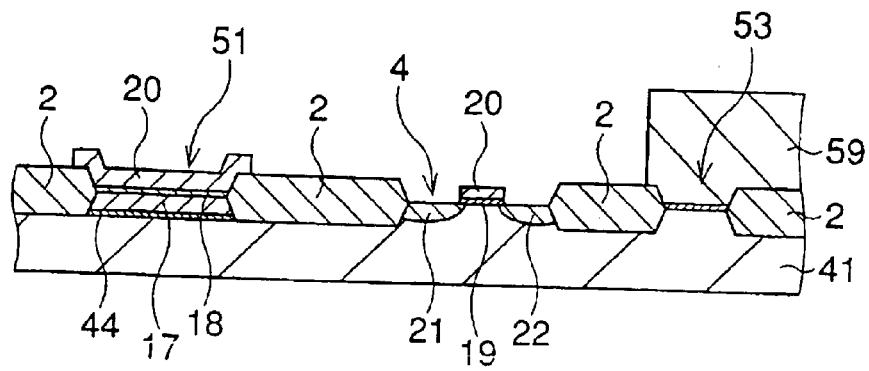

As shown in FIG. 8F, an undoped polysilicon film is deposited by CVD on the entire surface including the element regions 4 and 51, and an n-type impurity, phosphorus (P) in this embodiment, is doped into this polysilicon film.

Subsequently, photolithography and dry etching are sequentially performed for the polysilicon film to form an island-pattern floating gate 20 made of the polysilicon film and extending from the element region 4 to the element region 51. More specifically, as shown in FIG. 7, in the element region 51, the floating gate 20 is formed to extend over the adjacent field oxide film 2 and cover the element region 51 via the oxide film 18. In the element region 4, the floating gate 20 is formed into the form of a belt having a predetermined width via the tunnel oxide film 19.

After a resist mask 59 is formed by photolithography to cover the element region 53, an n-type impurity, arsenic (As) in this embodiment, is ion-implanted at a dose of 1 to $2\times10^{15}$ ($1/cm^2$) and an acceleration energy of 30 (keV). Consequently, the arsenic is ion-implanted through the tunnel oxide film 19 into the silicon semiconductor substrate 41 on the two sides of the floating gate 20 in the element region 4.

Figure 8G:
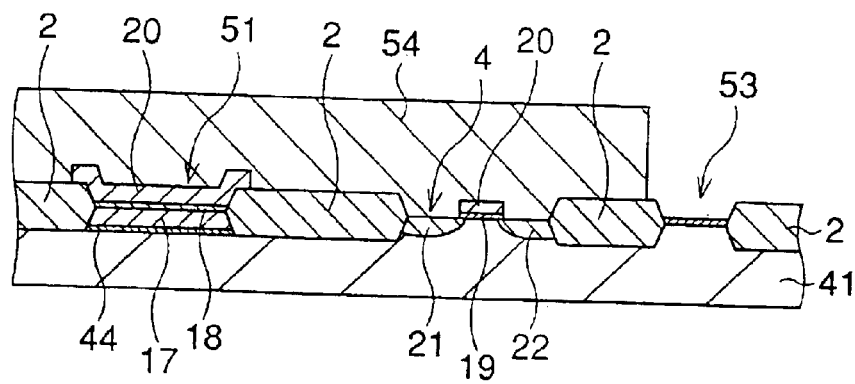

Next, as shown in FIG. 8G, the resist mask 59 is removed, and a resist mask 54 covering the entire surface except the element region 53 is formed. A p-type impurity, boron (B) in this embodiment, is ion-implanted into the entire surface at a dose of 3 to $5\times10^{15}$ ($1/cm^2$) and an acceleration energy of 30 (keV). The silicon semiconductor substrate 41 is then annealed to form a pair of impurity diffusion layers 21 and 22 serving as a source and a drain in the element region 4 and a p-type impurity diffusion layer 55 in the element region 53.

Figure 8H:
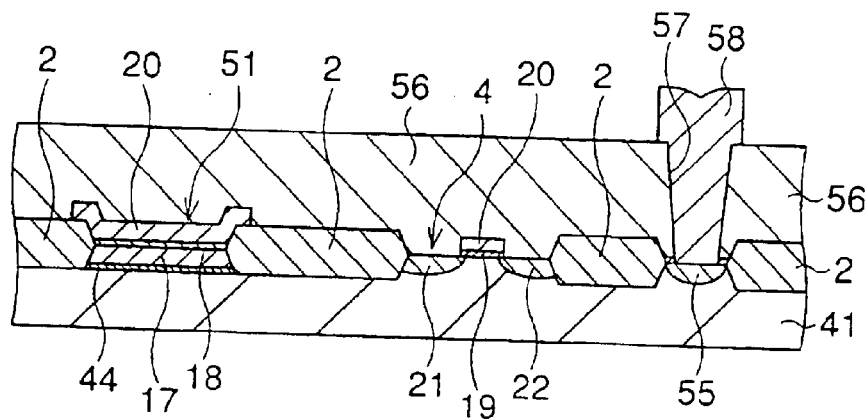

Thereafter, as shown in FIG. 8H, an insulating interlayer 56 is formed, and a contact hole 57 for exposing the p-type impurity diffusion layer 55 is formed. An aluminum electrode 58 burying the contact hole 197 and connected to the p-type impurity diffusion layer 55 is formed by sputtering.

Finally, interconnecting layers for connection and the like are formed to complete the EEPROM of the third embodiment.

In the element region 4 of the EEPROM of the third embodiment, the floating gate 20 is formed on the channel, which is formed in the silicon semiconductor substrate 41 between the impurity diffusion layers 21 and 22 serving as a source and a drain, via the tunnel oxide film 19. In the element region 51, the floating gate 20 opposes the impurity diffusion layer 17 as a control gate via the oxide film 18 and is capacitively coupled with this impurity diffusion layer 17 by using the oxide film 18 as a dielectric film.

To erase data, for example, the source and drain (impurity diffusion layers) 21 and 22 are set at 0 (V), and a predetermined voltage of about 20 (V) is applied to the control gate (impurity diffusion layer) 17. Since this voltage of the control gate 17 is also applied to the floating gate 20 at the capacitive coupling ratio of the oxide film 18 to the tunnel oxide film 19, electrons are injected from the silicon semiconductor substrate 41 through the tunnel oxide film 19. Consequently, the threshold value of the transistor including the tunnel oxide film 19 rises to set the EEPROM in an erase state. The control gate 17 is well insulated from the silicon semiconductor substrate 41 by the buried oxide film 44 and the field oxide film 2 formed on the two sides of the buried oxide film 44. Therefore, even when a voltage of up to, e.g., 30 (V) is applied to the control gate 17, no breakdown to the silicon semiconductor substrate 41 takes place.

Additionally, in the third embodiment, the p-type impurity diffusion layer 55 is formed in the element region 53 formed adjacent to the element isolation region 4, in which the source and the drain of the EEPROM are formed, via the field oxide film 2. Since a predetermined substrate potential can be applied to this p-type impurity diffusion layer 55 via the aluminum electrode 57, it is possible to minimize variations in the threshold value of the EEPROM and stably perform write and read operations.

Accordingly, the third embodiment realizes a reliable EEPROM which is a single-layer gate semiconductor device by which a low-cost process is possible, has the control gate 17 which can well withstand a high voltage applied when data is erased or written, and can prevent an operation error and can also shorten the erase time.

Note that in the third embodiment, the floating gate 20 is formed into an island pattern made of a single polysilicon film. However, the floating gate may be formed by simultaneously forming two polysilicon film patterns in the element regions 4 and 51 and electrically connecting these patterns through a contact hole or the like in a later step.

Note also that the buried oxide film 44 may be previously formed in the element region 4. If this is the case, this buried oxide film 44 can be connected to the field oxide film 2 formed in a later step to form the element region 4 as an island region electrically isolated from the silicon semiconductor substrate 41.

Fourth Embodiment

Figure 9:
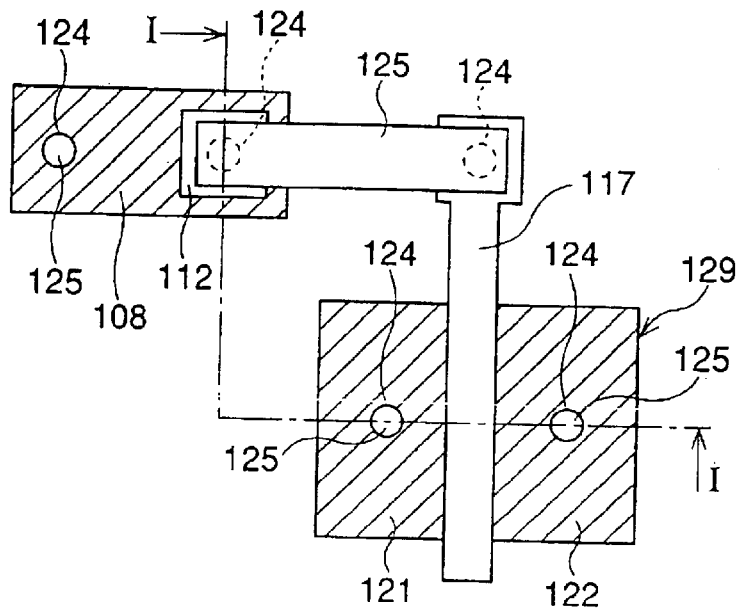
FIG. 9 is a schematic plan view showing an EEPROM according to the fourth embodiment of the present invention.

The fourth embodiment of the present invention will be described below. In this fourth embodiment, an EEPROM as a nonvolatile semiconductor memory will be exemplified as a semiconductor device. The fourth embodiment differs from the first to third embodiments in that a field-shield element isolation structure is used as an element isolation structure and a shield plate electrode is formed together with a floating gate electrode. FIG. 9 is a schematic plan view showing this EEPROM. FIGS. 10A to 10N and 10P to 10Q are schematic sectional views, taken along an alternate long and short dashed line I—I in FIG. 9, showing a method of fabricating the EEPROM in order of steps.

Figure 10A:
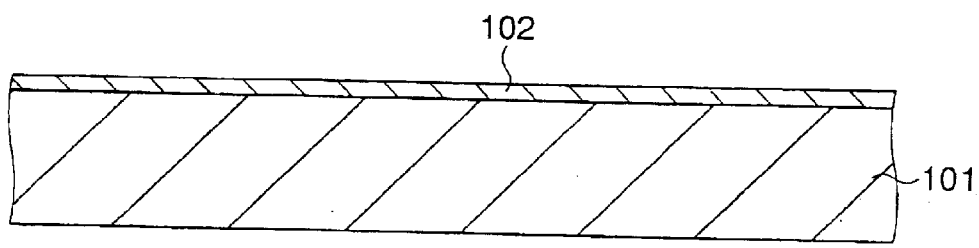
FIGS. 10A to 10N and 10P to 10Q are schematic sectional views showing a method of fabricating the EEPROM according to the fourth embodiment of the present invention in order of steps.
Figure 10B:
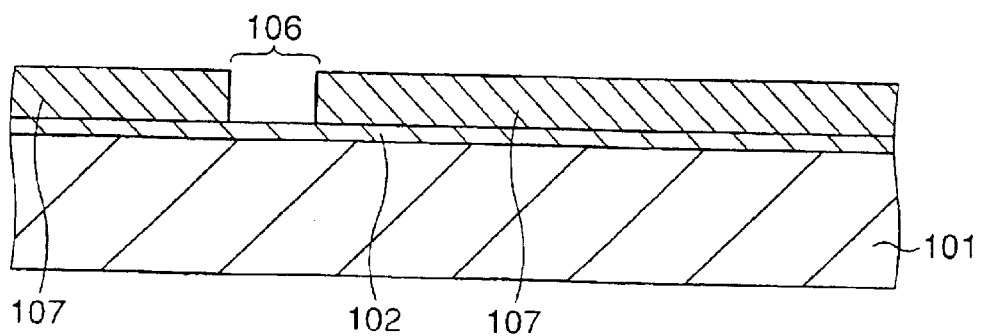

First, as shown in FIG. 10A, the surface of a p-type silicon semiconductor substrate 101 is thermally oxidized to form a thermal oxide film 102. As shown in FIG. 10B, a resist 107 having a hole 106 is formed on this thermal oxide film 102 by normal photolithography.

Figure 10C:
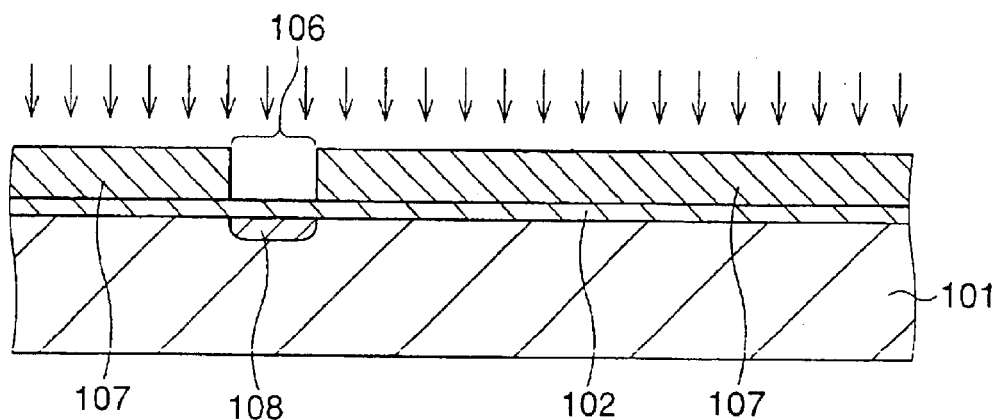

Next, as shown in FIG. 10C, arsenic (As) as an n-type impurity is ion-implanted at a dose of about $2.0 \times 10^{15}/cm^2$ and an acceleration energy of about 100 keV to form an n-type impurity diffusion layer 108 in the hole 106.

Figure 10D:
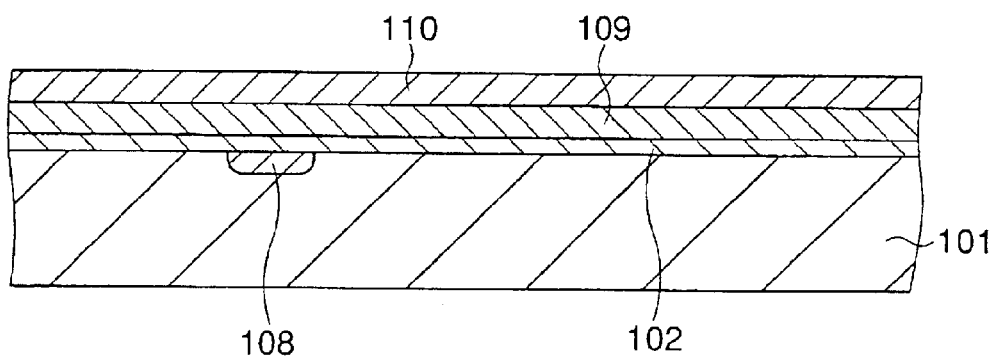

As shown in FIG. 10D, after the resist 107 is removed, phosphorus (P) is doped by low-pressure CVD to form a phosphorus (P)-doped polysilicon film 109 about 0.1 to 0.3 $\mu$m thick. Subsequently, a silicon oxide film 110 about 0.1 to 0.3 $\mu$m thick is formed on the phosphorus (P)-doped polysilicon film 109 by low-pressure CVD.

Figure 10E:
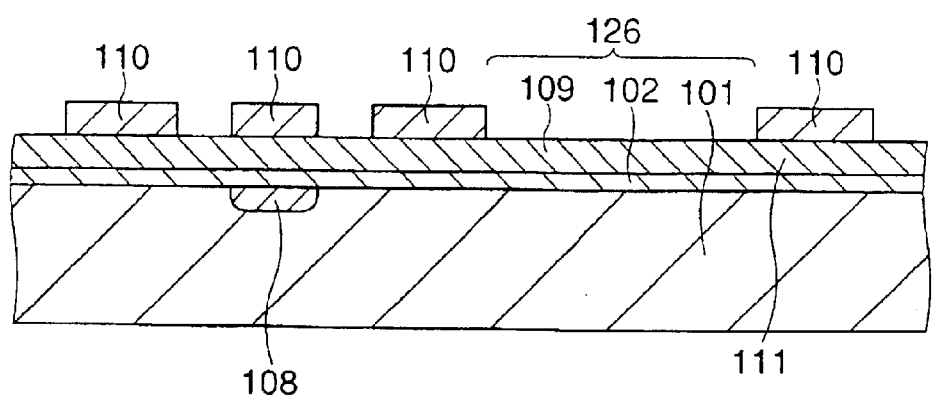

Next, as shown in FIG. 10E, photolithography and dry etching are sequentially performed to selectively remove the silicon oxide film 110 and expose the underlying phosphorus (P)-doped polysilicon film 109. More specifically, the silicon oxide film 110 is selectively removed so that the silicon oxide film 110 remains above the impurity diffusion layer 108 and a hole 126 from which the silicon oxide film 109 is to be removed over a broad range is formed.

Figure 10F:
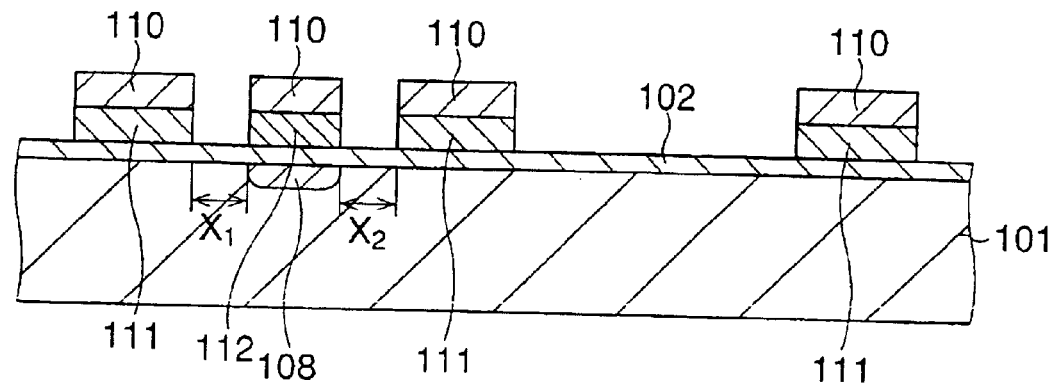

As shown in FIG. 10F, the silicon oxide film 110 is used as a mask to etch away the polysilicon film 111 and expose the underlying thermal oxide film 102. Consequently, the phosphorus (P)-doped polysilicon film 109 is divided in accordance with the shape of the silicon oxide film 110 to form a shield plate electrode 111. At the same time, a floating gate electrode 112 is formed on the impurity diffusion layer 108 at a predetermined distance from the shield plate electrode 111.

Since the floating gate electrode 112 can be formed simultaneously with the formation of the shield plate electrode 111 as described above, the fabrication process can be shortened.

This floating gate electrode 112 is capacitively coupled with the impurity diffusion layer 108 via the thermal oxide film 102.

It is generally known that the breakdown voltage of a p-n junction, such as the junction between the n-type impurity diffusion layer 108 and the p-type silicon semiconductor substrate 101, lowers as the p-type impurity concentration increases and rises as the n-type impurity concentration increases.

When element isolation is performed by so-called LOCOS, however, the positional accuracy of the element isolation end is limited because a field oxide film is formed by thermal oxidation in LOCOS. Additionally, if a channel stopper layer is formed below the field oxide film, the p-type impurity concentration in a p-type silicon semiconductor substrate is increased. It is not easy to accurately hold the position of this channel stopper layer, either.

Accordingly, when a field oxide film is to be formed near the impurity diffusion layer 108 by LOCOS, the p-type impurity concentration in the p-type silicon semiconductor substrate 101 in the vicinity of the interface of the impurity diffusion layer 108 rises under the influence of the channel stopper layer. Consequently, the breakdown voltage described above sometimes decreases.

In this fourth embodiment, however, the shield plate electrode 111 is formed by patterning as described above, and a field-shield element isolation structure in which this shield plate electrode 111 is buried is formed. Accordingly, the shield plate electrode 111 can be formed with high positional accuracy.

As shown in FIG. 10F, therefore, the impurity diffusion layer 108 and the shield plate electrode 111 can be formed to be accurately separated by predetermined distances ($X_1$ and $X_2$). By applying a predetermined voltage to the shield plate electrode 111 to fix the potential of the p-type silicon semiconductor substrate 101, it is possible to prevent an increase in the p-type impurity concentration in the p-type silicon semiconductor substrate 101 near the impurity diffusion layer 108.

It is also possible to change the potential in the surface region of the p-type silicon semiconductor substrate 101 to an arbitrary value by applying a specific voltage to the shield plate electrode 111. Accordingly, when a high voltage is applied to the impurity diffusion layer 108 which is capacitively coupled with the floating gate electrode 112 via the thermal oxide film 102, the breakdown voltage in the junction between the impurity diffusion layer 108 and the p-type silicon semiconductor substrate 101 can be further increased by applying an optimum voltage to the shield plate electrode 111.

Figure 10G:
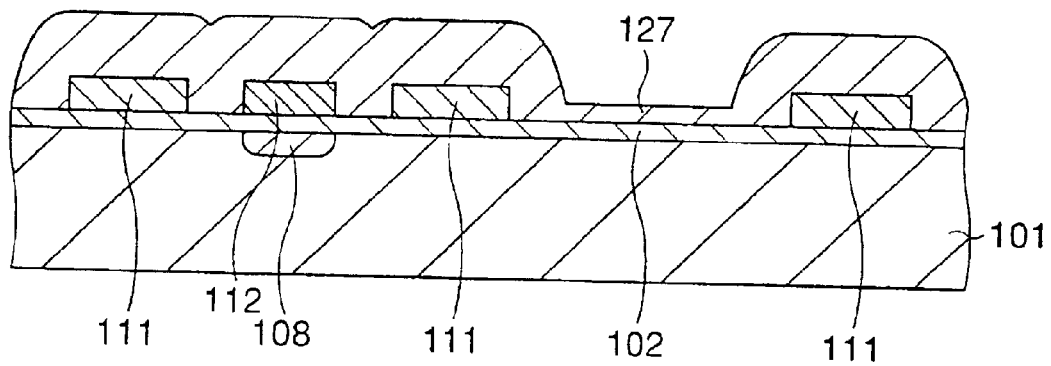

Next, as shown in FIG. 10G, a silicon oxide film 113 about 0.3 to 0.5 $\mu$m thick is formed on the entire surface by low-pressure CVD. Consequently, the gaps between the shield plate electrode 111 and the floating gate electrode 112 are completely buried. Also, the side surfaces of the shield plate electrode 111 exposed in the hole 126 shown in FIG. 10E are covered, and the shield plate electrode 111 and the floating gate electrode 112 are buried under a silicon oxide film 127 formed by integrating the thermal oxide film 102, the silicon oxide film 110, and the silicon oxide film 113.

Figure 10H:
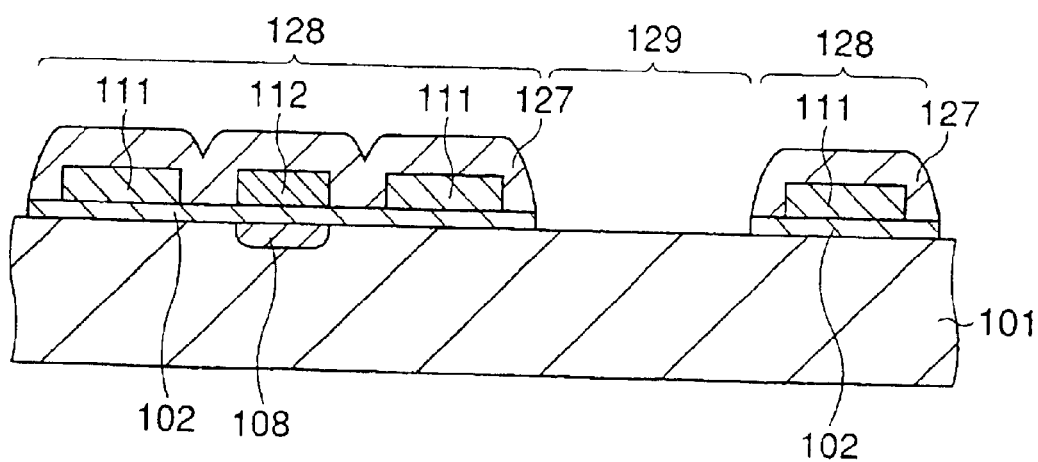

Next, as shown in FIG. 10H, the silicon oxide film 127 is etched away until the p-type silicon semiconductor substrate 101 is exposed, thereby forming an element formation region 129 defined by a field-shield element isolation structure 128.

The distance between the floating gate electrode 112 and the adjacent shieid plate electrode 111 is previously controlled so that the silicon oxide film 127 between these electrodes is not removed to expose the p-type silicon semiconductor substrate 101 during the etching.

Figure 10I:
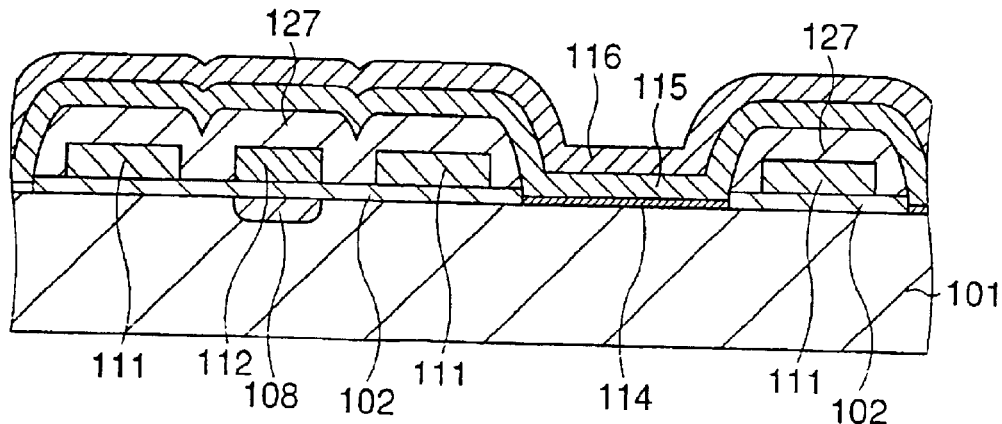

Next, the surface of the p-type silicon semiconductor substrate 101 in the element formation region 129 is thermally oxidized to form a tunnel oxide film 114 about 8 to 10 nm thick. Phosphorus (P) is doped into the entire surface including the element formation region 129 by low-pressure CVD to form a 0.2- to 0.4-$\mu$m thick phosphorus (P)-doped polysilicon film 115. Subsequently, a silicon oxide film 116 about 0.2 to 0.4 $\mu$m thick is formed by low-pressure CVD. This state is shown in FIG. 10I.

Figure 10J:
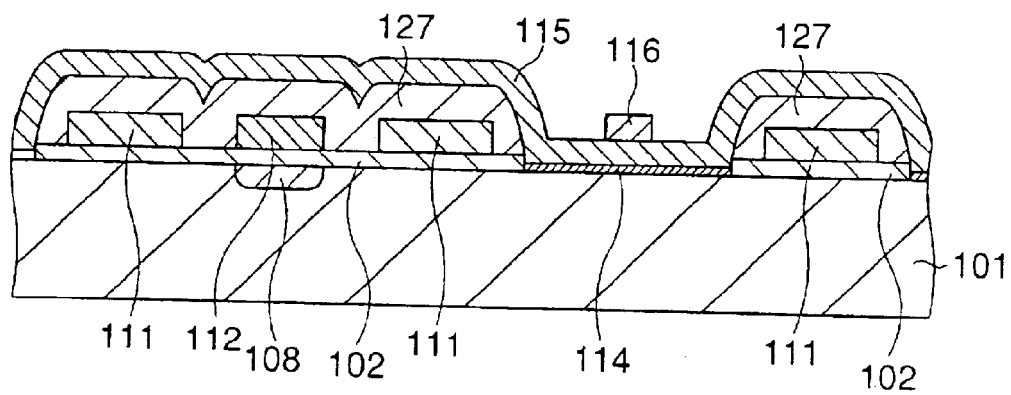

As shown in FIG. 10J, photolithography and dry etching are sequentially performed to selectively remove the silicon oxide film 116. This patterned silicon oxide film 116 is used as a mask to perform dry etching to remove the phosphorus (P)-doped polysilicon film 115.

Figure 10K:
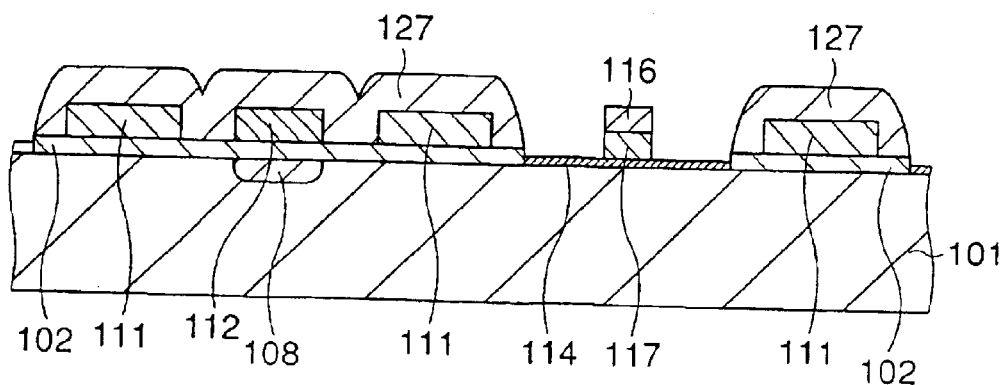

Consequently, a floating gate electrode 117 as shown in FIG. 10K is formed. As shown in the plan view of FIG. 9, this floating gate electrode 117 is so formed as to divide the element isolation region 129. The end portion of the floating gate electrode 117 reaches the vicinity of the floating gate electrode 112 which is capacitively coupled with the impurity diffusion layer 108.

Figure 10L:
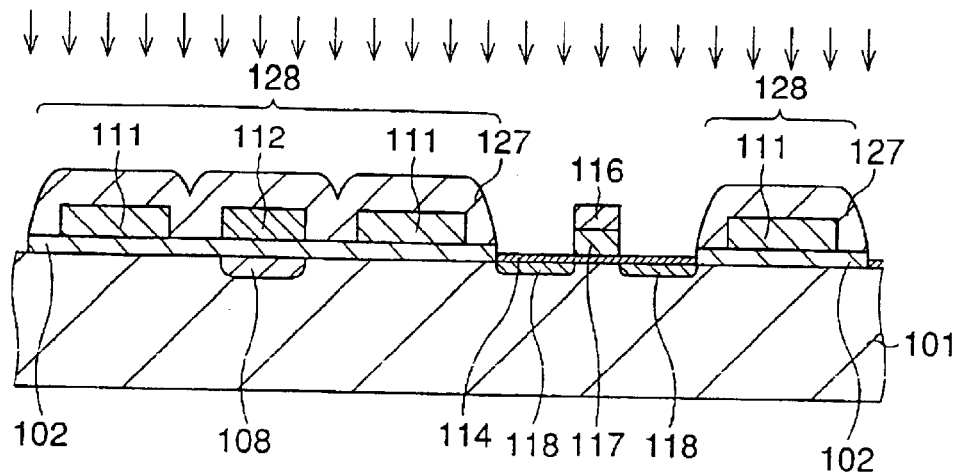

Next, as shown in FIG. 10L, the silicon oxide film 116 and the field-shield element isolation structure 128 are used as masks to ion-implant phosphorus as an n-type impurity at a dose of about $1\times10^{13}$ to $3\times10^{13}$/cm$^2$ and an acceleration energy of about 30 to 50 keV, thereby forming a lightly doped impurity diffusion layer 118.

Figure 10M:
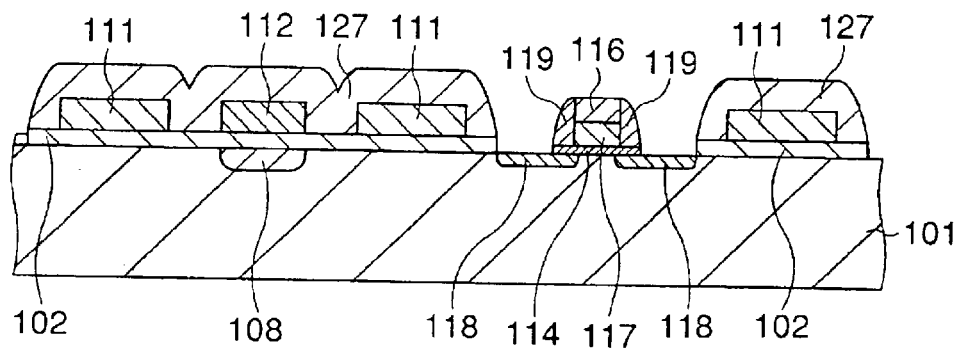

As shown in FIG. 10M, a silicon oxide film is formed on the entire surface and anisotropically etched to form side walls 119 covering the side surfaces of the floating gate electrode 117 and the silicon oxide film 116.

Figure 10N:
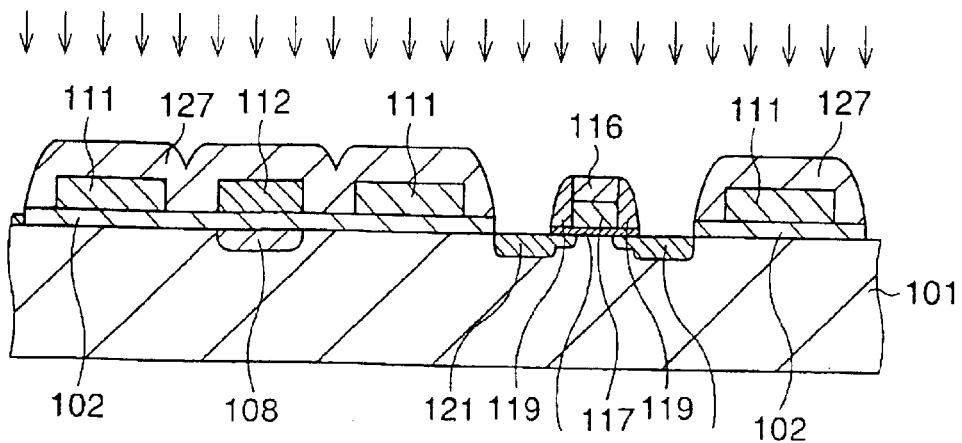

As shown in FIG. 10N, the side walls 119, the silicon oxide film 116, and the field-shield element isolation structure 128 are used as masks to ion-implant arsenic (As) as an n-type impurity at a dose of about $1.0\times10^{15}$/cm$^2$ and an acceleration energy of about 30 keV, thereby forming a heavily doped impurity diffusion layer. Thereafter, annealing is performed at a temperature of about 900° C. to form a source layer 121 and a drain layer 122 of a memory cell transistor.

Figure 10P:
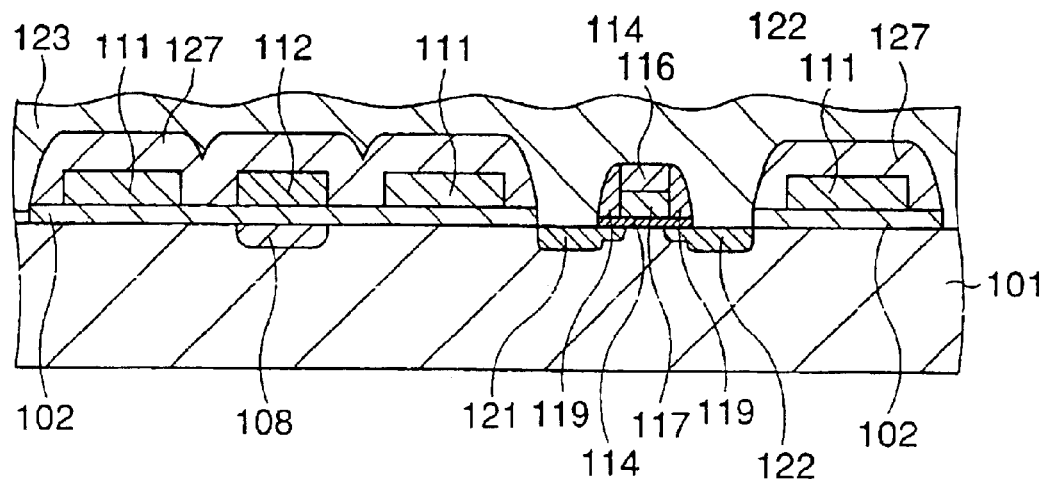

Next, as shown in FIG. 10P, a BPSG film 123 as an insulating interlayer is formed on the entire surface, and reflow is performed to planarize the surface. A contact hole 124 is then formed to expose the floating gate electrodes 112 and 117, the impurity diffusion layer 108, the source layer 121, and the drain layer 122.

Figure 10Q:
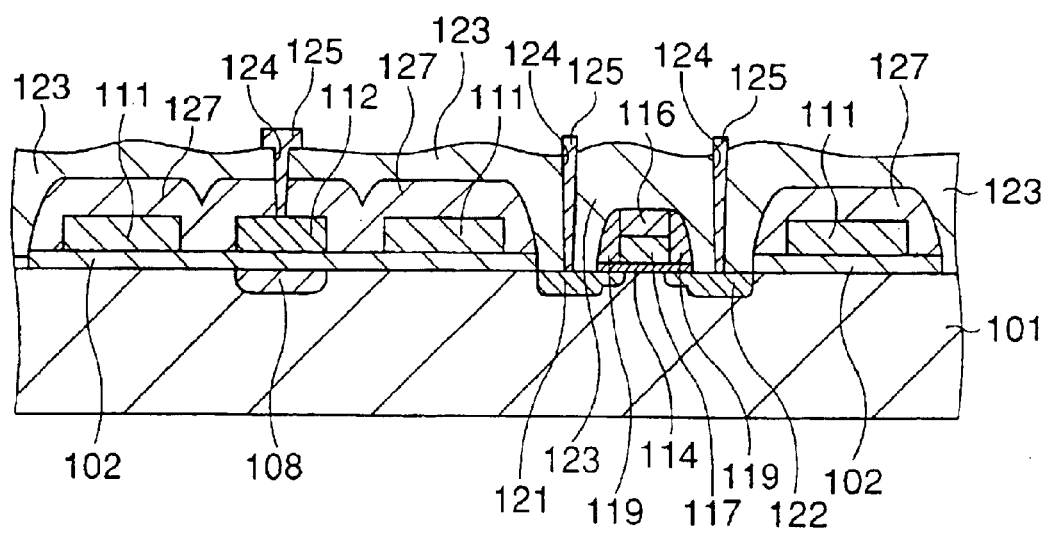

As shown in FIG. 10Q, an aluminum interconnecting layer 125 is formed by sputtering and patterned to electrically connect the floating gate electrodes 112 and 117, forming an integrated floating gate electrode. Finally, interconnections connecting to the impurity diffusion layer 108, the source layer 121, and the drain layer 122 are formed to complete the EEPROM as shown in FIGS. 9 and 10Q.

Note that the floating gate electrodes 112 and 117 may be connected without forming the aluminum interconnecting layer 125 on these electrodes. That is, before the phosphorus (P)-doped polysilicon film 115 is formed in the step shown in FIG. 10I, a hole for exposing the floating gate electrode 112 is formed in the silicon oxide film 127. This hole is filled to allow connection of the two electrodes when the phosphorus (P)-doped polysilicon film 115 is formed.

The floating gate electrodes 112 and 117 can be integrated by patterning the phosphorus (P)-doped polysilicon film 115 in the step shown in FIG. 10K.

In the EEPROM of the fourth embodiment, the impurity diffusion layer 108 as a control gate and the shield plate electrode 111 are separated by predetermined distances ($X_1$ and $X_2$). Therefore, by applying a predetermined voltage to the shield plate electrode 111, it is possible to prevent an increase in the p-type impurity concentration in the p-type silicon semiconductor substrate 101 near the impurity diffusion layer 108.

The breakdown voltage of such a p-n junction lowers with an increase in a p-type impurity concentration, in this embodiment, the p-type impurity concentration in the p-type silicon semiconductor substrate 101. Accordingly, the dielectric breakdown voltage in this junction can be raised by preventing an increase in the p-type impurity concentration.

Additionally, since the shield plate electrode 111 and the floating gate electrode 112 can be simultaneously formed in the same etching step, no special step is required to deposit a polysilicon film for gate formation. Consequently, the floating gate electrode 112 can be formed without complicating the fabrication process.

To erase data, for example, the source and drain (impurity diffusion layers) 121 and 122 are set at 0 (V), and a predetermined voltage of about 20 (V) is applied to the impurity diffusion layer 108 as a control gate. Since this voltage of the impurity diffusion layer 108 is also applied to the floating gate electrode 117 at the capacitive coupling ratio of the oxide film 102 as a gate oxide film to the tunnel oxide film 114, electrons are injected from the p-type silicon semiconductor substrate 101 through the tunnel oxide film 114. Consequently, the threshold value of the transistor including the tunnel oxide film 114 rises to set the EEPROM in an erase state. Since the concentration of the p-type impurity in the p-type silicon semiconductor substrate 101 forming a junction with the impurity diffusion layer 108 is kept low, no breakdown occurs even when a high voltage is applied to the impurity diffusion layer 108.

Accordingly, the fourth embodiment realizes an EEPROM which is a single-layer gate semiconductor device by which a low-cost process is possible, has the impurity diffusion layer 108 as a control gate which can well withstand a high voltage applied when data is erased or written, can prevent an operation error and can also shorten the erase time, and improves the reliability and shortens the fabrication process.

Fifth Embodiment

Figure 11:
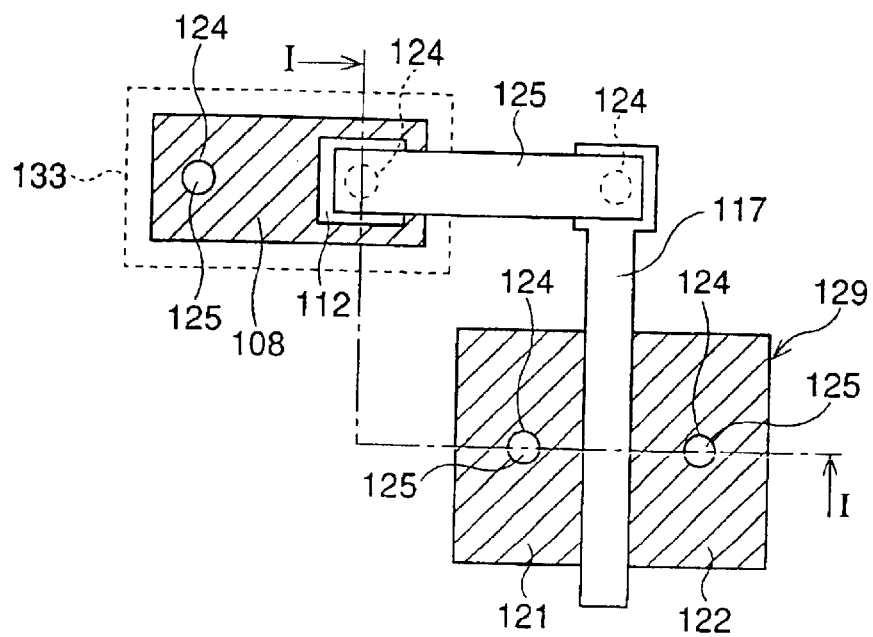
FIG. 11 is a schematic plan view showing an EEPROM according to the fifth embodiment of the present invention.

The fifth embodiment of the present invention will be described below. In this fifth embodiment, an EEPROM in which an element isolation region is formed by a field-shield element isolation structure as in the fourth embodiment will be exemplified. More specifically, the structure and the fabrication method of an EEPROM in which the dielectric breakdown voltage in the junction between the impurity diffusion layer 108 and the p-type silicon semiconductor substrate 101 in the fourth embodiment is further improved will be explained. FIG. 11 is a schematic plan view showing this EEPROM. FIGS. 12A to 12N and 12P to 12R are schematic sectional views, taken along an alternate long and short dashed line I—I in FIG. 11, showing the fabrication method of the EEPROM in order of steps performed. Note that the same reference numerals as in the EEPROM of the fourth embodiment denote the same parts in the fifth embodiment.

Figure 12A:
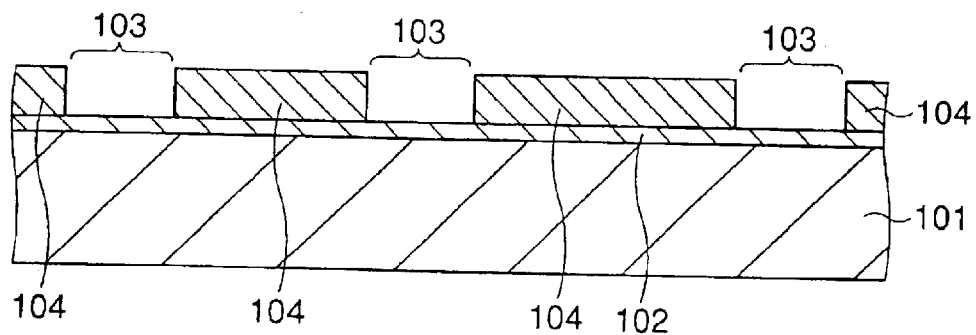
FIGS. 12A to 12N and 12P to 12R are schematic sectional views showing a method of fabricating the EEPROM according to the fifth embodiment of the present invention in order of steps.

First, as shown in FIG. 12A, the surface of a p-type silicon semiconductor substrate 101 is thermally oxidized to form a thermal oxide film 102. A resist 104 having a hole 103 is formed on this thermal oxide film 102 by normal photolithography.

Figure 12B:
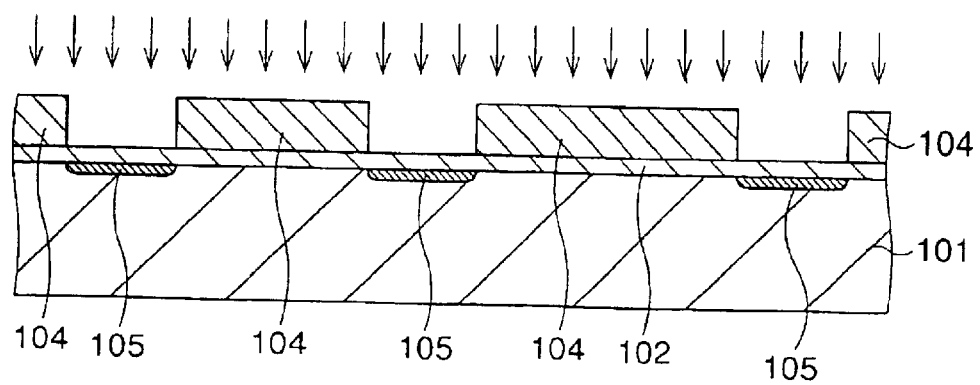

Next, as shown in FIG. 12B, the resist 104 is used as a mask to ion-implant boron (B) as a p-type impurity to form a channel stopper layer 105. This channel stopper layer 105 raises the threshold voltage of a field-shield element isolation structure to be formed above the channel stopper layer 105, preventing the formation of a parasitic device.

Figure 12C:
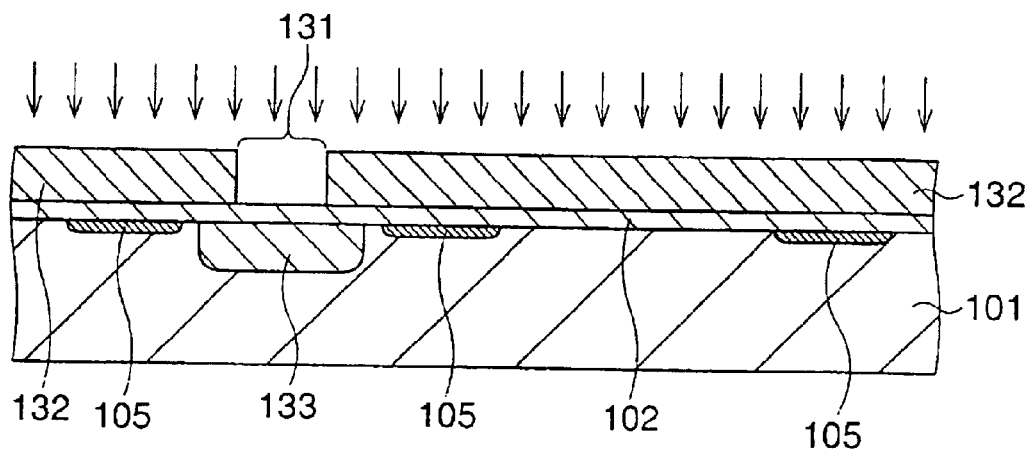

As shown in FIG. 12C, after the resist 104 is removed, a resist 132 having a hole 131 is formed. This resist 132 is used as a mask to ion-implant phosphorus (P) as an n-type impurity having a conductivity type opposite to that of the p-type silicon semiconductor substrate 101 at a dose of about $1.0\times10^{12}$ to $2.0\times10^{12}$/cm$^2$ and an acceleration energy of about 80 to 120 keV. Consequently, a diffusion layer 133 is formed in the hole 131.

Figure 12D:
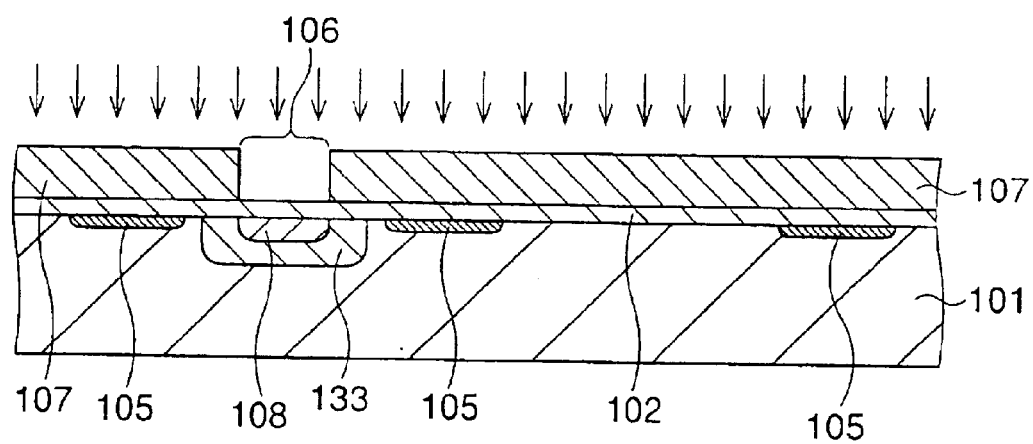

Next, as shown in FIG. 12D, after the resist 132 is removed, a resist 107 having a hole 106 as in the fourth embodiment is formed. The width of the hole 106 is made smaller than that of the hole 131 in the resist 132. The resist 107 is used as a mask to ion-implant arsenic (As) as an n-type impurity at a dose of about $2.0 \times 10^{15}/cm^2$ and an acceleration energy of about 100 keV. Consequently, an n-type impurity diffusion layer 108 thinner than the diffusion layer 133 is formed in the hole 106.

The diffusion layer 133 formed by the ion implantation of phosphorus (P) is an intrinsic diffusion layer having a lower impurity concentration than that in the p-type silicon semiconductor substrate 101. This diffusion layer is more insulated from the impurity diffusion layer 108 than the p-type silicon semiconductor substrate 101. Therefore, when a high voltage is applied to the impurity diffusion layer 108, the breakdown voltage in the junction between the impurity diffusion layer 108 and the diffusion layer 133 can be further increased.

Figure 12E:
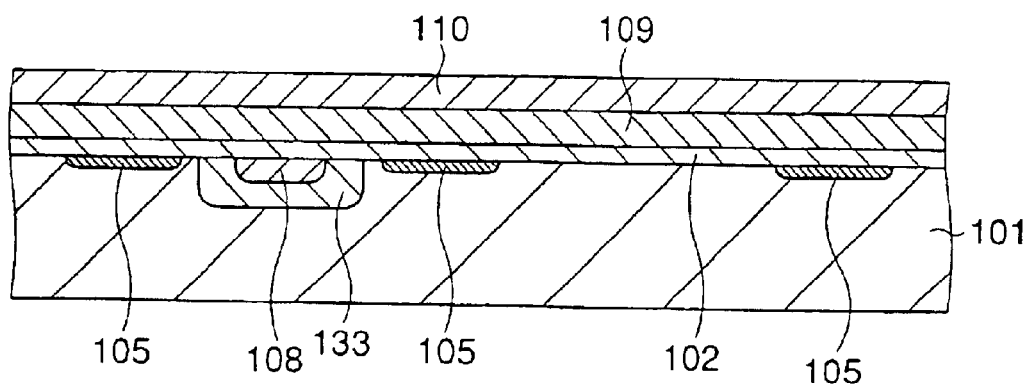

Next, as shown in FIG. 12E, after the resist 107 is removed, phosphorus (P) is doped by low-pressure CVD to form a phosphorus (P)-doped polysilicon film 109 about 0.1 to 0.3 μm thick. Subsequently, a silicon oxide film 110 about 0.1 to 0.3 μm thick is formed on the phosphorus (P)-doped polysilicon film 109 by low-pressure CVD.

Figure 12F:
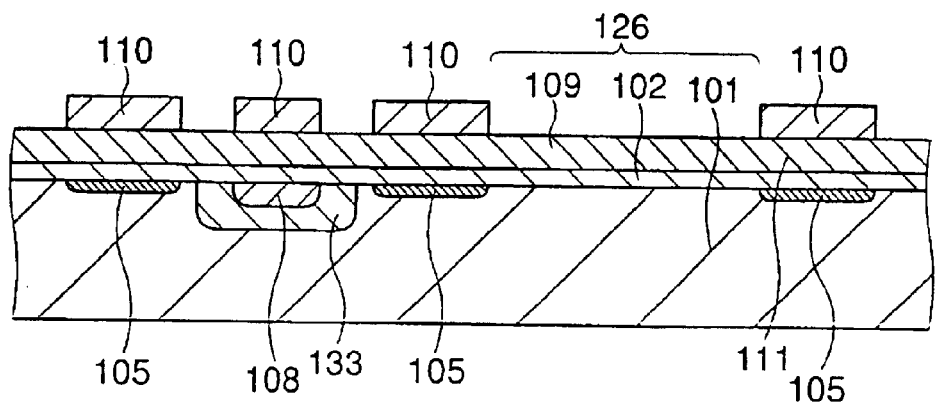

As shown in FIG. 12F, photolithography and dry etching are sequentially performed to selectively remove the silicon oxide film 110 and expose the underlying phosphorus (P)-doped polysilicon film 109. More specifically, the silicon oxide film 110 is selectively removed so that the silicon oxide film 110 remains above the impurity diffusion layer 108 and a hole 126 from which the silicon oxide film 109 is to be removed over a broad range is formed.

Figure 12G:
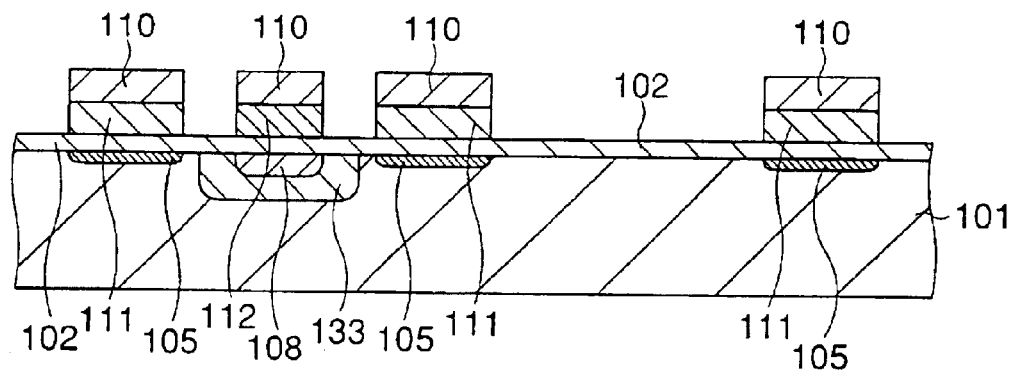

As shown in FIG. 12G, the silicon oxide film 110 is used as a mask to etch away the polysilicon film 111 and expose the underlying thermal oxide film 102. Consequently, the phosphorus (P)-doped polysilicon film 109 is divided in accordance with the shape of the silicon oxide film 110 to form a shield plate electrode 111 on the channel stopper layer 105. At the same time, a floating gate electrode 112 is formed on the impurity diffusion layer 108 at a predetermined distance from the shield plate electrode 111.

Since the floating gate electrode 112 can be formed simultaneously with the formation of the shield plate electrode 111 as described above, the fabrication process can be shortened.

This floating gate electrode 112 is capacitively coupled with the impurity diffusion layer 108 via the thermal oxide film 102.

Figure 12H:
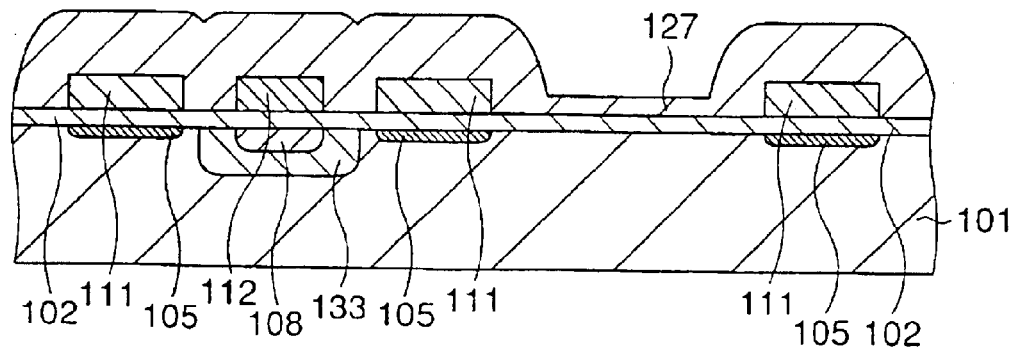

Next, as shown in FIG. 12H, a silicon oxide film 113 about 0.3 to 0.5 μm thick is formed on the entire surface by low-pressure CVD. Consequently, the gaps between the shield plate electrode 111 and the floating gate 112 are completely buried. Also, the side surfaces of the shield plate electrode 111 exposed in the hole 126 shown in FIG. 10E are covered, and the shield plate electrode 111 and the floating gate electrode 112 are buried under a silicon oxide film 127 formed by integrating the thermal oxide film 102, the silicon oxide film 110, and the silicon oxide film 113.

Figure 12I:
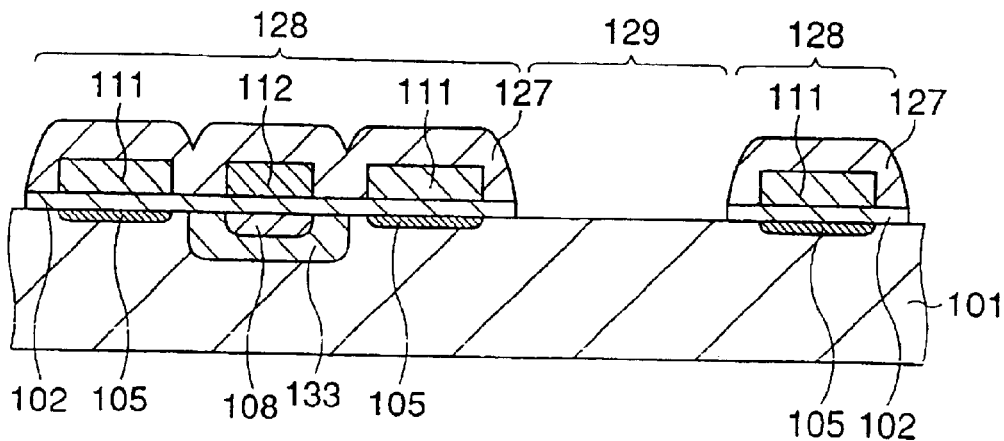

As shown in FIG. 12I, the silicon oxide film 127 is etched away until the p-type silicon semiconductor substrate 101 is exposed, thereby forming an element formation region 129 defined by a field-shield element isolation structure 128.

Figure 12J:
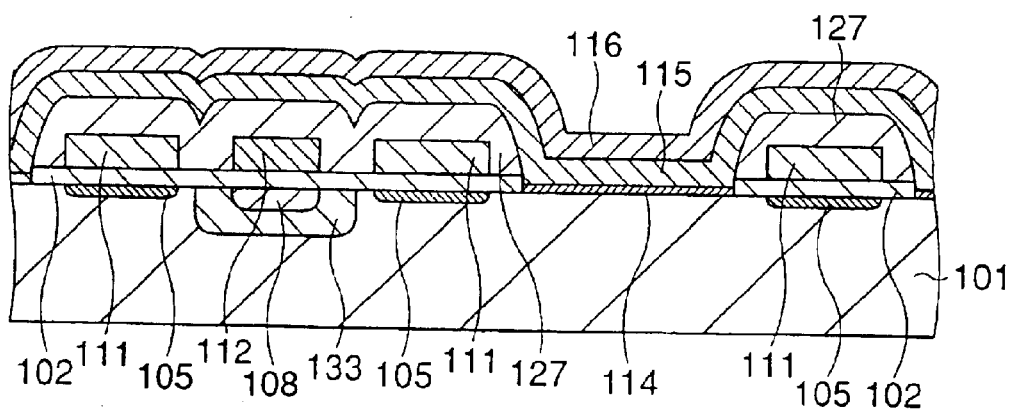

Next, the surface of the p-type silicon semiconductor substrate 101 in the element formation region 129 is thermally oxidized to form a tunnel oxide film 114 about 8 to 10 nm thick. Phosphorus (P) is doped into the entire surface including the element formation region 129 by low-pressure CVD to form a 0.2- to 0.4-μm thick phosphorus (P)-doped polysilicon film 115. Subsequently, a silicon oxide film 116 about 0.2 to 0.4 μm thick is formed by low-pressure CVD. This state is shown in FIG. 12J.

Figure 12K:
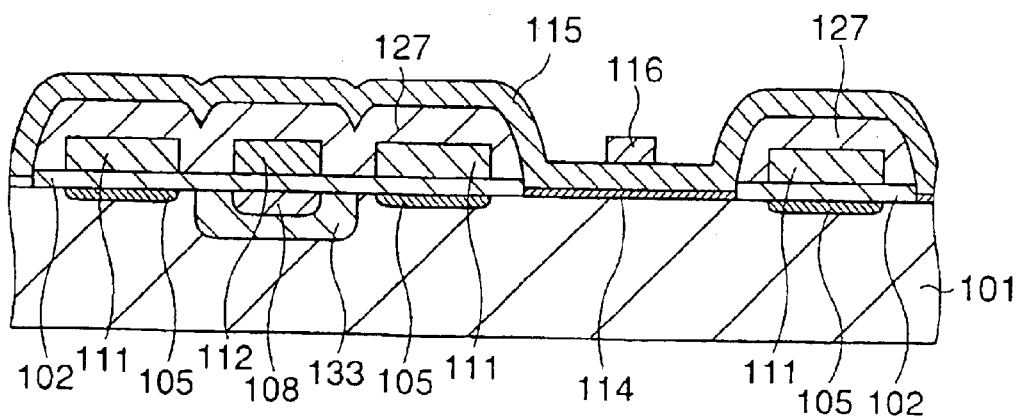

As shown in FIG. 12K, photolithography and dry etching are sequentially performed to selectively remove the silicon oxide film 116. This patterned silicon oxide film 116 is used as a mask to perform dry etching to remove the phosphorus (P)-doped polysilicon film 115.

Figure 12L:
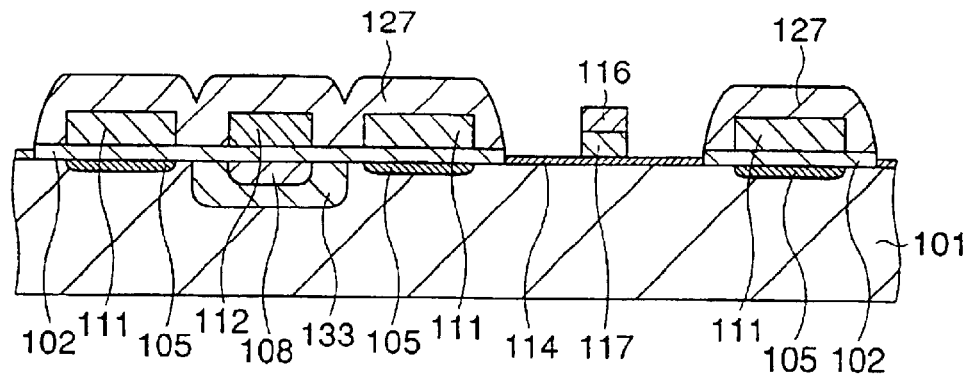

Consequently, a floating gate electrode 117 as shown in FIG. 12L is formed. As shown in the plan view of FIG. 11, this floating gate electrode 117 is so formed as to divide the element isolation region 129. The end portion of the floating gate electrode 117 reaches the vicinity of the floating gate electrode 112 which is capacitively coupled with the impurity diffusion layer 108.

Figure 12M:
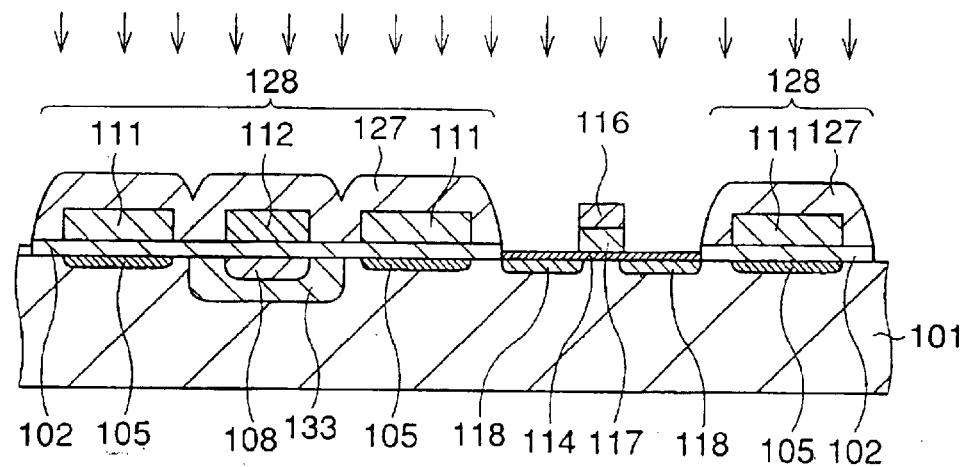

Next, as shown in FIG. 12M, the silicon oxide film 116 and the field-shield element isolation structure 128 are used as masks to ion-implant phosphorus as an n-type impurity at a dose of about $1 \times 10^{13}$ to $3 \times 10^{13}/cm^2$ and an acceleration energy of about 30 to 50 keV, thereby forming a lightly doped impurity diffusion layer 118.

Figure 12N:
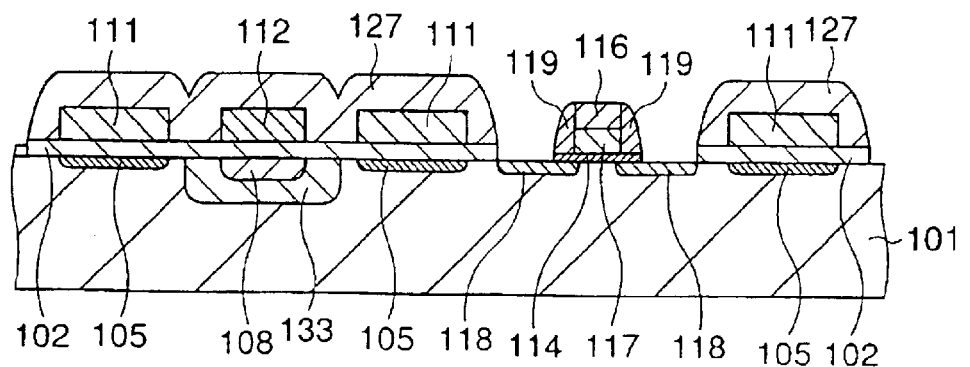

As shown in FIG. 12N, a silicon oxide film is formed on the entire surface and anisotropically etched to form side walls 119 covering the side surfaces of the floating gate electrode 117 and the silicon oxide film 116.

Figure 12P:
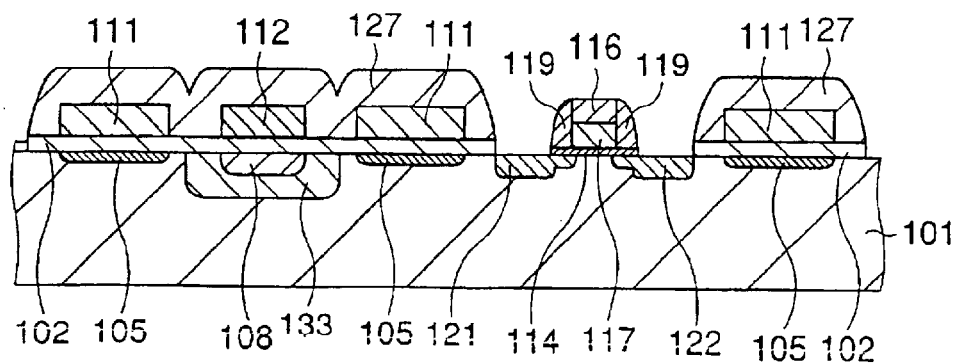

As shown in FIG. 12P, the side walls 119, the silicon oxide film 116, and the field-shield element isolation structure 128 are used as masks to ion-implant arsenic (As) as an n-type impurity at a dose of about $1.0 \times 10^{15}/cm^2$ and an acceleration energy of about 30 keV, thereby forming a heavily doped impurity diffusion layer. Thereafter, annealing is performed at a temperature of about 900° C. to form a source layer 121 and a drain layer 122 of a memory cell transistor.

Figure 12Q:
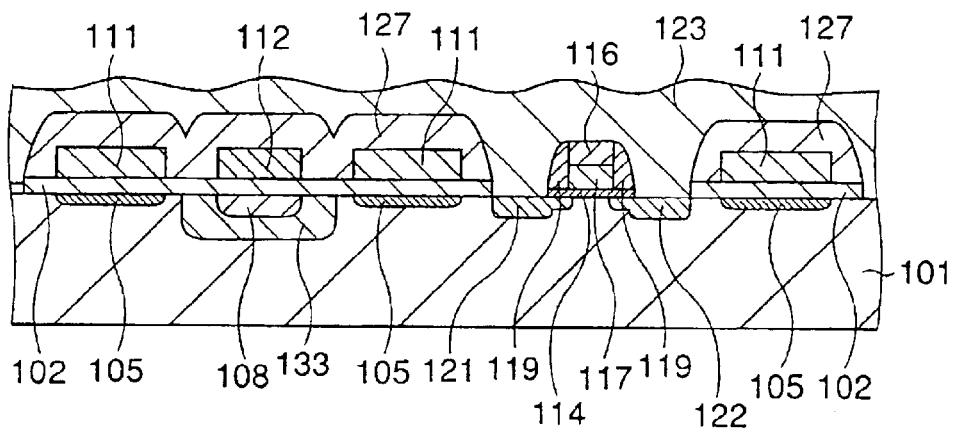

Next, as shown in FIG. 12Q, a BPSG film 123 as an insulating interlayer is formed on the entire surface, and reflow is performed to planarize the surface. A contact hole 124 is then formed to expose the floating gate electrodes 112 and 117, the impurity diffusion layer 108, the source layer 121, and the drain layer 122.

Figure 12R:
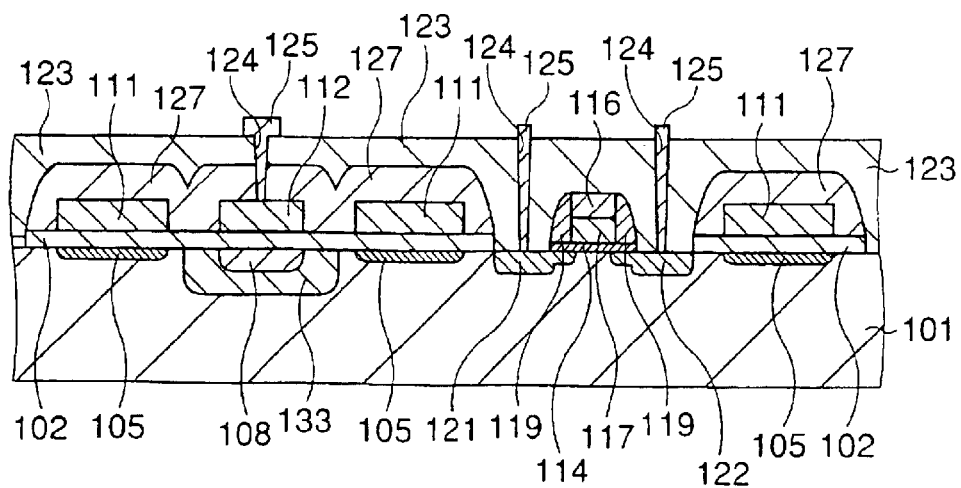

An aluminum interconnecting layer 125 is formed by sputtering and patterned as shown in FIG. 11 to electrically connect the floating gate electrodes 112 and 117, forming an integrated floating gate electrode. Simultaneously, the aluminum interconnecting layer 125 is patterned to form interconnections connecting to the impurity diffusion layer 108, the source layer 121, and the drain layer 122, thereby completing the EEPROM as shown in FIGS. 11 and 12R.

In this fifth embodiment, before the impurity diffusion layer 108 opposing the floating gate electrode 12 of the EEPROM is formed, phosphorus (P) as an n-type impurity is lightly ion-implanted into a surface region of the p-type silicon semiconductor substrate 101 over a broader range than the impurity diffusion layer 108. Consequently, the diffusion layer 133 which is a region more insulated from the impurity diffusion layer 108 than the p-type silicon semiconductor substrate 101 is positively formed.

With this structure, the p-type impurity concentration in this diffusion layer 133 can be made lower than the original concentration in the p-type silicon semiconductor substrate 101. Accordingly, the dielectric breakdown voltage with respect to a reverse voltage in this junction can be increased compared to the fourth embodiment.

To erase data, for example, the source and drain (impurity diffusion layers) 121 and 122 are set at 0 (V), and a predetermined voltage of about 20 (V) is applied to the impurity diffusion layer 108 as a control gate. Since this voltage of the impurity diffusion layer 108 is also applied to the floating gate electrode 117 at the capacitive coupling ratio of the oxide film 102 as a gate oxide film to the tunnel oxide film 114, electrons are injected from the p-type silicon semiconductor substrate 101 through the tunnel oxide film 114. Consequently, the threshold value of the transistor including the tunnel oxide film 114 rises to set the EEPROM in an erase state. Since the concentration of the p-type impurity in the diffusion layer 133 forming a junction with the impurity diffusion layer 108 is kept low due to the ion implantation of an n-type impurity, the diffusion layer 133 is insulated better than the p-type silicon semiconductor substrate 101. Therefore, no breakdown occurs even when a high voltage is applied to the impurity diffusion layer 108.

Accordingly, the fifth embodiment realizes a reliable EEPROM which is a single-layer gate semiconductor device by which a low-cost process is possible, has the impurity diffusion layer 108 as a control gate which can well withstand a high voltage applied when data is erased or written, and can prevent an operation error and can also shorten the erase time.

Sixth Embodiment

Figure 13:
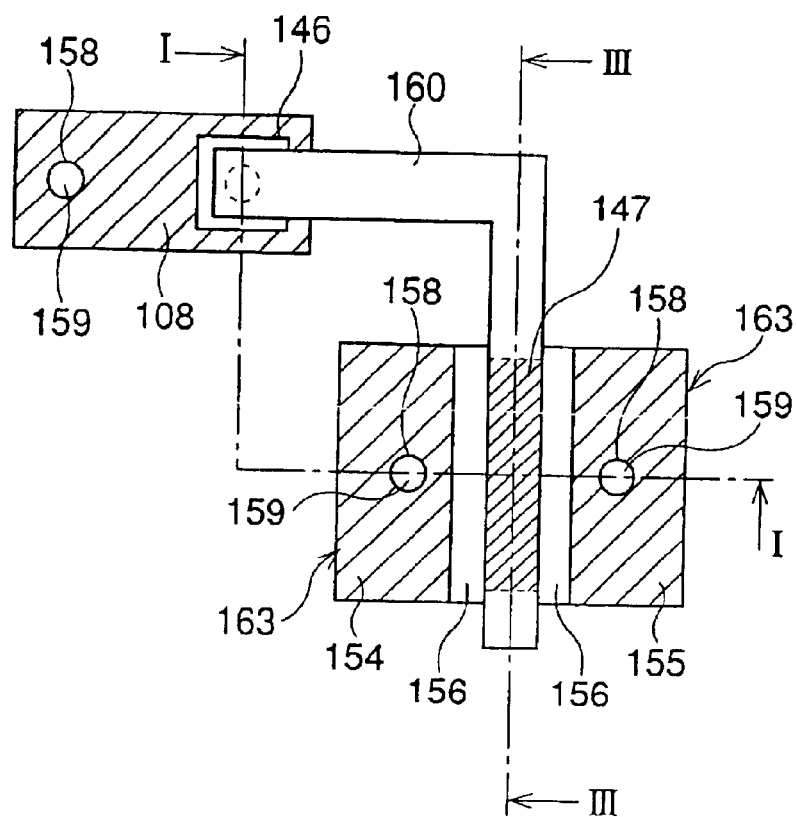
FIG. 13 is a schematic plan view showing an EEPROM according to the sixth embodiment of the present invention.
Figure 14A:
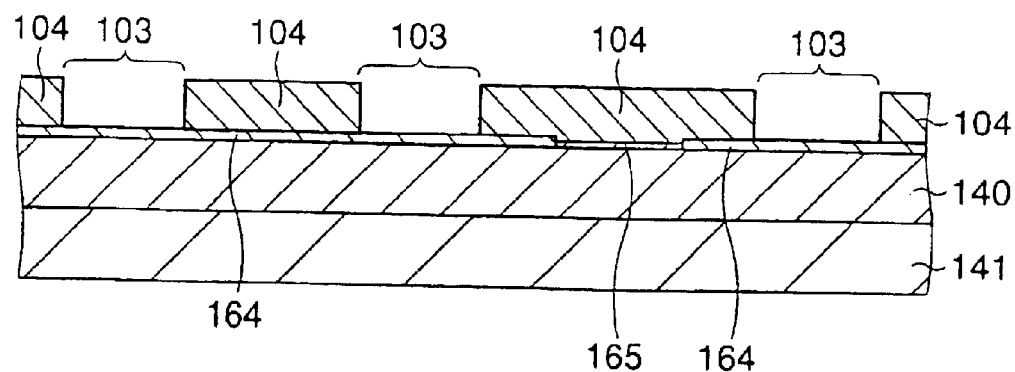
FIGS. 14A to 14N are schematic sectional views showing a method of fabricating the EEPROM according to the sixth embodiment of the present invention in order of steps.
Figure 14N:
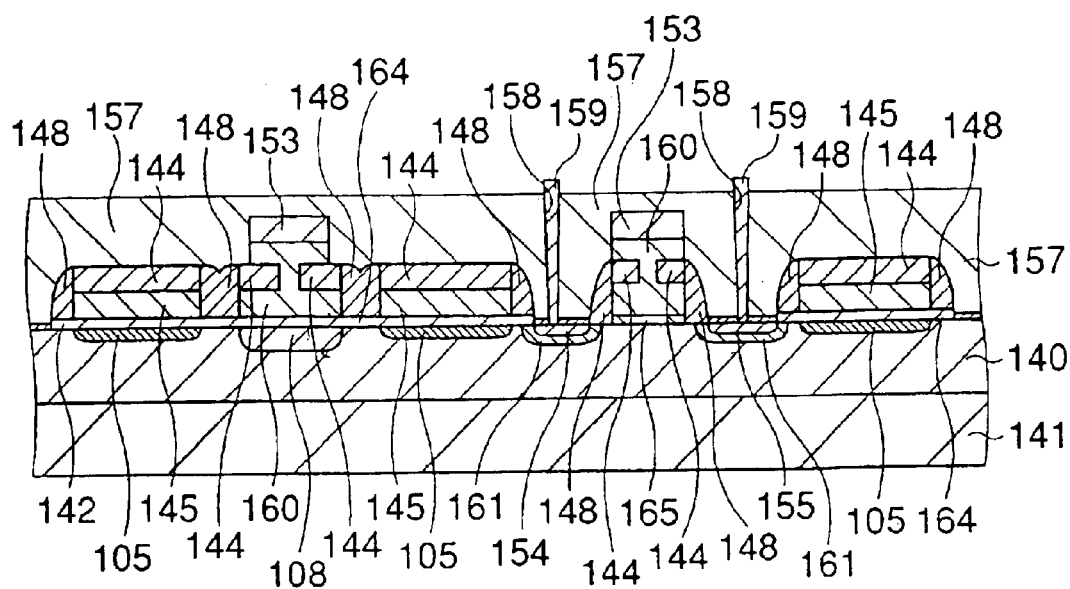
Figure 15:
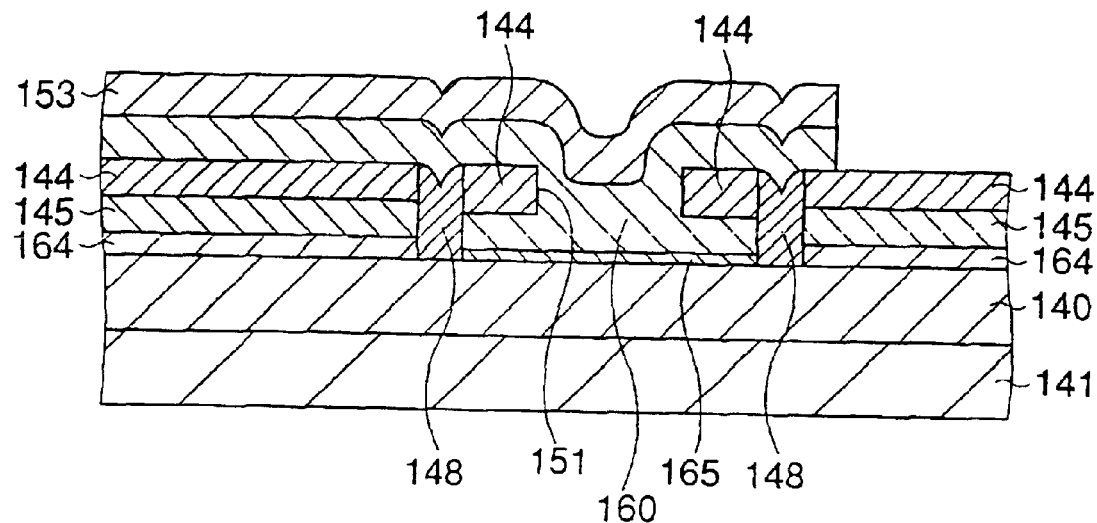
FIG. 15 is a schematic sectional view showing the EEPROM according to the sixth embodiment of the present invention.

The sixth embodiment of the present invention will be described below. In this sixth embodiment, an EEPROM as a nonvolatile semiconductor memory will be exemplified as a semiconductor device, and an arrangement in which an element isolation region is formed by a field-shield element isolation structure as in the fourth and fifth embodiments will be presented. However, a more simplified fabrication method will be explained together with the arrangement. FIG. 13 is a schematic plan view showing this EEPROM. FIGS. 14A to 14N are schematic sectional views, taken along an alternate long and short dashed line I—I in FIG. 13, showing the fabrication method of the EEPROM in order of steps performed. FIG. 15 is a schematic sectional view taken along an alternate long and short dashed line III—III in FIG. 13. Note that the same reference numerals as in the EEPROM of the fourth embodiment denote the same parts in the sixth embodiment.

First, as shown in FIG. 14A, the surface of a p-type silicon semiconductor substrate 141 on which a p-type well diffusion layer 140 is formed is thermally oxidized to separately form a thermal oxide film 164 and a tunnel oxide film 165 about 8 to 10 nm thick. A resist 104 having a hole 103 is formed on the thermal oxide film 164 and the tunnel oxide film 165 by normal photolithography.

Figure 14B:
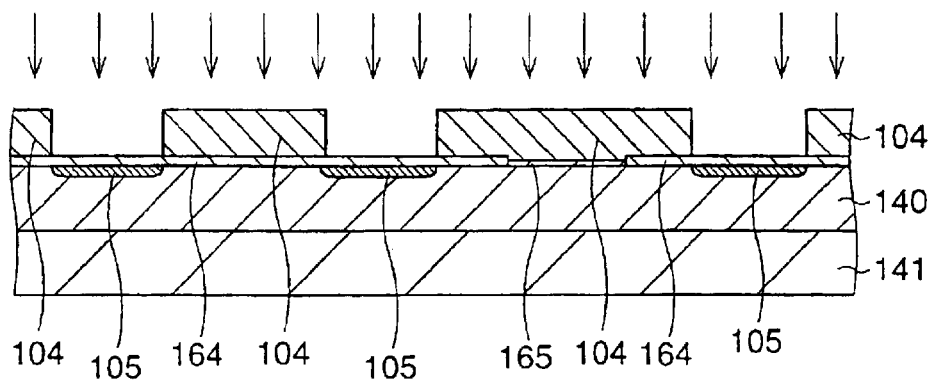

Next, as shown in FIG. 14B, the resist 104 is used as a mask to ion-implant boron (B) as a p-type impurity to form a channel stopper layer 105. This channel stopper layer 105 raises the threshold voltage of a field-shield element isolation structure to be formed above the channel stopper layer 105, preventing the formation of a parasitic device.

Figure 14C:
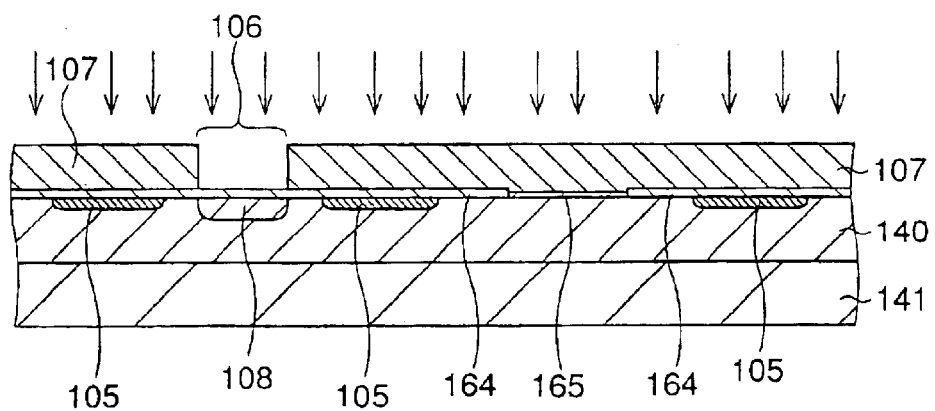

As shown in FIG. 14C, after the resist 104 is removed, a resist 107 having a hole 106 is formed. The resist 107 is used as a mask to ion-implant arsenic (As) as an n-type impurity at a dose of about $2.0 \times 10^{15}/cm^2$ and an acceleration energy of about 100 keV. Consequently, an n-type impurity diffusion layer 108 is formed in the hole 106.

Figure 14D:
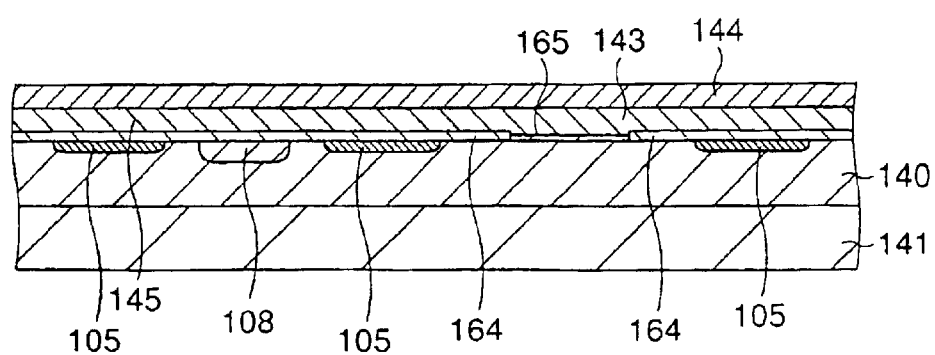

Next, as shown in FIG. 14D, phosphorus (P) as an n-type impurity is doped by low-pressure CVD to form a polysilicon film 143 on the thermal oxide film 164 and the tunnel oxide film 165. In addition, a silicon oxide film 144 is formed on the polysilicon film 143 by low-pressure CVD.

Figure 14E:
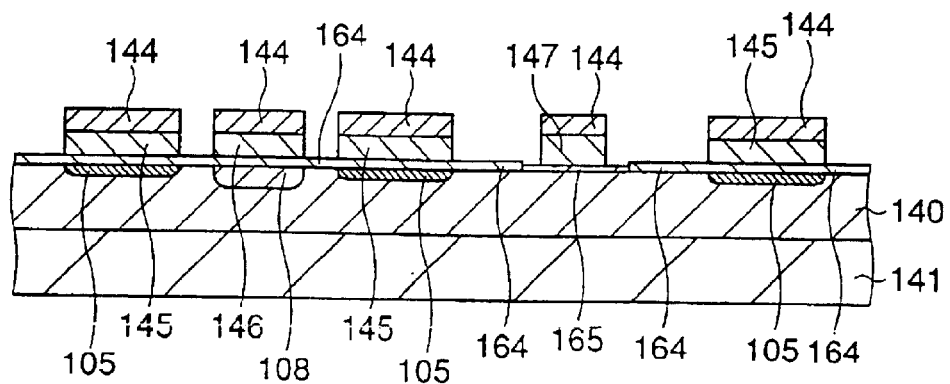

As shown in FIG. 14E, photolithography and dry etching are sequentially performed to selectively remove both the silicon oxide film 144 and the polysilicon film 143 and expose the underlying thermal oxide film 164 and tunnel oxide film 165. Consequently, a shield plate electrode 145 is formed on the channel stopper layer 105, and a floating gate electrode 146 is formed on the n-type impurity diffusion layer 108.

Additionally, in this step, the silicon oxide film 144 and the polysilicon film 143 are removed from a predetermined range to leave an island pattern, thereby forming a floating gate electrode 147 in this range.

That is, in this dry etching step, the floating gate electrode 147 can be formed simultaneously with the formation of the shield plate electrode 145 and the floating gate electrode 146.

Figure 14F:
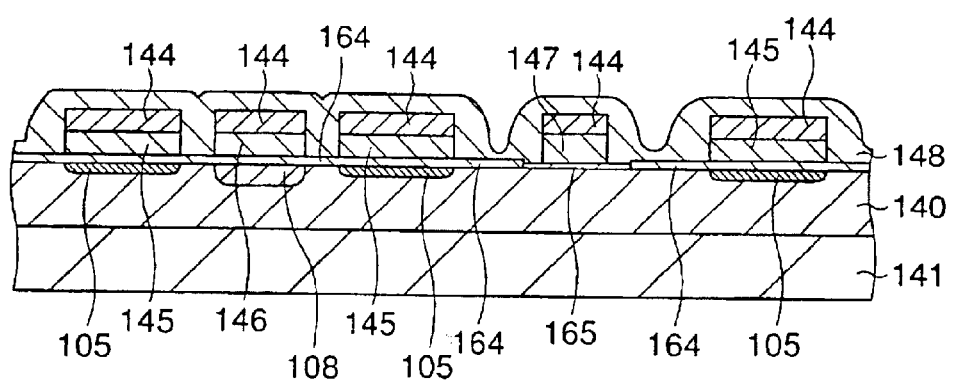

Next, as shown in FIG. 14F, a silicon oxide film 148 about 250 nm thick is formed on the entire surface by low-pressure CVD.

Figure 14G:
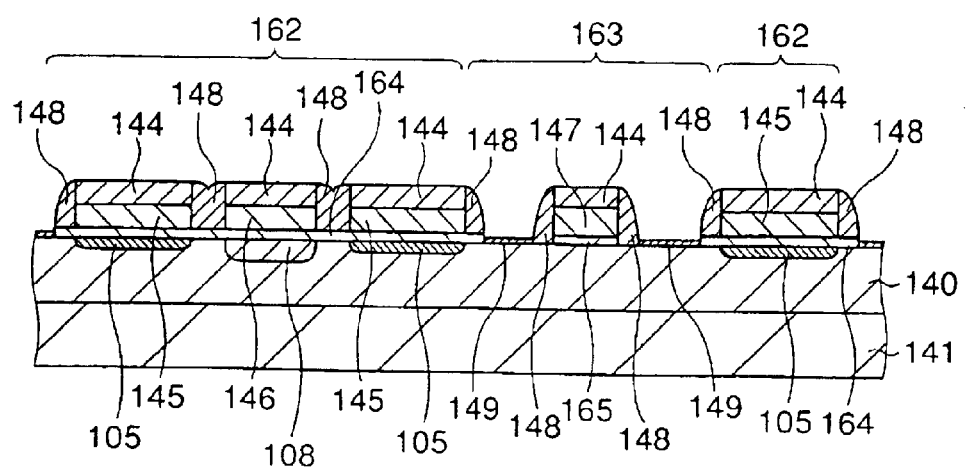

As shown in FIG. 14G, dry etching is performed to remove the silicon oxide film 148 so that the silicon oxide film 148 remains only on the side surfaces of the shield plate electrode 145 and the floating gate electrodes 146 and 147. Consequently, an element formation region 163 surrounded by a field-shield element isolation structure 162 is defined.

Thereafter, a silicon oxide film 149 about 20 nm thick is formed on the entire surface by low-pressure CVD.

Figure 14H:
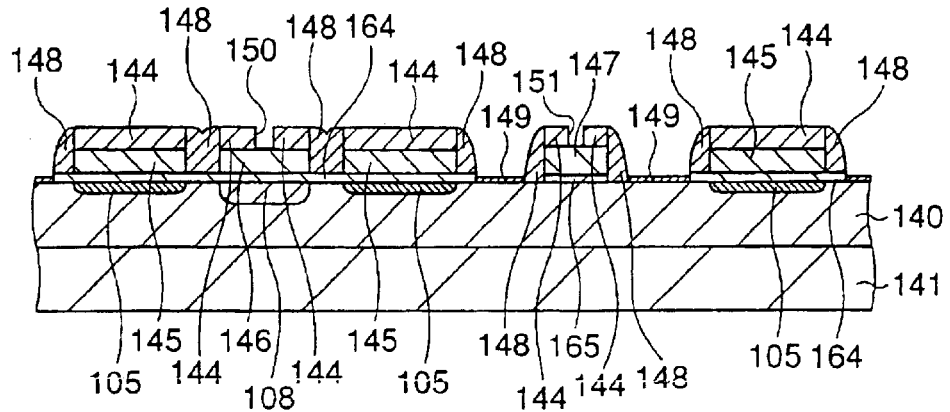

Next, as shown in FIG. 14H, contact holes 150 and 151 are formed in the silicon oxide film 144 on the floating gate electrodes 146 and 147. Consequently, the floating gate electrodes 146 and 147 are exposed.

Figure 14I:
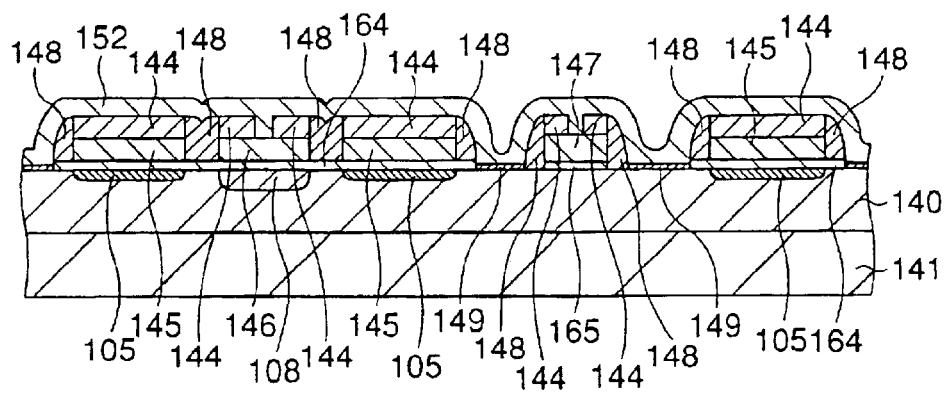

As shown in FIG. 14I, phosphorus (P) is doped into the entire surface by low-pressure CVD to form a polysilicon film 152 about 200 nm thick. The contact holes 150 and 151 formed in the silicon oxide film 144 are filled with this polysilicon film 152. Also, the floating gate electrodes 146 and 147 are electrically connected by the polysilicon film 152.

Figure 14J:
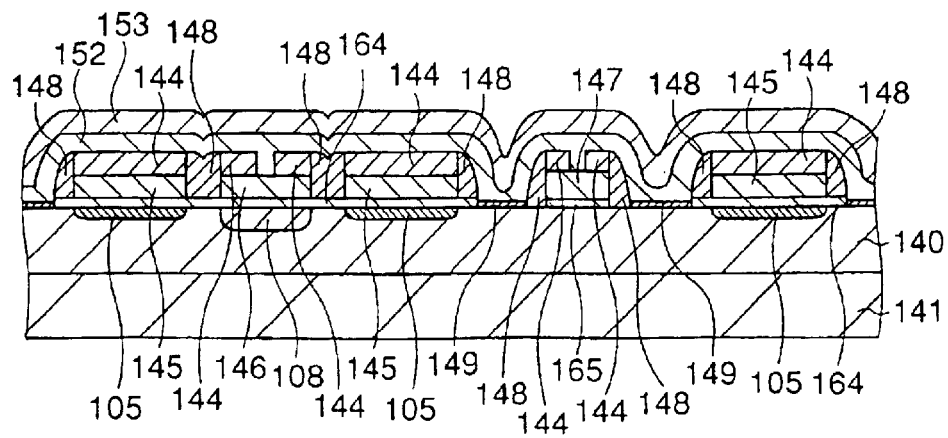
Figure 14K:
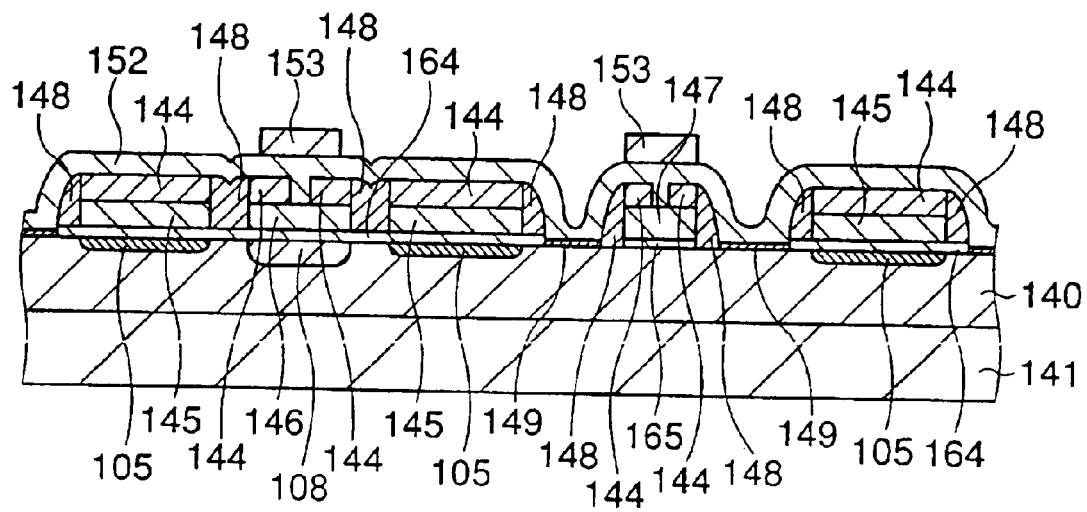

As shown in FIG. 14J, a silicon oxide film 153 is formed on the polysilicon film 152 by low-pressure CVD. As shown in FIG. 14K, photolithography and dry etching are sequentially performed to pattern the silicon oxide film 153 so that the silicon oxide film 153 remains only on the floating gate electrodes 146 and 147.

Figure 14L:
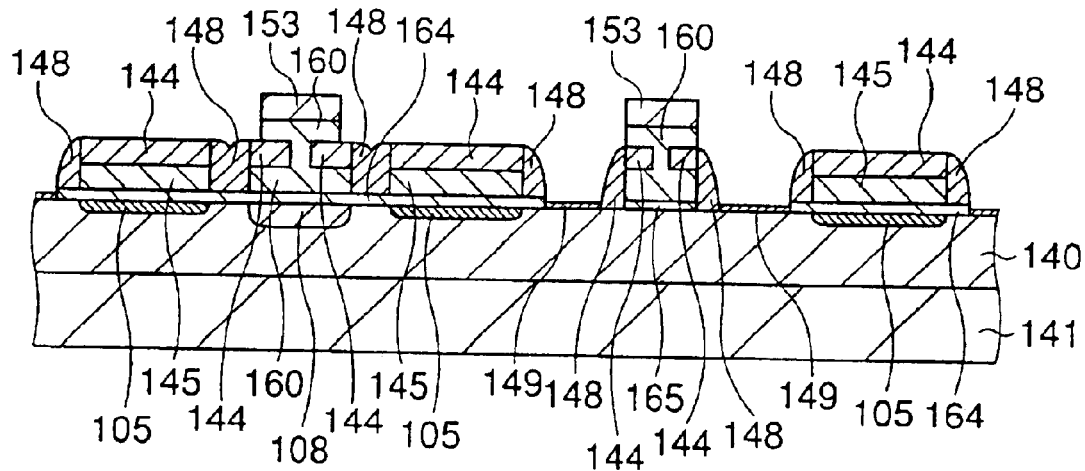

Next, as shown in FIG. 14L, the remaining silicon oxide film 153 is used as a mask to perform dry etching to pattern the polysilicon film 152. As shown in the plan view of FIG. 13, the polysilicon film 152 is so patterned as to electrically connect the floating gate electrode 147 in the element formation region 163 and the floating gate electrode 146 on the impurity diffusion layer 108.

The floating gate electrodes 146 and 147 are integrated into a floating gate electrode 160 via the polysilicon film 152. FIG. 15 shows a section taken along an alternate long and short dashed line III—III in FIG. 13 in this state.

Figure 14M:
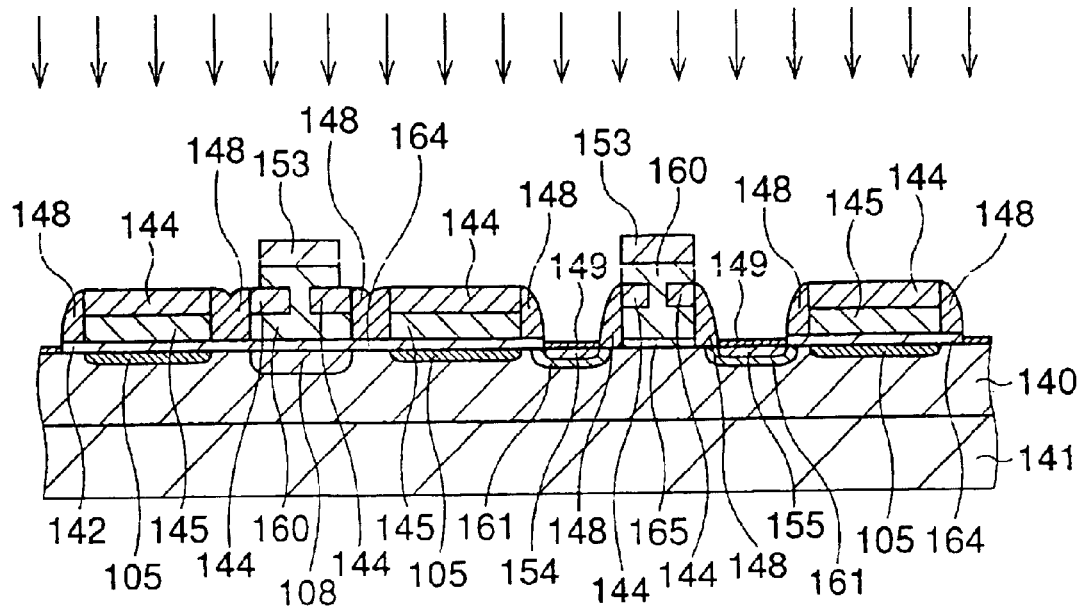

Next, as shown in FIG. 14M, phosphorus (P) as an n-type impurity is ion-implanted at a dose of about $5.0 \times 10^{15}/cm^2$ and an acceleration energy of about 30 keV into the surface region of the p-type well diffusion layer 140 of the semiconductor substrate 141 in the element formation region.

Thereafter, arsenic (As) as an n-type impurity is ion-implanted at a dose of about $5.0 \times 10^{15}/cm^2$ and an acceleration energy of about 30 keV. Annealing is then performed at a temperature of about 900° C. to form a source layer 154 and a drain layer 155 made of arsenic (As). Also, phosphorus (P) having a larger diffusion coefficient than that of arsenic (As) is widely diffused to form an impurity diffusion layer 161 of phosphorus (P) surrounding the source layer 154 and the drain layer 155.

Next, as shown in FIG. 14N, a silicon oxide film as an insulating interlayer is formed on the entire surface, and reflow is performed to planarize the surface. A contact hole 158 is then formed to expose the impurity diffusion layer 108, the source layer 154, and the drain layer 155.

An aluminum interconnecting layer 159 is formed by sputtering and patterned to complete the EEPROM as shown in FIGS. 13 and 14N.

In the sixth embodiment as described above, the floating gate electrode 147 can be formed at the same time the floating gate electrode 146 and the shield plate electrode 145 of the field-shield element isolation structure 162 are formed on the impurity diffusion layer 108 as the control gate of the EEPROM.

Accordingly, the dielectric breakdown voltage can be increased as in the fourth embodiment by preventing an unnecessary rise in the p-type impurity concentration in the vicinity of the junction between the impurity diffusion layer 108 and the p-type silicon semiconductor substrate 141. Additionally, this embodiment can further shorten the fabrication process.

Note that in this sixth embodiment, as in the fifth embodiment described above, the dielectric breakdown voltage can be further increased by forming a diffusion layer 133 which is a more insulated region than the p-type well diffusion layer 140 before the impurity diffusion layer 108 is formed.

Seventh Embodiment

Figure 16:
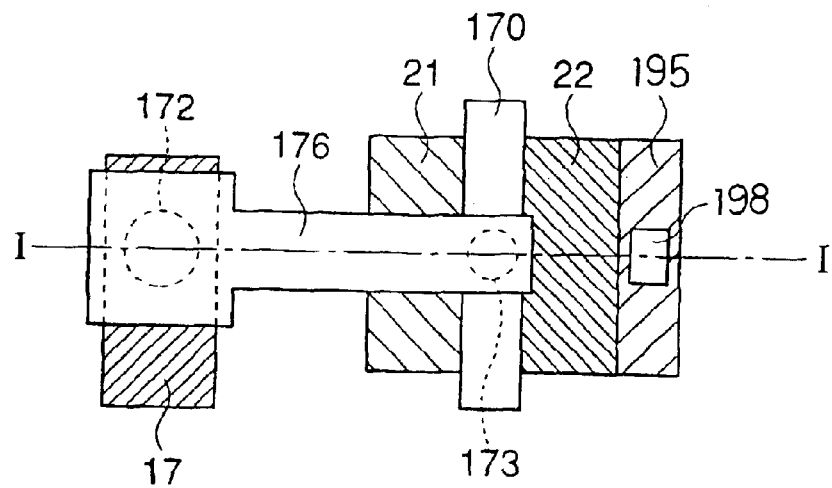
FIG. 16 is a schematic plan view showing an EEPROM according to the seventh embodiment of the present invention.

The seventh embodiment will be described below. In this seventh embodiment, as in the previous embodiments, an EEPROM as a nonvolatile semiconductor memory will be exemplified as a semiconductor device, and the structure and the fabrication method of this EEPROM will be explained. The seventh embodiment differs from the first to sixth embodiments in that a metal film is used in a part of a floating gate. FIG. 16 is a schematic plan view showing this EEPROM. FIGS. 17A to 17K are schematic sectional views, taken along an alternate long and short dashed line I—I in FIG. 16, showing the fabrication method of the EEPROM in order of steps. Note that the same reference numerals as in the EEPROM of the first embodiment denote the same parts in the seventh embodiment.

Figure 17A:
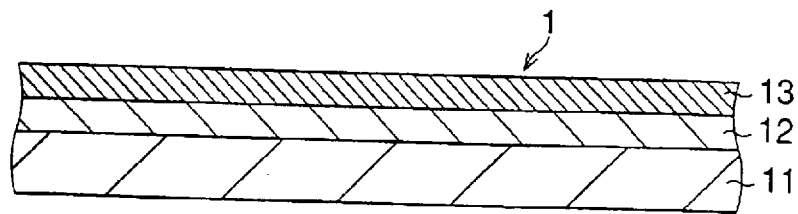
FIGS. 17A to 17K are schematic sectional views showing a method of fabricating the EEPROM according to the seventh embodiment of the present invention in order of steps.

First, as shown in FIG. 17A, an SOI substrate 1 is prepared by forming a single-crystal silicon layer 13 about 50 nm thick on a p-type silicon semiconductor substrate 11 via a buried oxide film 12 about 50 nm thick.

Figure 17B:
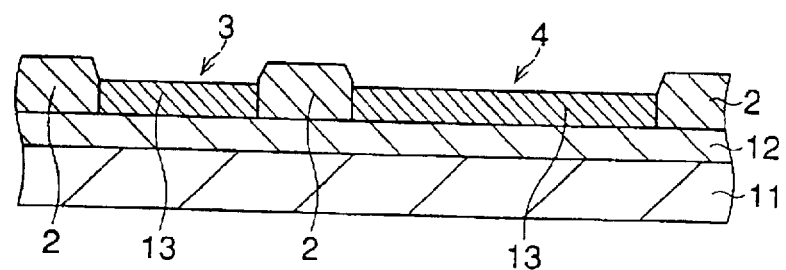

Next, as shown in FIG. 17B, the SOI substrate 1 is selectively oxidized to form a field oxide film 2 about 100 nm thick as an element isolation structure by so-called LOCOS, thereby defining element regions 3 and 4 on the SOI substrate 1. Consequently, the element regions 3 and 4 are formed adjacent to each other while being electrically isolated via the field oxide film 2.

Figure 17C:
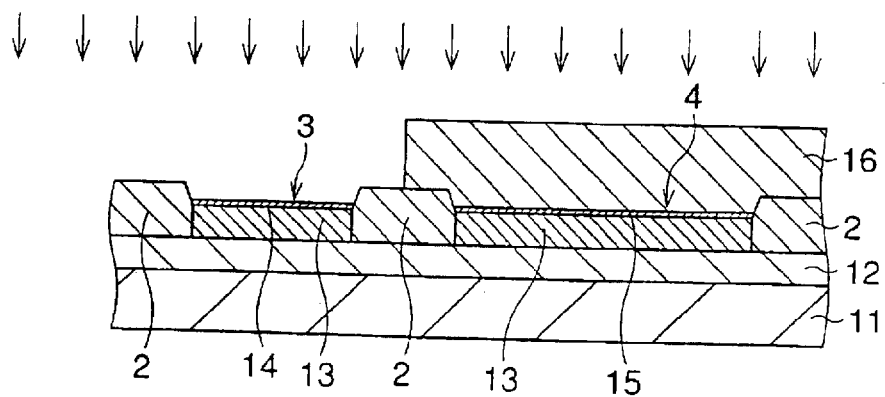

As shown in FIG. 17C, the surface of the single-crystal silicon layer 13 in the element regions 3 and 4 is thermally oxidized to form cap insulating films 14 and 15 about 10 to 20 nm thick for ion implantation.

Subsequently, the entire surface is coated with a photoresist, and the photoresist is processed by photolithography into a shape by which only the element region 3 is exposed, thereby forming a resist mask 16. This resist mask 16 is used as a mask to ion-implant an n-type impurity, arsenic (As) or phosphorus (P) in this embodiment, at a dose of 1 to $2 \times 10^{15}$ (1/cm$^2$) and an acceleration energy of 30 (keV). Consequently, the n-type impurity is ion-implanted into the single-crystal silicon layer 13 in the element region 3 through the cap insulating film 14.

After the resist mask 16 is removed by ashing or the like and the resultant structure is cleaned, the SOI substrate 1 is annealed to form an impurity diffusion layer 17 functioning as the control gate of the EEPROM. Thereafter, the cap insulating films 14 and 15 are removed.

Figure 17D:
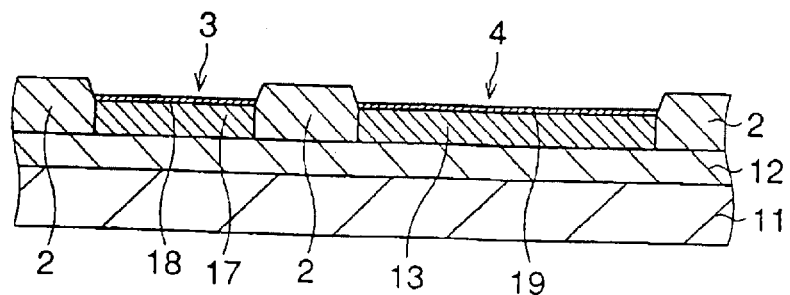

Next, as shown in FIG. 17D, the surface of the single-crystal silicon layer 13 in the element regions 3 and 4 is again thermally oxidized to form an oxide film 18 on the surface of the single-crystal silicon layer 13 in the element region 3 and a tunnel oxide film 19 about 8 to 12 nm thick on the surface of the single-crystal silicon layer 13 in the element region 4.

Figure 17E:
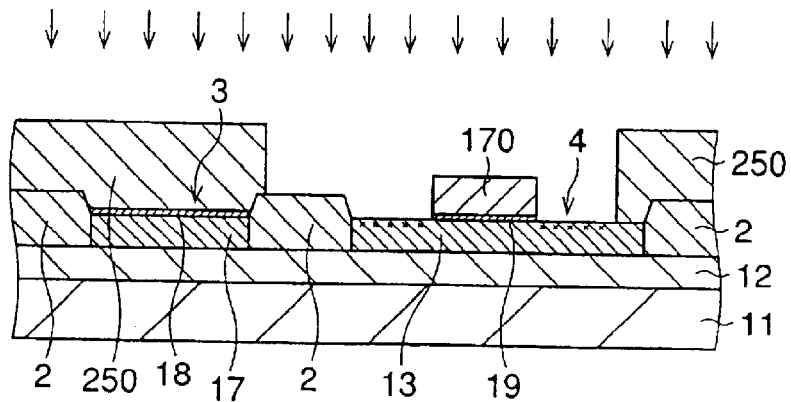

An undoped polysilicon film is deposited by CVD on the entire surface including the element regions 3 and 4, and an n-type impurity, phosphorus (P) in this embodiment, is doped into this polysilicon film. As shown in FIGS. 16 and 17E, photolithography and dry etching are sequentially performed on the polysilicon film to form an island-pattern gate electrode 170 extending over the field oxide film 2.

Subsequently, photolithography is performed to form a resist mask 250 covering the element region 4 and the impurity diffusion layer 17. An n-type impurity, arsenic (As) in this embodiment, is ion-implanted at a dose of 1 to $2 \times 10^{15}$ (1/cm$^2$) and an acceleration energy of 30 (keV). Consequently, the arsenic is ion-implanted through the tunnel oxide film 19 into the single-crystal silicon layer 13 on the two sides of the gate electrode 170 in the element region 4. However, this arsenic is not ion-implanted into the portion of the element region 4 covered with the resist mask 250.

Figure 17F:
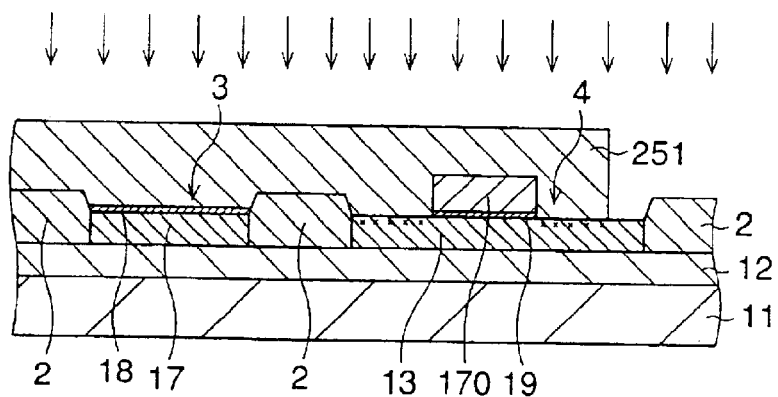

Next, as shown in FIG. 17F, photolithography is performed to form a resist mask 251 which exposes the portion of the element region 4 into which no n-type impurity is ion-implanted. A p-type impurity, boron (B) in this embodiment, is ion-implanted at a dose of 3 to $5 \times 10^{15}$ (1/cm$^2$) and an acceleration energy of about 30 (keV).

Figure 17G:
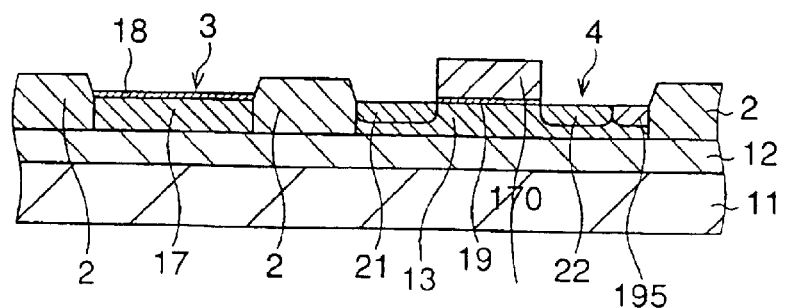

Thereafter, as shown in FIG. 17G, the SOI substrate 1 is annealed to form a pair of impurity diffusion layers 21 and 22 serving as a source and a drain in the element region 4. Simultaneously, a p-type impurity diffusion layer 195 is formed adjacent to the impurity diffusion layer 22.

Figure 17H:
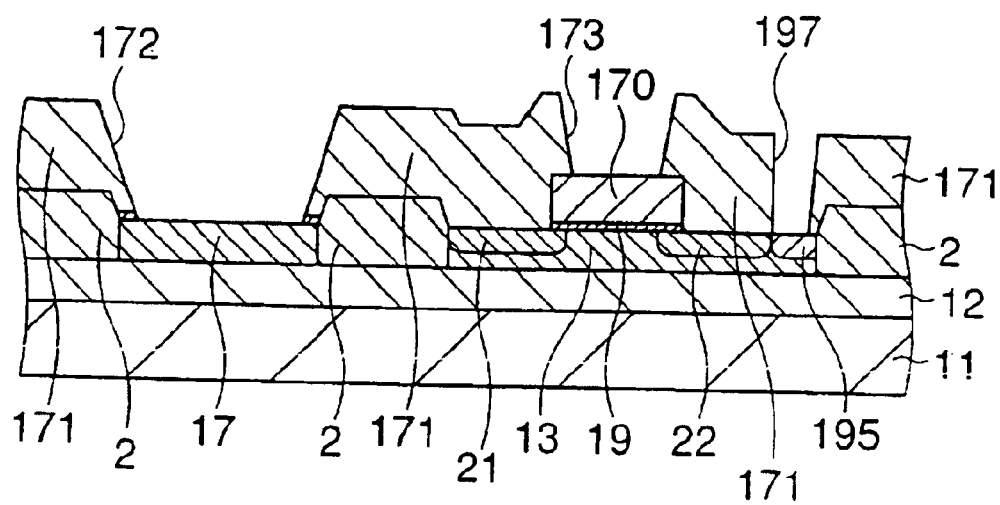

Next, as shown in FIG. 17H, a thick silicon oxide film 171 is formed on the entire surface by CVD. Photolithography and dry etching are sequentially performed to simultaneously form contact holes 172, 173, and 197 which expose the gate electrode 170 and the p-type impurity diffusion layer 195 in the element regions 3 and 4.

Figure 17I:
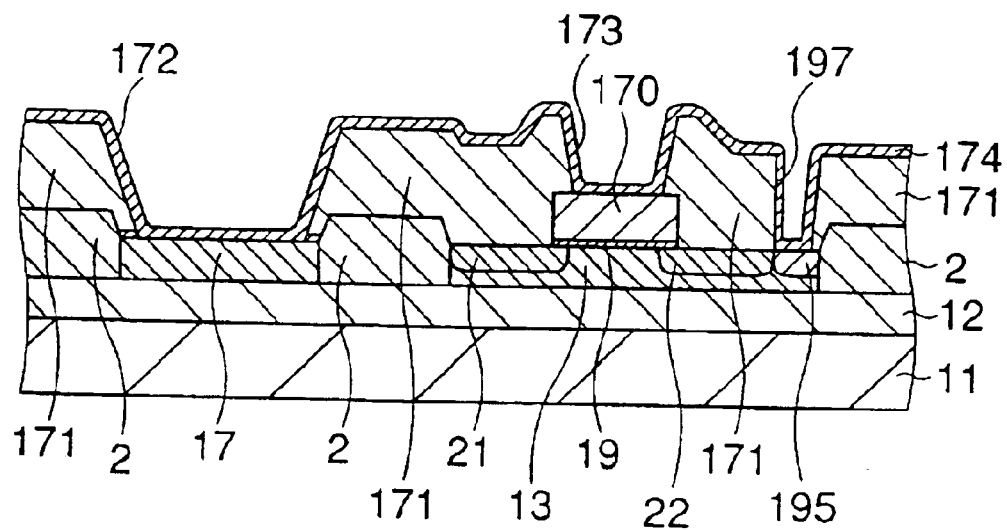

As shown in FIG. 17I, a silicon oxide film, a silicon nitride film, and a silicon oxide film are sequentially stacked on the entire surface to form an ONO film 174 made of these stacked films.

Figure 17J:
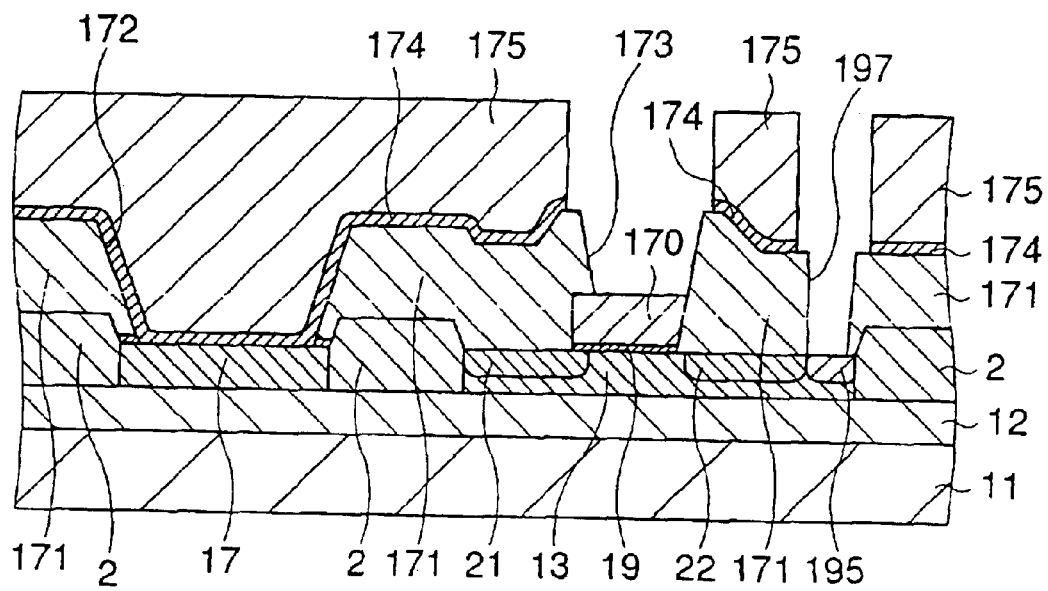

As shown in FIG. 17J, photolithography is performed to form a resist mask 175 having holes in the positions of the contact holes 173 and 197. Since this resist mask 175 is formed to remove the ONO film 174 on the gate electrode 170, no high photo-alignment accuracy with respect to the contact holes 173 and 197 is necessary. Thereafter, wet etching and dry etching are performed to remove the ONO film 174 on the gate electrode 170 and the p-type impurity diffusion layer 195, thereby exposing the gate electrode 170 and the p-type impurity diffusion layer 195.

Figure 17K:
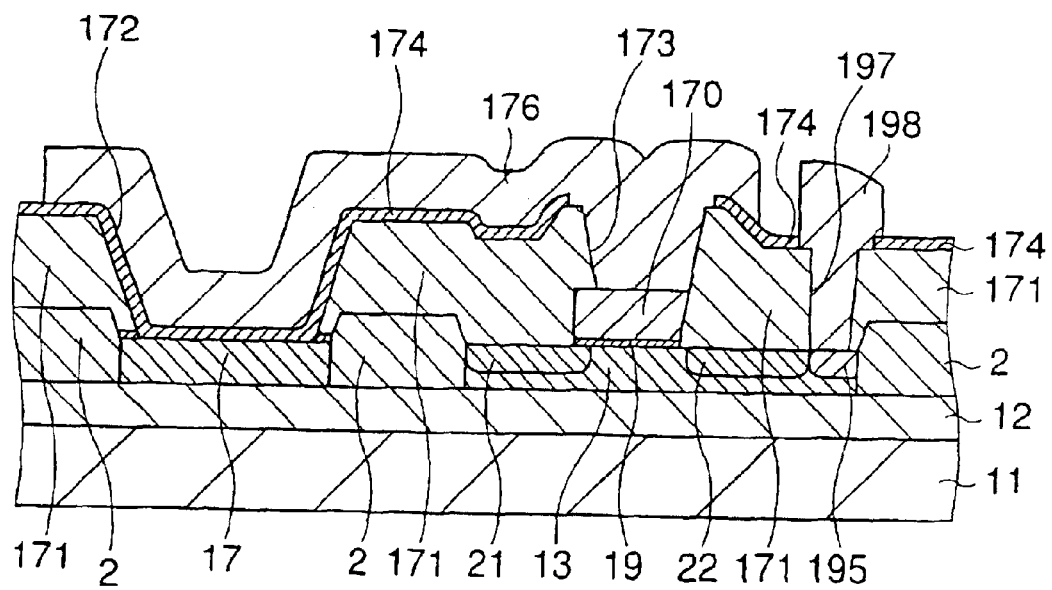

Next, after the resist mask 175 is removed by ashing or the like, an aluminum film is formed on the entire surface by sputtering. As shown in FIGS. 16 and 17K, photolithography and dry etching are sequentially performed to pattern the aluminum film so that the aluminum film extends from the element region 3 to the element region 4, thereby forming an aluminum electrode 176. At the same time, an aluminum electrode 198 burying the contact hole 197 and connected to the p-type impurity diffusion layer 195 is formed.

Consequently, in the element region 3 the aluminum electrode 176 is capacitively coupled with the impurity diffusion layer 17 via the ONO film 174. In the element region 4, the aluminum electrode 176 is electrically connected to the gate electrode 170.

Accordingly, the aluminum electrode 176 and the gate electrode 170 integrally function as a floating gate.

Finally, insulating interlayers, contact holes, interconnecting layers for connection, and the like are formed to complete the EEPROM of the seventh embodiment.

In the element region 4 of the EEPROM of the seventh embodiment, the gate electrode 170 is formed on the channel, which is formed in the single-crystal silicon layer 13 between the impurity diffusion layers 21 and 22 serving as a source and a drain, via the tunnel oxide film 19. In the element region 3, the aluminum electrode 176 electrically connected to the gate electrode 170 opposes the impurity diffusion layer 17 as a control gate via the ONO film 174 and is capacitively coupled with this impurity diffusion layer 17 by using the ONO film 174 as a dielectric film.

To erase data, for example, the source and drain (impurity diffusion layers) 21 and 22 are set at 0 (V), and a predetermined voltage of about 20 (V) is applied to the control gate (impurity diffusion layer) 17. Since this voltage of the control gate 17 is also applied to the floating gate consisting of the aluminum film 176 and the gate electrode 170 at the capacitive coupling ratio of the ONO film 174 to the tunnel oxide film 19, electrons are injected from the single-crystal silicon layer 13 through the tunnel oxide film 19. Consequently, the threshold value of the transistor including the tunnel oxide film 19 rises to set the EEPROM in an erase state. Since the major part of the floating gate is formed by the aluminum electrode 176 having a low electrical resistance, the voltage applied to the control gate is applied to the floating gate without being unnecessarily consumed. Accordingly, the time of electron injection, i.e., the time required for erasure can be shortened.

Also, the control gate 17 is well insulated from the silicon semiconductor substrate 11 by the buried oxide film 12. Therefore, even when a voltage of up to, e.g., 30 (V) is applied to the control gate 17, no breakdown to the silicon semiconductor substrate 11 takes place.

Furthermore, in the seventh embodiment, the p-type impurity diffusion layer 195 is formed adjacent to the element region 4. Since a predetermined substrate potential can be applied to this p-type impurity diffusion layer 195 via the aluminum electrode 198, it is possible to minimize variations in the threshold value of the MOS transistor and stably perform write and read operations. In addition, this aluminum electrode 198 can be formed simultaneously with the aluminum electrode 176.

Accordingly, the seventh embodiment realizes a reliable EEPROM which is a single-layer gate semiconductor device by which a low-cost process is possible, has the control gate 17 which can well withstand a high voltage applied when data is erased or written and thereby prevents an operation error, shortens the charge/discharge time by the floating gate made of a metal interconnection, and can further shorten the write and erase times.

Furthermore, as in the first embodiment, the SOI substrate 1 prepared by forming the single-crystal silicon layer 13 on the silicon semiconductor substrate 11 via the buried oxide film 12 is used as a semiconductor substrate. Therefore, the operating speed and the leak current characteristics can be improved.

In this embodiment, the ONO film 174 is used as a dielectric film. However, a common silicon oxide film may be used.

Eighth Embodiment

The eighth embodiment will be described below. In this eighth embodiment, as in the previous embodiments, an EEPROM as a nonvolatile semiconductor memory will be exemplified as a semiconductor device, and the structure and the fabrication method of this EEPROM will be explained.

Figure 18:
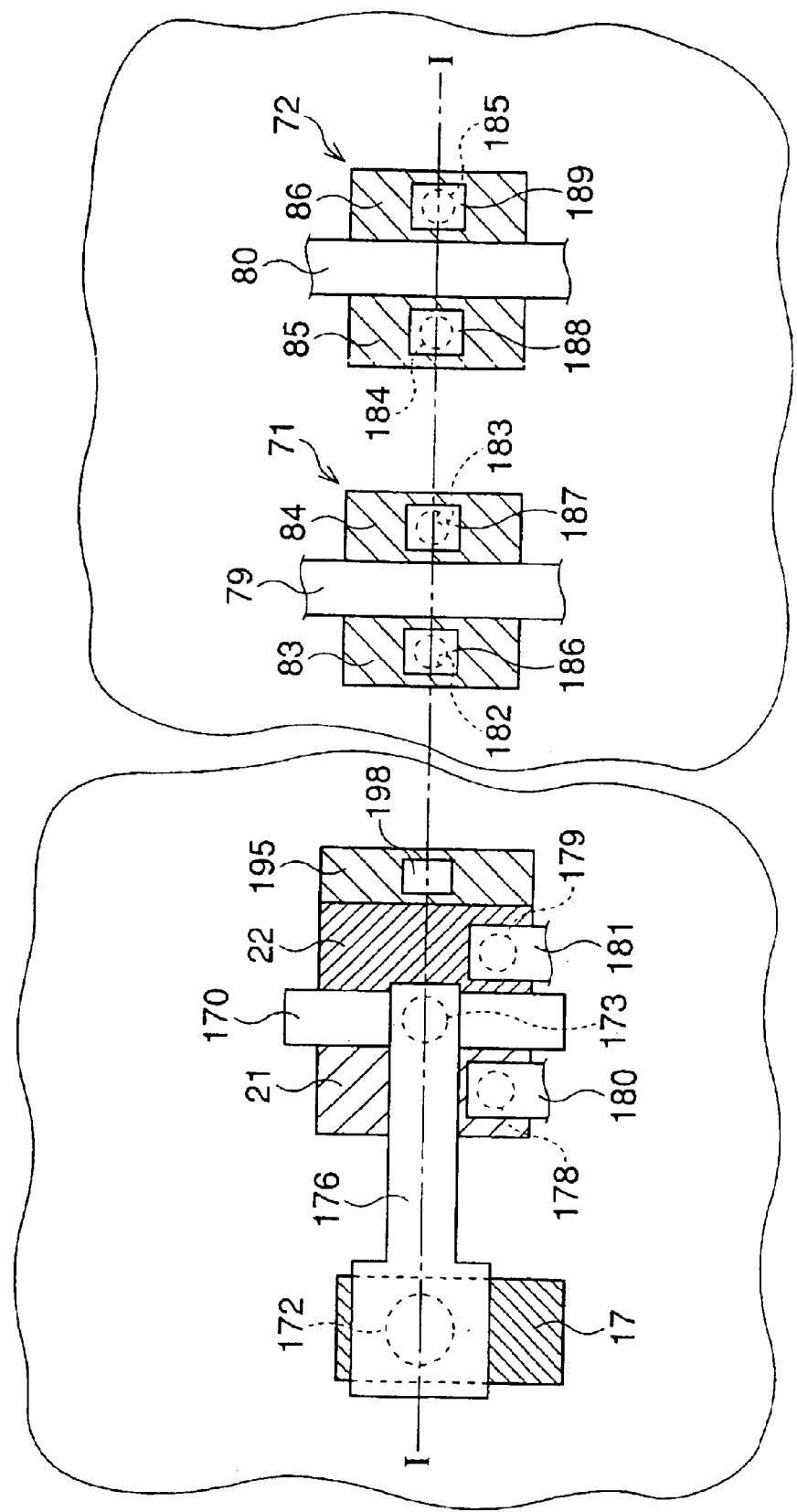
FIG. 18 is a schematic plan view showing an EEPROM according to the eighth embodiment of the present invention.

In the eighth embodiment, a metal interconnecting layer is used to decrease the electrical resistance of a floating gate as in the seventh embodiment. However, as in the first embodiment, a CMOS inverter is simultaneously formed as a peripheral circuit, and the metal interconnecting layer of the floating gate and an interconnecting layer of the CMOS inverter are simultaneously formed to simplify the fabrication process. FIG. 18 is a schematic plan view showing this EEPROM. FIGS. 19A to 19M are schematic sectional views, taken along an alternate long and short dashed line I—I in FIG. 18, showing the fabrication method of the EEPROM in order of steps. Note that the same reference numerals as in the EEPROMs of the first and seventh embodiments denote the same parts in the eighth embodiment.

Figure 19A:
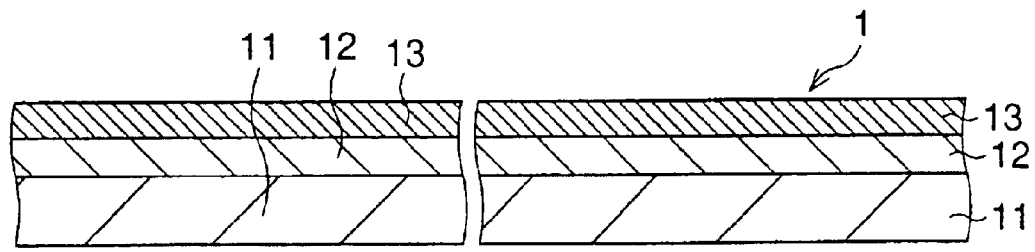

First, as shown in FIG. 19A, an SOI substrate 1 is prepared by forming a single-crystal silicon layer 13 about 50 nm thick on a p-type silicon semiconductor substrate 11 via a buried oxide film 12 about 50 nm thick.

Figure 19B:
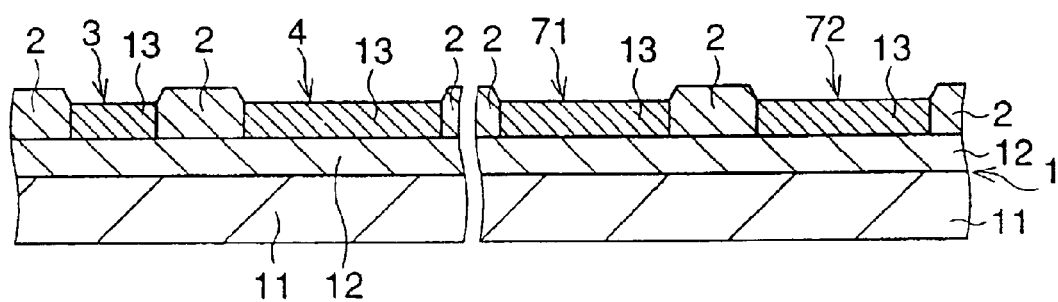

Next, as shown in FIG. 19B, the SOI substrate 1 is selectively oxidized to form a field oxide film 2 about 100 nm thick as an element isolation structure by so-called LOCOS, thereby defining element regions 3, 4, 71, and 72 on the SOI substrate 1. Consequently, the element regions 3 and 4 and the element regions 71 and 72 are formed adjacent to each other while being electrically isolated via the field oxide film 2. The element regions 3 and 4 are regions in which the EEPROM is to be formed. The element regions 71 and 72 are regions in which the CMOS inverter is to be formed.

Figure 19C:
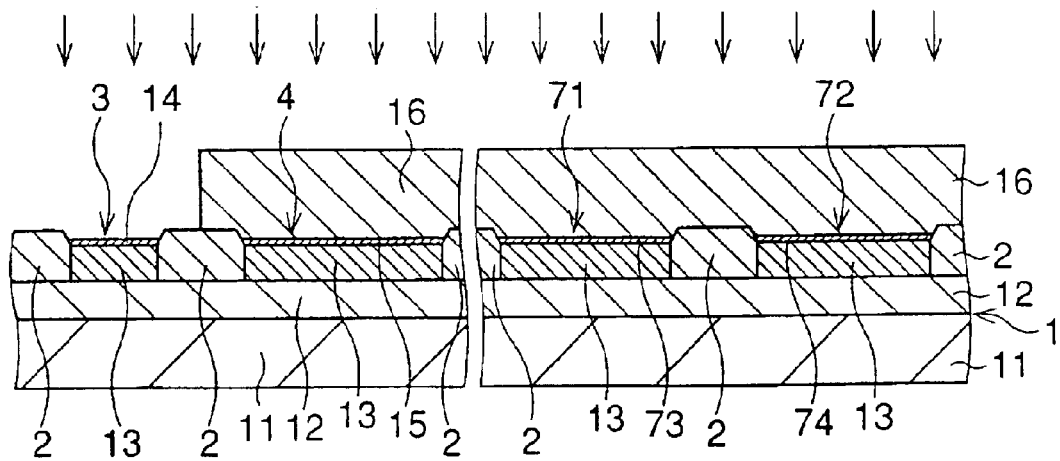

As shown in FIG. 19C, the surface of the single-crystal silicon layer 13 in the element regions 3, 4, 71, and 72 is thermally oxidized to form cap insulating films 14, 15, 73, and 74 about 10 to 20 nm thick for ion implantation.

Subsequently, the entire surface is coated with a photoresist, and the photoresist is processed by photolithography into a shape by which only the element region 3 is exposed, thereby forming a resist mask 16. This resist mask 16 is used as a mask to ion-implant an n-type impurity, arsenic (As) or phosphorus (P) in this embodiment, at a dose of 1 to $2\times10^{15}$ (1/cm$^2$) and an acceleration energy of 30 (keV). Consequently, the n-type impurity is ion-implanted through the cap insulating film 14 into an entire area in the direction of depth of the single-crystal silicon layer 13, from its surface layer to the buried oxide film 12, in the element region 3.

After the resist mask 16 is removed by ashing or the like and the resultant structure is cleaned, the SOI substrate 1 is annealed to form an impurity diffusion layer 17 functioning as the control gate of the EEPROM. A region from the side surfaces to the lower surface of this impurity diffusion layer 17 is covered with the field oxide film 2 and the buried oxide film 12.

Next, as shown in FIG. 19D, a photoresist is processed by photolithography into a shape by which only the element region 72 is exposed, thereby forming a resist mask 75. This resist mask 75 is used as a mask to ion-implant an n-type impurity, phosphorus (P) in this embodiment, at a dose of $1\times10^{12}$ (1/cm$^2$) and an acceleration energy of 30 (keV). Consequently, this n-type impurity is ion-implanted into the single-crystal silicon layer 13 in the element region 72 through the cap insulating film 74.

After the resist mask 75 is removed by ashing or the like and the resultant structure is cleaned, the SOI substrate 1 is annealed to form an n-type well region 76 of the CMOS inverter. Thereafter, the cap insulating films 14, 15, 73, and 74 are removed.

Next, as shown in FIG. 19E, the surface of the single-crystal silicon layer 13 in the element regions 3, 4, 71, and 72 is again thermally oxidized to form an oxide film 18 about 15 to 20 nm thick on the surface of the impurity diffusion layer 17 in the element region 3 and gate oxide films 77 and 78 about 15 to 20 nm thick on the surface of the single-crystal silicon layer 13 in the element regions 71 and 72, respectively. Thereafter, a resist mask 87 is formed to cover the resultant structure except for the element region 4, and the oxide film formed in the element region 4 by the thermal oxidation described above is etched away.

As shown in FIG. 19F, after the resist mask 87 is removed, thermal oxidation is again performed to form a tunnel oxide film 19 about 8 to 12 nm thick on the surface of the single-crystal silicon layer 13 in the element region 4.

Figure 19G:
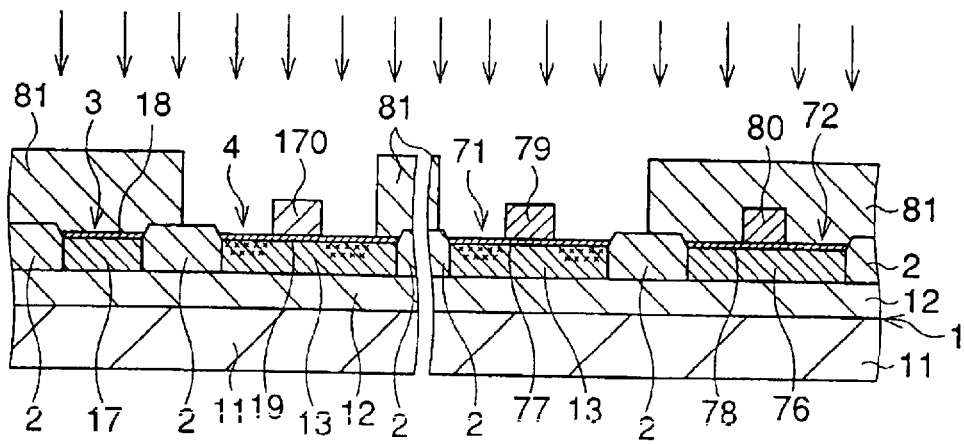

As shown in FIG. 19G, an undoped polysilicon film is deposited by CVD on the entire surface including the element regions 3, 4, 71, and 72, and an n-type impurity, phosphorus (P) in this embodiment, is doped into this polysilicon film. As shown in FIGS. 18 and 19G, photolithography and dry etching are sequentially performed for the polysilicon film to form an island-pattern floating gate 170 extending over the element region 4 and the field oxide film 2. At the same time, gate electrodes 79 and 80 of the CMOS inverter are formed from the polysilicon film.

More specifically, in the element region 4 the gate electrode 170 is formed into the form of a belt having a predetermined width via the tunnel oxide film 19. Also, the gate electrodes 79 and 80 of the CMOS inverter are formed to extend over the element regions 71 and 72, respectively, and the field oxide film 2.

As described above, the gate electrode 170 and the gate electrodes 79 and 80 of the CMOS inverter can be simultaneously formed by the patterning after the polysilicon film is formed. As a consequence, the fabrication process can be simplified. Note that the gate electrodes 79 and 80 may be so patterned as to be connected on the field oxide film 2.

Subsequently, a photoresist is processed by photolithography into a shape by which only the element regions 4 and 71 are exposed, thereby forming a resist mask 81. This resist mask 81 is formed so as to cover a portion of the element region 4. An n-type impurity, arsenic (As) in this embodiment, is ion-implanted at a dose of 1 to $2 \times 10^{15}$ (1/cm$^2$) and an acceleration energy of 30 (keV). Consequently, the arsenic is ion-implanted through the tunnel oxide film 19 into the single-crystal silicon layer 13 on the two sides of the floating gate 20 in the element region 4. At the same time, the arsenic is ion-implanted through the gate oxide film 77 into the single-crystal silicon layer 13 on the two sides of the gate electrode 79 of the CMOS inverter. However, this arsenic is not ion-implanted into the portion of the element region 4 covered with the resist mask 81.

Figure 19H:
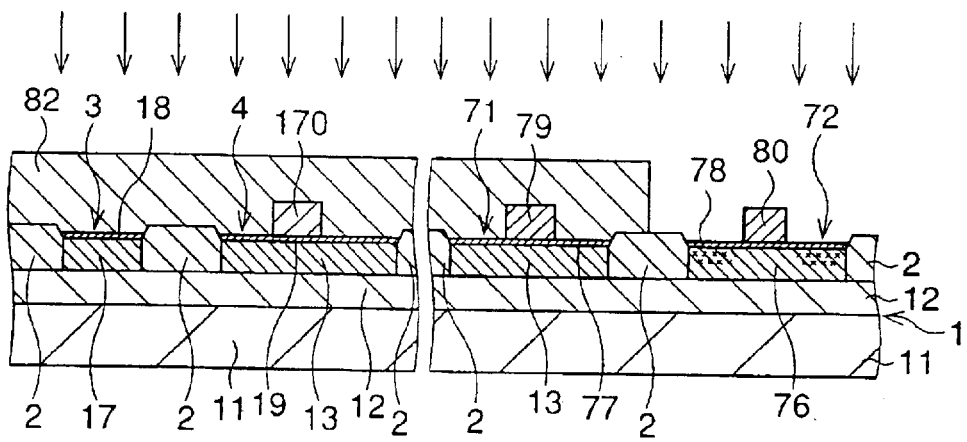

Next, as shown in FIG. 19H, a photoresist is processed by photolithography into a shape by which only the element region 72 is exposed, thereby forming a resist mask 82. This resist mask 82 is used as a mask to ion-implant a p-type impurity, boron (B) in this embodiment, at a dose of 1 to $2 \times 10^{15}$ (1/cm$^2$) and an acceleration energy of 30 (keV). Consequently, the p-type impurity is ion-implanted through the gate oxide film 78 into the single-crystalline silicon layer 13 on the two sides of the gate electrode 80 of the CMOS inverter in the element region 72.

After the resist mask 82 is removed, boron (B) is ion-implanted at a dose of 3 to $5 \times 10^{15}$ (1/cm$^2$) and an acceleration energy of 30 (keV) into the portion of the element region 4 into which no n-type impurity is ion-implanted. This ion implantation can also be performed in the same step as the ion implantation to the element region 72 described above.

Figure 19I:
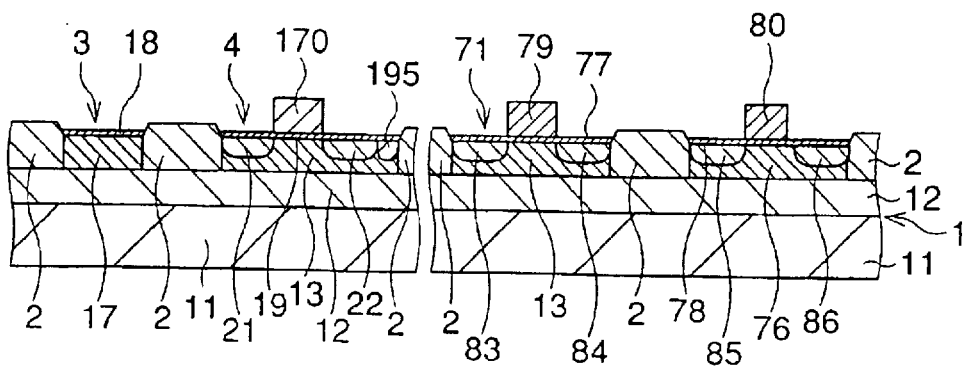

Thereafter, as shown in FIG. 19I, the SOI substrate 1 is annealed to form a pair of impurity diffusion layers 21 and 22 serving as the source and the drain of the control gate of the EEPROM. Simultaneously, pairs of impurity diffusion layers 83 and 84 and impurity diffusion layers 85 and 86 are formed in a p-type well region and the n-type well region 76 of the CMOS inverter.

A p-type impurity diffusion layer 195 is formed adjacent to the impurity diffusion layer 22 by using the boron (B) ion-implanted into the portion of the element region 4.

Figure 19J:
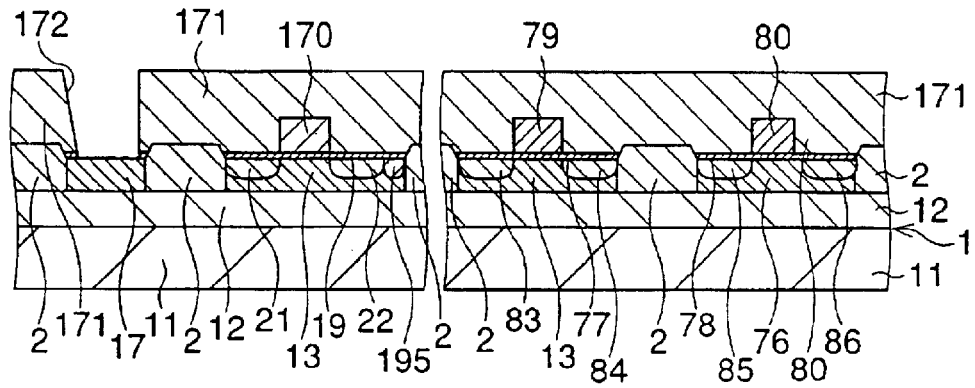

Next, as shown in FIG. 19J, a thick silicon oxide film 171 is formed on the entire surface by CVD. Photolithography and dry etching are sequentially performed to form a contact hole 172 so as to expose the impurity diffusion layer 17 in the element region 3.

Figure 19K:
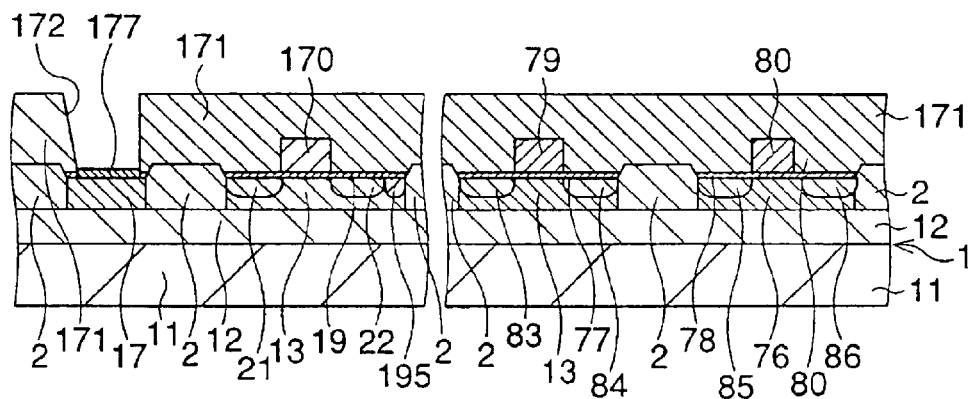

As shown in FIG. 19K, a gate oxide film 177 about 15 to 20 nm thick is so formed as to cover the exposed impurity diffusion layer 17.

Figure 19L:
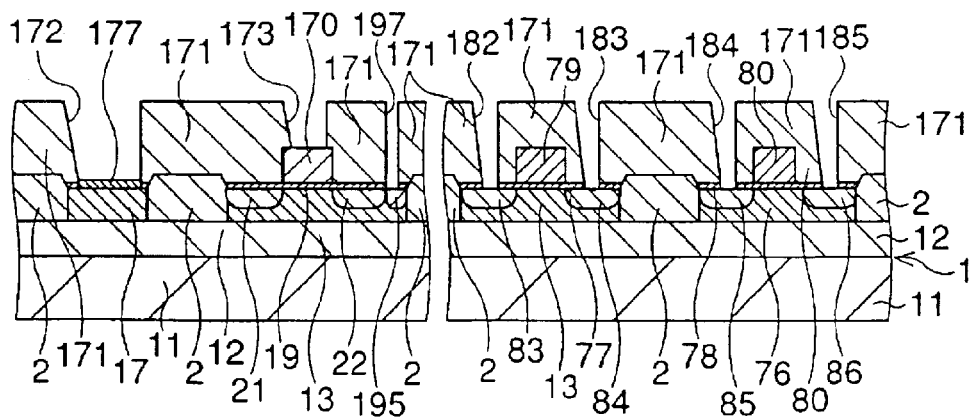

As shown in FIG. 19L, photolithography and dry etching are sequentially performed to simultaneously form, in the silicon oxide film 171, a contact hole 173 for exposing the gate electrode 170, a contact hole 197 for exposing the p-type impurity diffusion layer 195, and contact holes 182, 183, 184, and 185 for exposing the impurity diffusion layers 83, 84, 85, and 86 in the peripheral circuit. Additionally, as shown in FIG. 18, contact holes 178 and 179 reaching the impurity diffusion layers 21 and 22 are formed in the same step.

Figure 19M:
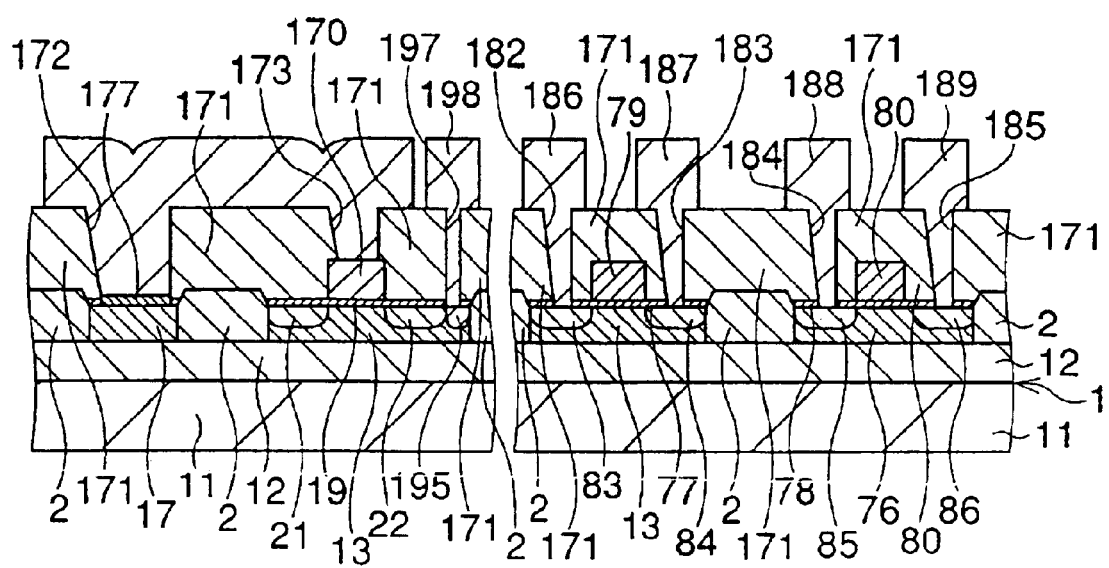

Next, as shown in FIG. 19M, an aluminum film is formed on the entire surface by sputtering. As shown in FIG. 18, photolithography and dry etching are sequentially performed to pattern the aluminum film so that the aluminum film extends from the element region 3 to the element region 4, thereby forming an aluminum electrode 176. Simultaneously, as shown in FIG. 18, the aluminum film buried in the contact holes 178, 179, 182, 183, 184, and 185 is patterned into a predetermined shape to form aluminum interconnections 180, 181, 186, 187, 188, and 189. Also, an aluminum electrode 198 connected to the p-type impurity diffusion layer 195 is simultaneously formed.

Consequently, in the element region 3 the aluminum electrode 176 is capacitively coupled with the impurity diffusion layer 17 via the silicon oxide film 177. In the element region 4, the aluminum electrode 176 is electrically connected to the gate electrode 170.

Accordingly, the aluminum electrode 176 and the gate electrode 170 integrally function as a floating gate.

Finally, insulating interlayers, contact holes, interconnecting layers for connection, and the like are formed to complete the EEPROM of the eighth embodiment.

In the element region 4 of the EEPROM of the eighth embodiment, the gate electrode 170 is formed on the channel, which is formed in the single-crystal silicon layer 13 between the impurity diffusion layers 21 and 22 serving as a source and a drain, via the tunnel oxide film 19. In the element region 3, the aluminum electrode 176 electrically connected to the gate electrode 170 opposes the impurity diffusion layer 17 as a control gate via the silicon oxide film 177 and is capacitively coupled with this impurity diffusion layer 17 by using the silicon oxide film 177 as a dielectric film.

To erase data, for example, the source and drain (impurity diffusion layers) 21 and 22 are set at 0 (V), and a predetermined voltage of about 20 (V) is applied to the control gate (impurity diffusion layer) 17. Since this voltage of the control gate 17 is also applied to the floating gate 20 consisting of the aluminum film 176 and the gate electrode 170 at the capacitive coupling ratio of the silicon oxide film 177 to the tunnel oxide film 19, electrons are injected from the single-crystal silicon layer 13 through the tunnel oxide film 19. Consequently, the threshold value of the transistor including the tunnel oxide film 19 rises to set the EEPROM in an erase state. Since the major part of the floating gate is formed by the aluminum electrode 176 having a low electrical resistance, the voltage applied to the control gate is applied to the floating gate without being unnecessarily consumed. Accordingly, the time of electron injection, i.e. the time required for erasure can be shortened.

Also, as in the first embodiment, the control gate 17 is well insulated from the silicon semiconductor substrate 11 by the buried oxide film 12. Therefore, even when a voltage of up to, e.g., 30 (V) is applied to the control gate 17, no breakdown to the silicon semiconductor substrate 11 takes place.

Furthermore, in the eighth embodiment, the p-type impurity diffusion layer 195 is formed adjacent to the impurity diffusion layer 22 serving as one of the source and the drain of the EEPROM. Since a predetermined substrate potential can be applied to this p-type impurity diffusion layer 195 via the aluminum electrode 198, it is possible to minimize variations in the threshold value of the MOS transistor and stably perform write and read operations. In addition, this aluminum electrode 198 can be formed in the same step as the aluminum interconnections 180, 181, 186, 187, 188, and 189 connected to the CMOS transistor and the aluminum electrode 176.

Accordingly, the eighth embodiment realizes a reliable EEPROM which is a single-layer gate semiconductor device by which a low-cost process is possible, has the control gate 17 which can well withstand a high voltage applied when data is erased or written and thereby prevents an operation error, shortens the charge/discharge time by the floating gate made of a metal interconnection, and can further shorten the write and erase time.

Furthermore, in the eighth embodiment, metal interconnections to be connected to the source and the drain of the transistor in the peripheral circuit can be formed at the same time the floating gate made of a metal interconnection is formed. Consequently, the fabrication process can be further simplified.

Ninth Embodiment

Figure 20:
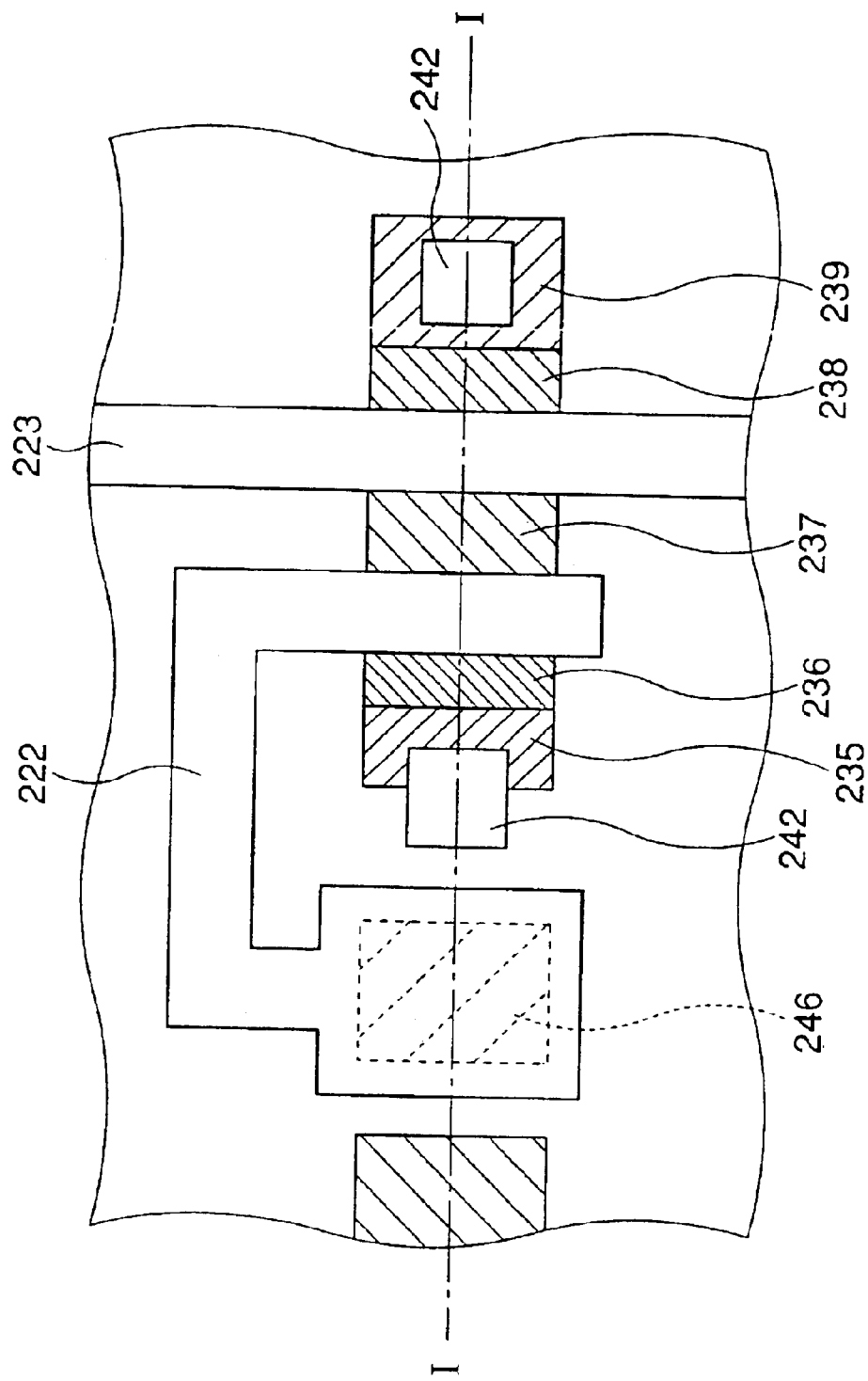
FIG. 20 is a schematic plan view showing an EEPROM according to the ninth embodiment of the present invention.
Figure 21A:
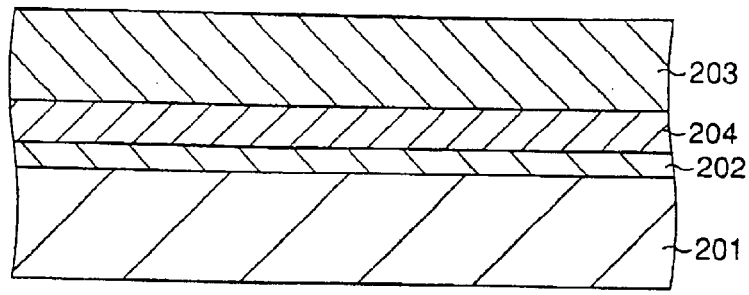
FIGS. 21A to 21N and 21P are schematic sectional views showing a method of fabricating the EEPROM according to the ninth embodiment of the present invention in order of steps.

The ninth embodiment will be described below. In this ninth embodiment, as in the previous embodiments, an EEPROM as a nonvolatile semiconductor memory will be exemplified as a semiconductor device, and the structure and the fabrication method of this EEPROM will be explained. FIG. 20 is a schematic plan view showing this EEPROM. FIGS. 21A to 21N and 21P are schematic sectional views, taken along an alternate long and short dashed line I—I in FIG. 20, showing the fabrication method of the EEPROM in order of steps.

First, as shown in FIG. 21A, one principal surface of a p-type first single-crystal silicon substrate 201 is mirror-polished and thermally oxidized to form an insulating film 202 having a predetermined film thickness. An n-type second single-crystal silicon substrate 203 having a mirror-polished principal surface is closely adhered to the insulating film 202 on the surface of the first silicon substrate 201 in a sufficiently clean ambient. The resultant structure is heated to integrally sandwich the insulating film 202 between the two silicon substrates 201 and 203. Subsequently, the second single-crystal silicon substrate 203 is polished to a predetermined thickness. The result is an SOI substrate in which the second silicon substrate 203 is adhered to the first silicon substrate 201 via the insulating film 202. Referring to FIG. 21A, an n-type heavily doped impurity diffusion layer 204 is formed by doping on the surface of the second silicon substrate 203 to be adhered to the insulating film 202 before the adhesion.

Figure 21B:
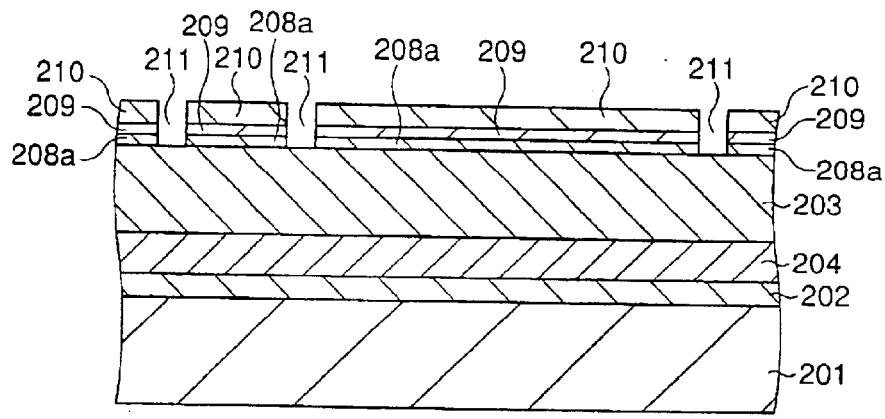

Next, as shown in FIG. 21B, a pad oxide film 208a is formed on the surface of the second silicon substrate 203 by thermal oxidation. On the surface of this pad oxide film 208a, a silicon nitride film 209 as a first insulating layer and a silicon oxide film 210 as a second insulating layer are sequentially deposited by CVD. Thereafter, annealing is performed at a temperature of about 1,000° C. to increase the density of the silicon oxide film 210. Subsequently, a resist (not shown) is formed and processed into a predetermined pattern by well-known photolithography. This resist formed on the surface is used as a mask to perform RIE (Reactive Ion Etching) using $CF_4$- and $CHF_3$-based gases as etching gases to selectively etch the silicon oxide film 210, the silicon nitride film 209, and the pad oxide film 208a, thereby forming a hole 211 for exposing the surface of the silicon substrate 203. FIG. 21B shows the state after the resist is removed.

Figure 21C:
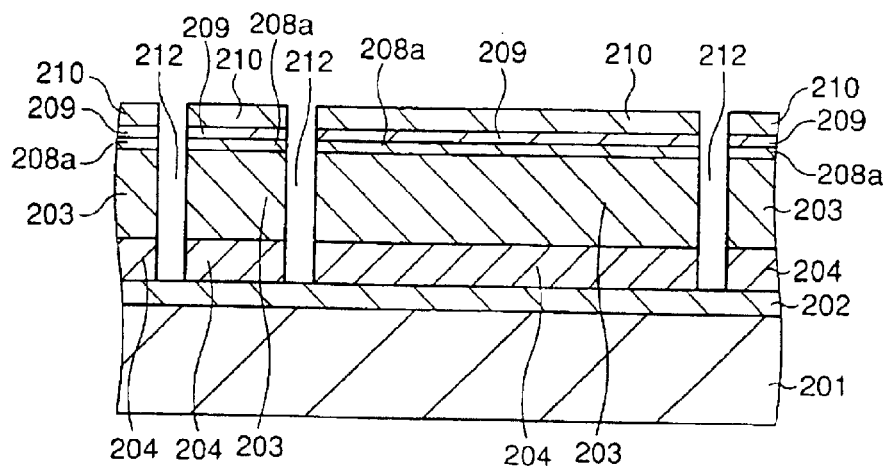

Next, as shown in FIG. 21C, the silicon oxide film 210 is used as a mask to perform RIE using HBr-based gas as an etching gas to selectively etch the second silicon substrate 203, forming a trench 212 reaching the insulating film 202. The film thickness of the silicon oxide film 210 in the preceding step is so determined that the trench 212 reaches the insulating film 202 due to the etching selectivity of the silicon oxide film 210 to the silicon substrate 203.

CDE (Chemical Dry Etching) is then performed on the inner wall surfaces of the trench 212. This CDE is performed by using an RF discharge type plasma etching apparatus, and the etching conditions are, for example, that the source gases are $CF_4$, $O_2$, and $N_2$, the frequency is 13.56 MHz, the etching rate is 1,500 Å/min, and the distance from the plasma to the wafer is 100 cm. Consequently, the inner wall surfaces of the trench 212 are etched by a thickness of about 1,500 Å.

The inner wall surfaces of the trench 212 thus subjected to CDE are annealed. For example, this annealing is performed at a temperature of 1,000° C. for 30 min in an $N_2$ ambient. The annealed inner wall surfaces of the trench 212 may be subsequently sacrificially oxidized. In this sacrificial oxidation, a sacrificial oxide film about 500 Å thick is formed by dry oxidation at, e.g., 1,000° C. and removed by using hydrofluoric acid.

Figure 21D:
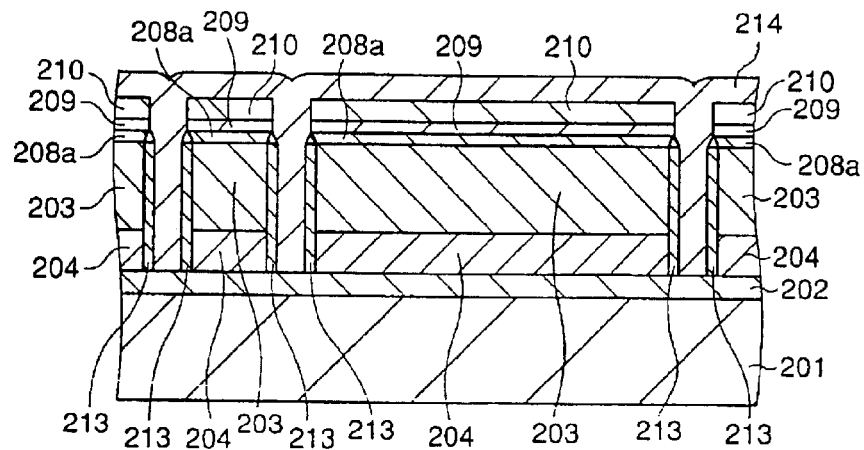

Next, as shown in FIG. 21D, an insulating film 213 is formed on the inner wall surfaces of the trench 212 by wet thermal oxidation at, e.g., 1,050° C., and a polysilicon film 214 is subsequently deposited by LP-CVD. This polysilicon film 214 is buried in the trench 212 and also deposited on the silicon oxide film 210.

Figure 21E:
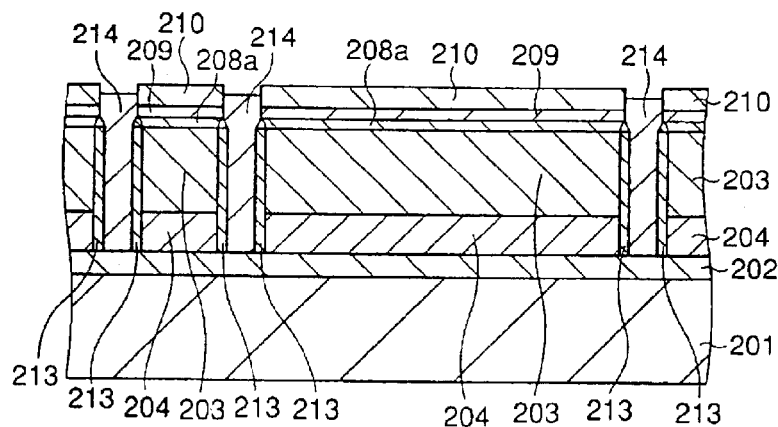

As shown in FIG. 21E, dry etching is performed to etch back (first time) the excess polysilicon film 214 deposited on the silicon oxide film 210. This etching is stopped so that the upper end of the polysilicon film 214 remaining in the trench 212 is higher than the silicon nitride film 209.

Figure 21F:
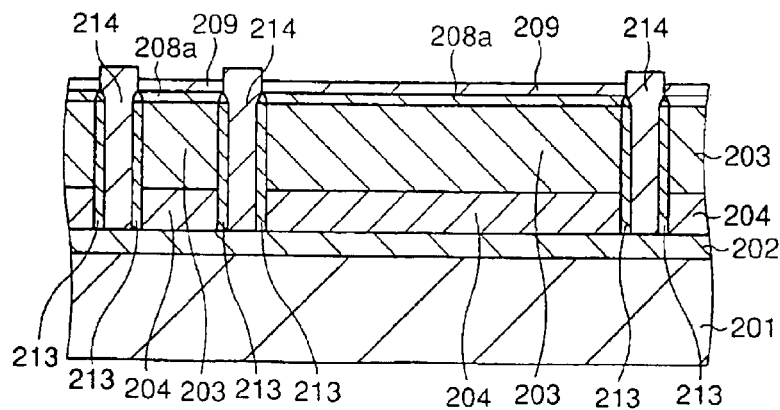

As shown in FIG. 21F, the silicon oxide film 210 is removed by wet etching using a fluorine solution. In this etching, the pad oxide film 208a and the insulating film 213 formed on the inner wall surfaces of the trench 212 are not etched because the silicon nitride film 209 and the polysilicon film 214, which is left behind so that its upper end is higher than this silicon nitride film 209, serve as etching stoppers.

Figure 21G:
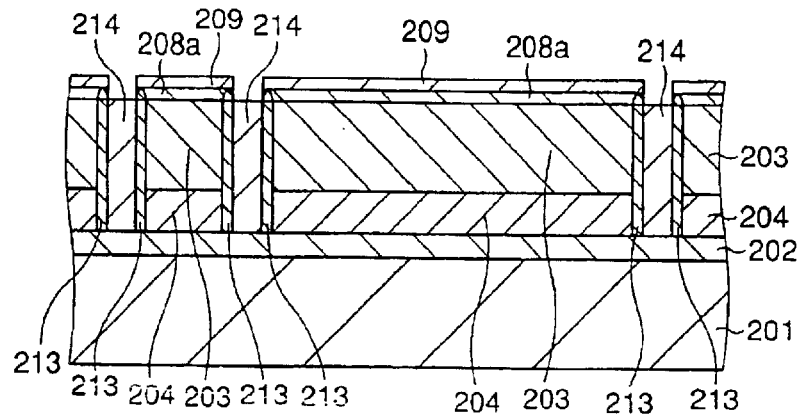

As shown in FIG. 21G, dry etching is perform to etch back (second time) the portion, protruding upward from the silicon nitride film 209, of the polysilicon film 214 buried in the trench 212. It is desirable to control this etching so that the upper end of the polysilicon film 214 is lower by about 0.3 ($\mu$m than the upper end of the pad oxide film 208a, in order that a thermal oxide film 215 (to be described later) is level with the surrounding pad oxide film 208a when the thermal oxide film 215 is grown on the polysilicon film 214 in a subsequent step.

Thereafter, to form a p-type impurity diffusion layer 244 for making contact with a memory cell of the substrate in a part of the polysilicon film 214 in the trench 212, a resist mask is formed to partially expose the polysilicon film 214. This resist mask and the silicon nitride film 209 are used as masks to ion-implant a p-type impurity, boron (B) in this embodiment, at a dose of $1\times10^{15}$ (1/cm$^2$) and an acceleration energy of 30 (keV). The ion-implanted boron (B) is diffused by performing annealing at a temperature of 1,000° C. for 30 to 60 mm in a nitrogen (N$_2$) gas ambient. Consequently, as shown in FIG. 21G, the p-type impurity diffusion layer 244 is formed in a partial region of the trench 212.

Figure 21H:
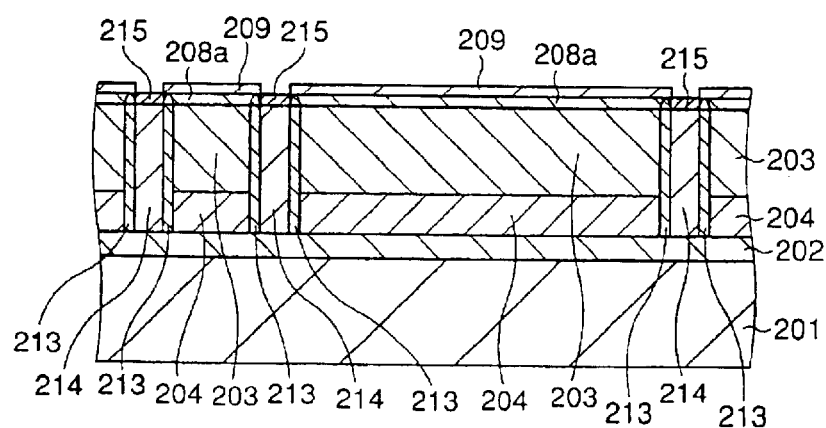
Figure 21I:
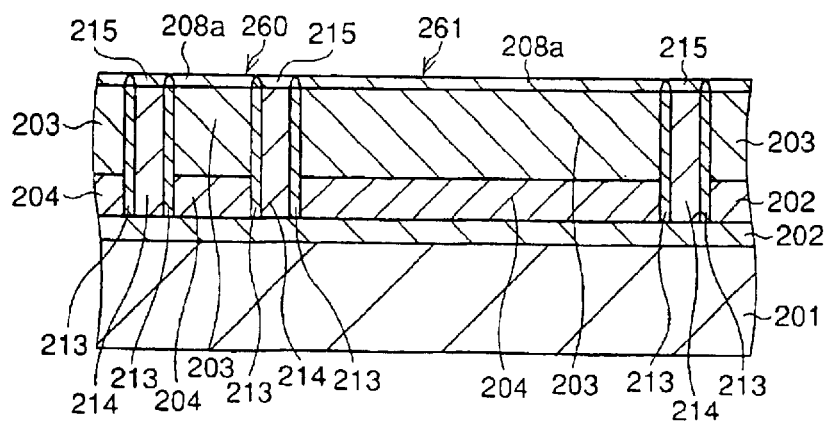

Next, as shown in FIG. 21H, the upper portion of the polysilicon film 214 buried in the trench 212 is selectively thermally oxidized by using the silicon nitride film 209 as a mask to grow the oxide film 215. Thereafter, as shown in FIG. 21I, the silicon nitride film 209 is etched away. Since the upper surface of the polysilicon film 214 is controlled to a predetermined position in the second etching back, no step is formed in the trench 212 as can be seen from FIG. 21I, so a planarized surface can be formed. Consequently, element isolation is done by the trench 212 and the buried polysilicon film 214 to define element regions 260 and 261.

Figure 21J:
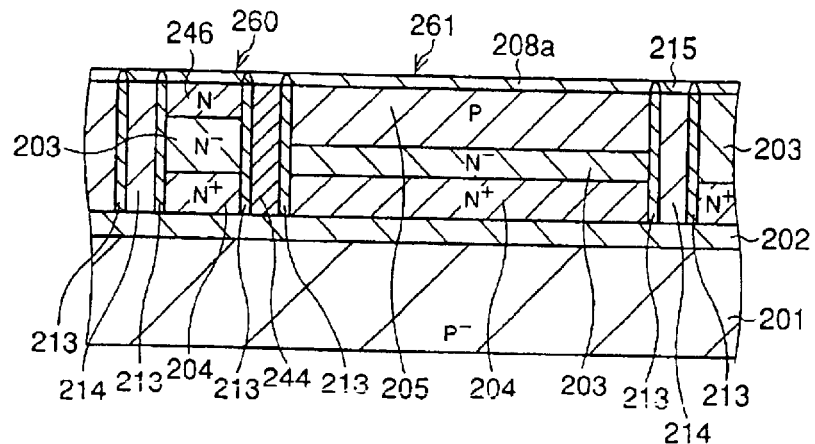

As shown in FIG. 21J, well-know photolithography and impurity diffusion steps are performed to form an n-type impurity diffusion layer 246 serving as the control gate of the EEPROM in the element region 260 and a p-type well region 205 in the element region 261.

Figure 21K:
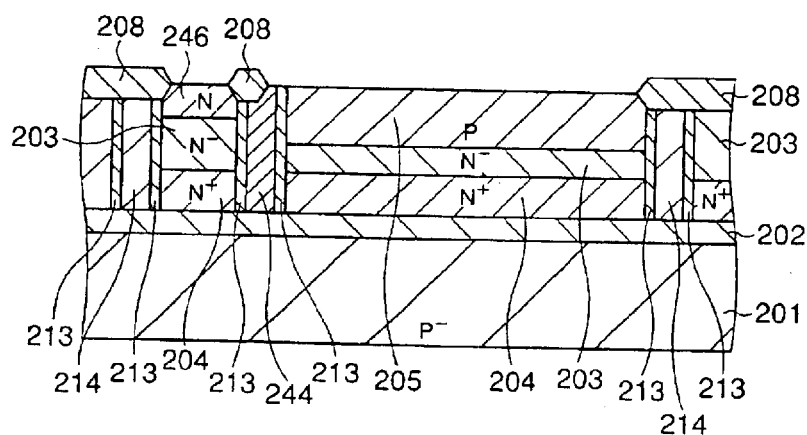

As shown in FIG. 21K, a field oxide film 208 is formed on the surface of the second silicon substrate 203 by so-called LOGOS. On the p-type impurity diffusion layer 244, this field oxide film 208 is formed to cover a portion of the surface of the p-type impurity diffusion layer 244. That is, a portion of the surface of the p-type impurity diffusion layer 244 is exposed. The pad oxide film 208a is then removed.

Note that LOCOS described above is a method by which a silicon nitride film as an oxidation inhibiting film is formed in a predetermined portion of the substrate surface, and a portion where this silicon nitride film is not formed is thermally oxidized to form the thick field oxide film 208. FIG. 21K shows the state in which the silicon nitride film as an oxidation inhibiting film is removed by phosphoric acid (H$_3$PO$_4$) after oxidation is performed by LOCOS.

Figure 21L:
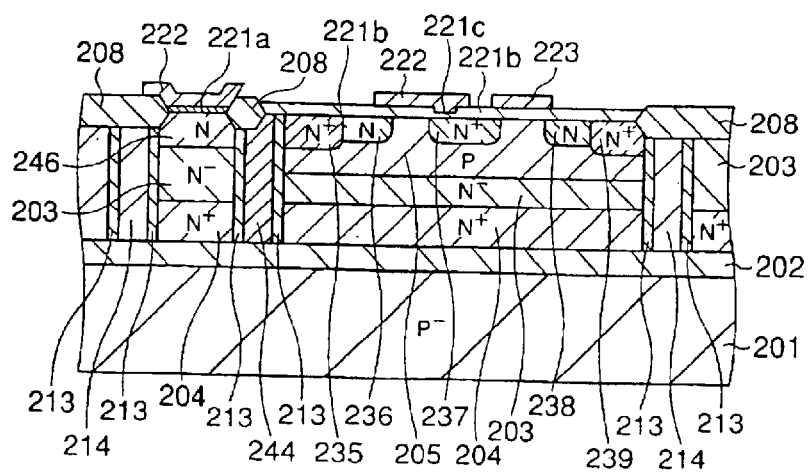

Next, as shown in FIG. 21L, gate oxide films 221a and 221b and a tunnel oxide film 221c are sequentially formed. After a polysilicon film is formed by LP-CVD, photolithography and etching are sequentially performed to form a floating gate electrode 222 and a gate electrode 223. As shown in FIG. 20, the floating gate 222 has an integrated electrode pattern extending from the element region 260 to the element region 261. Also, the gate electrode 223 is formed adjacent to the floating gate 222. Thereafter, n-type impurity diffusion layers 235 to 239 are formed by selective doping.

Figure 21M:
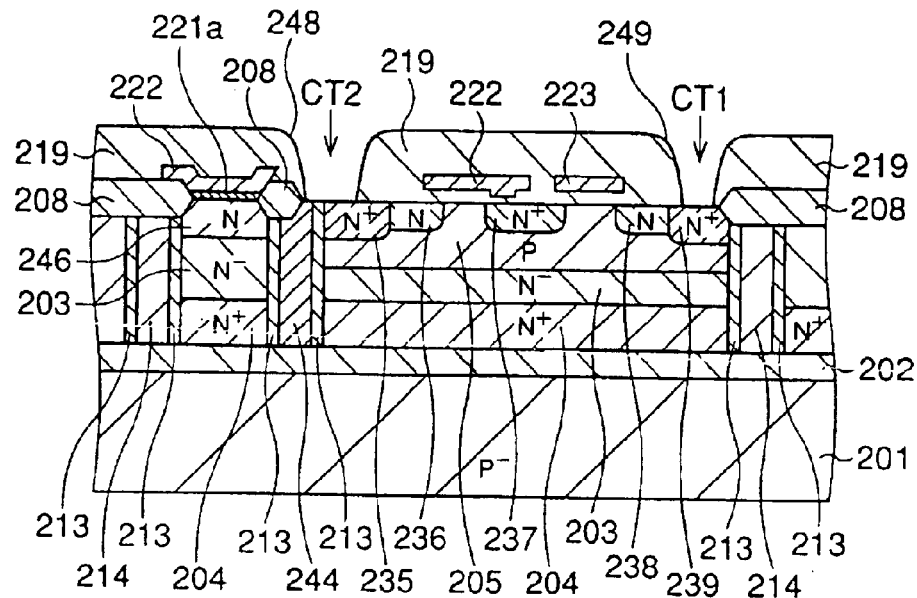
Figure 21N:
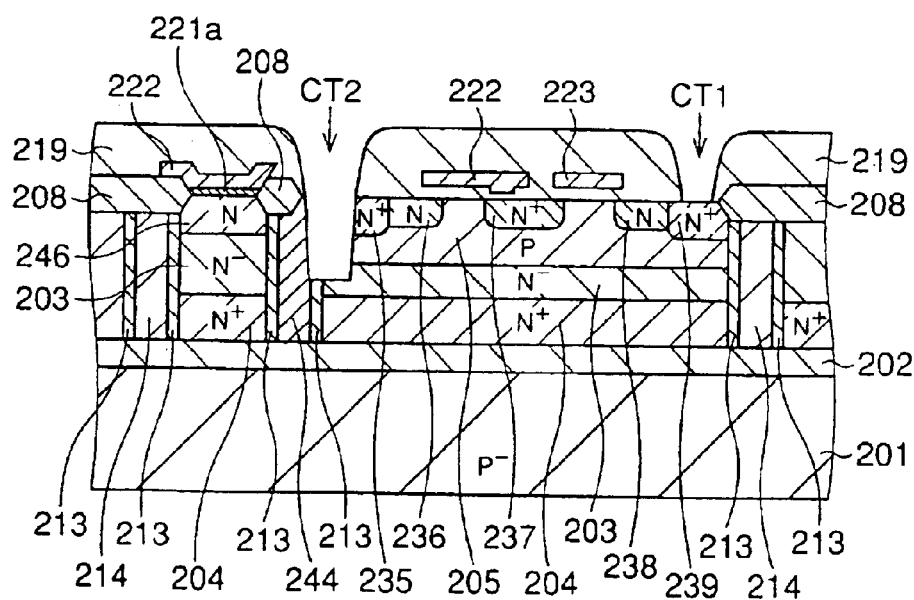
Figure 21P:
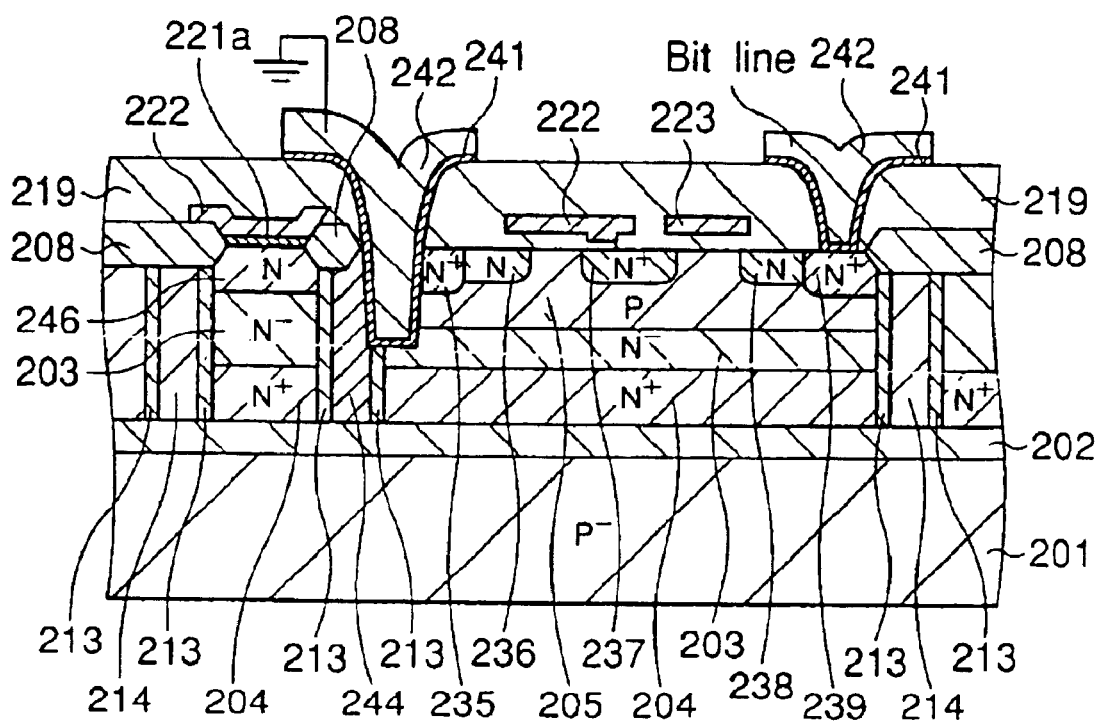

As shown in FIG. 21M, an insulating interlayer 219 such as a PSG or BPSG film is deposited on the entire surface of the substrate. A resist mask (not shown) is formed, and this resist mask is removed after contact holes 248 and 249 are formed. Next, as shown in FIG. 21N, a region except for the contact hole 248 is masked by a resist, and the silicon substrate is so etched as to extend over the p-type impurity diffusion layer 244 and the n-type impurity diffusion layer 235 in order to make contact with a memory cell of the substrate. Consequently, a trench 240 is formed.

CDE (Chemical Dry Etching) is then performed on the inner wall surfaces of the trench 240. This CDE is performed by using an RF discharge type plasma etching apparatus, and the etching conditions are, for example, that the source gases are CF$_4$, O$_2$, and N$_2$, the frequency is 13.56 MHz, the etching rate is 1,500 Å/min, and the distance from the plasma to the wafer is 100 cm. Consequently, the inner wall surfaces of the trench 240 are etched by a thickness of about 1,500 Å.

Next, as shown in FIG. 21P, a barrier metal 241 about 1,000 Å thick is formed on the entire surface including the inner wall surfaces of the contact holes 248 and 249. More specifically, this barrier metal 241 is made of a stacked film of titanium (Ti) and titanium nitride (TiN). subsequently, an aluminum film 242 about 7000 Å thick is formed by sputtering and patterned to simultaneously form a substrate electrode buried in the contact hole 248 and a bit line buried in the contact hole 249.

The aluminum film 242 buried in the contact hole 240 controls the substrate potential to a predetermined value. In the ninth embodiment, as shown in FIG. 21P, the substrate potential is a ground potential (GND). This aluminum film 242 is also connected to the impurity diffusion layer 235 to fix the n-type impurity diffusion layer 235 to the ground potential.

In the EEPROM of the ninth embodiment, in the element region 260 the floating gate 222 is formed via the tunnel oxide film 221c. In the element region 260, the floating gate 222 extending from the element region 261 opposes the impurity diffusion layer 246 as a control gate via the silicon oxide film 221a and is capacitively coupled with this impurity diffusion layer 246 by using the silicon oxide film 221a as a dielectric film.

To erase data, for example, the source and drain (impurity diffusion layers) 235 and 236 are set at 0 (V), and a predetermined voltage of about 20 (V) is applied to the control gate (impurity diffusion layer) 246. Since this voltage of the control gate 246 is also applied to the floating gate 222 at the capacitive coupling ratio of the oxide film 221a to the tunnel oxide film 221c, electrons are injected into the floating gate 222 through the tunnel oxide film 221c. Consequently, the threshold value of the transistor including the tunnel oxide film 221c rises to set the EEPROM in an erase state. The control gate 246 is well insulated from the silicon substrate 203 because its lower surface is covered with the insulating film 202 and its side surfaces are covered with the element isolation structure made of the polysilicon film 214 buried in the trench 212. Therefore, even when a voltage of up to, e.g., 30 (V) is applied to the control gate 246, no breakdown takes place.

Furthermore, in the ninth embodiment, the aluminum film 242 is formed to fix the potential in the element active region 261 and connected to the p-type impurity diffusion layer 244. Since a predetermined substrate potential can be applied to this p-type well region 205 via the aluminum film 242, it is possible to minimize variations in the threshold value of the EEPROM and stably perform write and read operations. In addition, this aluminum electrode 242 can fix the n-type impurity diffusion layer 235 and p-type impurity diffusion layer 244 serving as the shield plate electrode to the ground potential.

Accordingly, the ninth embodiment realizes a reliable EEPROM which is a single-layer gate semiconductor device by which a low-cost process is possible, has the control gate 246 which can well withstand a high voltage applied when data is erased or written, and can prevent an operation error and shorten the erase time.

Furthermore, the SOI substrate 1 prepared by forming the silicon substrate 203 on the silicon substrate 210 via the insulating film 202 is used as a semiconductor substrate. Therefore, the operating speed and the leak current characteristic can be improved.

Note that in the ninth embodiment, the floating gate 222 is formed into an island pattern made of a single polysilicon film. However, the floating gate maybe formed by simultaneously forming two polysilicon film patterns in the element regions 260 and 261 and electrically connecting these patterns through a contact hole or the like in a later step. If this is the case, the aluminum electrode 242 can be formed simultaneously with the electrical connection.

In the first to ninth embodiments described above, an impurity diffusion layer as a control gate and a floating gate are capacitively coupled with each other by using an oxide film or an ONO film as a dielectric film. However, the dielectric film is not restricted to these films. For example, a ferroelectric film may also be used.

If a ferroelectric film is used, a film made of platinum, a titanium compound, a tungsten compound or a ruthenium compound can be used as a material of the floating gate electrode. It may also be formed of a double layer structure in which a conductive film made of, for example, polysilicon is provided under a platinum film.

Any material having a ferroelectric characteristic can be used as a material of the above-mentioned ferroelectric film. For example, PZT (lead zirconate titanate), PLZT (lead lanthanum zirconate titanate), barium titanate, palladium titanate, barium strontium titanate and bismuth titanate can be used as the material of the ferroelectric film. A dielectric film made of, for example, tantalic oxides or $Ta_2O_5BSTO$, which has a high dielectric constant of more than 50, can be used instead of the ferroelectric film.

What is claimed is:

1. A semiconductor device comprising:

a semiconductor substrate in which a first and a second element active regions are demarcated by means of element isolation structure, said structure having a shield plate electrode formed on said somiconductor substrate via a first insulating film;

in the first cement active region, a first and a second conductive regions formed at a surface region of the semiconductor substrate;

a first electrode formed on the semiconductor substrate between the first and the second conductive regions via a second insulating film;

in the second element active region, a third conductive region formed in the surface region of the semiconductor substrate; and a second electrode formed on the third conductive region via the first insulating film, wherein the first electrode and the second electrode are electrically connected, and wherein the shield plate electrode and the second electrode are formed on the first insulating film with the shield plate electrode spaced from said third conductive region and said second electrode.

2. A semiconductor device according to claim 1, wherein said first, second and third conductive regions have an identical conductivity type, and a fourth conductive region is formed at the surface region of said semiconductor substrate, beneath said shield plate electrode, said fourth conductive region baying a conductivity type opposite to that of the first conductive region.

3. The semiconductor device according to claim 1, wherein said third conductive region is a diffusion region containing impurities and is connected with an insulating region in said semiconductor substrate.

4. The semiconductor device according to claim 1, wherein said dielectric film contains a material selected from the group consisting of a ferroelectric film and a high dielectric film.

5. The semiconductor device according to claim 1, wherein said second electrode contains a material selected from the group consisting of a titaniun compound, a tungsten compound, a ruthenium compound, and platinum.

6. The semiconductor device according to claim 1, wherein a third electrode is connected to the semiconductor substrate to impress a predetermined electric potential to the semiconductor substrate in said first element active region.

* * * * *

UNITED STATES PATENT AND TRADEMARK OFFICE
CERTIFICATE OF CORRECTION

| | | |
|---|---|---|
| PATENT NO. | : 6,818,943 B2 | |
| APPLICATION NO. | : 10/269951 | |
| DATED | : November 16, 2004 | |
| INVENTOR(S) | : Yoshihiro Kumazaki | |

It is certified that error appears in the above-identified patent and that said Letters Patent is hereby corrected as shown below:

Claim 1, col. 36, line 3, please change "cement" to --element--.

Signed and Sealed this

Twenty-sixth Day of December, 2006

JON W. DUDAS
*Director of the United States Patent and Trademark Office*